US012660709B2

(12) United States Patent

Hou et al.

(10) Patent No.: US 12,660,709 B2

(45) Date of Patent: Jun. 16, 2026

(54) INTEGRATED CIRCUIT DEVICE AND METHOD OF MANUFACTURING

(71) Applicant: TAIWAN SEMICONDUCTOR MANUFACTURING COMPANY, LTD., Hsinchu (TW)

(72) Inventors: Yung-Chin Hou, Hsinchu (TW); Lee-Chung Lu, Hsinchu (TW); Yi-Kan Cheng, Hsinchu (TW); Jiann-Tyng Tzeng, Hsinchu (TW); Wei-Cheng Lin, Hsinchu (TW); Ching-Yu Huang, Hsinchu (TW); Chun-Yen Lin, Hsinchu (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 433 days.

(21) Appl. No.: 18/330,074

(22) Filed: Jun. 6, 2023

(65) Prior Publication Data

US 2024/0274585 A1    Aug. 15, 2024

Related U.S. Application Data

(60) Provisional application No. 63/484,074, filed on Feb. 9, 2023.

(51) Int. Cl.
| | |
|---|---|
| *H01L 25/07* | (2006.01) |
| *H10W 90/00* | (2026.01) |

(52) U.S. Cl.
CPC .................................. *H10W 90/00* (2026.01)

(58) Field of Classification Search
CPC ...... G06F 30/39; H10D 89/10; H10D 84/856; H10D 84/853
See application file for complete search history.

(56) References Cited

U.S. PATENT DOCUMENTS

| | | | | |
|---|---|---|---|---|
| 9,721,852 | B2 * | 8/2017 | Graf | ........................ H01L 25/10 |
| 12,520,577 | B2 * | 1/2026 | Lin | ..................... H10D 84/853 |
| 2015/0139194 | A1 | 5/2015 | Wei | |
| 2018/0025970 | A1 * | 1/2018 | Kao | ..................... H01L 23/481 |
| | | | | 257/401 |
| 2024/0250086 | A1 * | 7/2024 | Lin | ..................... H10D 30/024 |
| 2024/0321646 | A1 * | 9/2024 | Lin | .................... H10D 84/0188 |
| 2025/0266321 | A1 * | 8/2025 | Wu | ........................ H01L 23/481 |
| 2025/0366185 | A1 * | 11/2025 | Lin | ..................... H10D 30/024 |

FOREIGN PATENT DOCUMENTS

| | | |
|---|---|---|
| TW | 202025454 | 7/2020 |
| TW | 202141715 | 11/2021 |
| TW | 202243055 | 11/2022 |
| TW | 202243126 | 11/2022 |

* cited by examiner

*Primary Examiner* — Thao P Le

(74) *Attorney, Agent, or Firm* — Hauptman Ham, LLP

(57)    ABSTRACT

An integrated circuit (IC) device includes a bottom semiconductor device, a top semiconductor device over the bottom semiconductor device in a thickness direction of the IC device, and a multilayer structure between the bottom semiconductor device and the top semiconductor device in the thickness direction. The multilayer structure includes a lower dielectric layer over the bottom semiconductor device, an upper dielectric layer over the lower dielectric layer, and an interlayer metal structure between the lower dielectric layer and the upper dielectric layer. The interlayer metal structure is electrically coupled to at least one of the bottom semiconductor device or the top semiconductor device.

20 Claims, 24 Drawing Sheets

100
IC Device

102
Macro

104

Region having at least one interlayer metal structure between top and bottom semiconductor devices of a CFET structure Y axis X axis

730

SDFQD1

D
SI
SE
CP

Q

720

XOR2D1

A1
A2

Z

710

MUX2D1

I0
I1

S

Z

1200B

1220 — Determine 1-side MGLI or 2-side MGLI

1222 — Determine number of IM tracks

1224 — Determine cell height

1228 — Make modification(s)

1226 — Check (Cell-Height/number of IM tracks) ≥ min IM pitch ?

No

Yes

1230 — Generate layout using cells with CFET and Inter-Metal

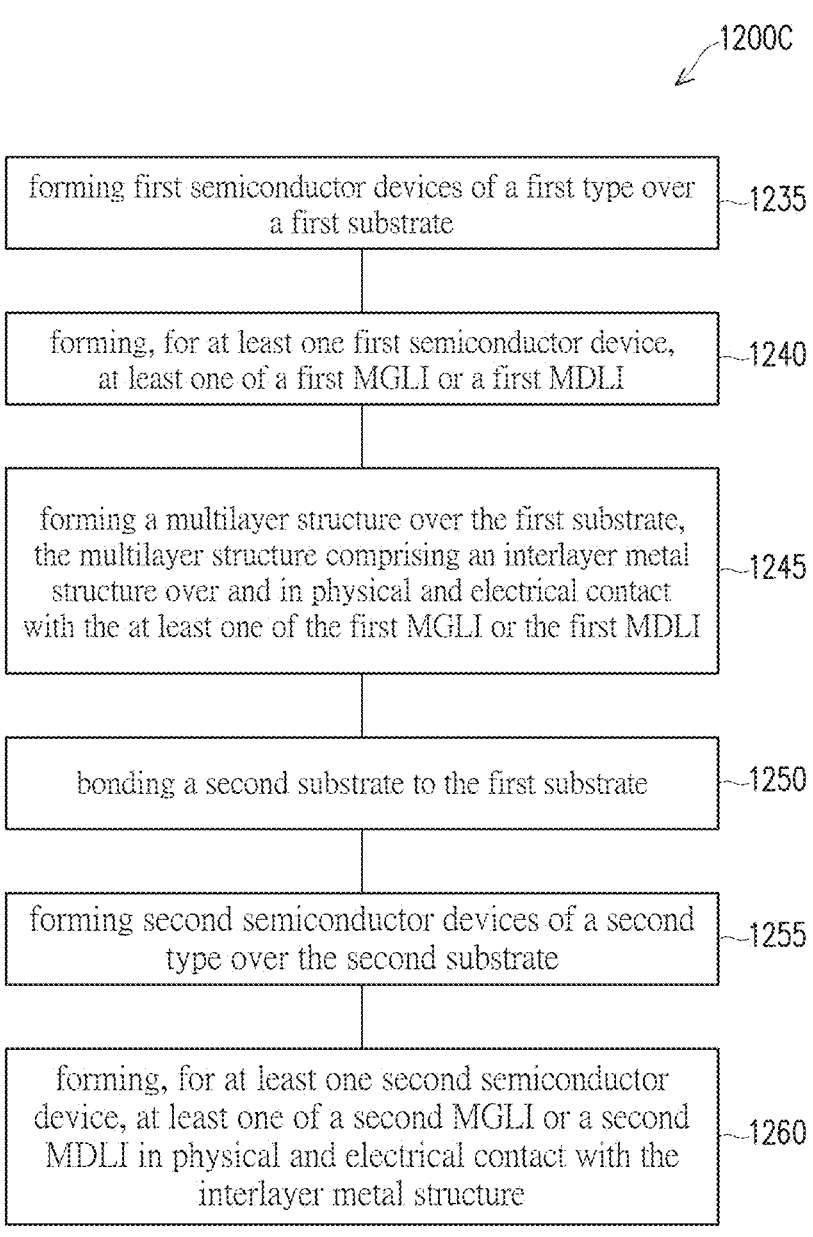

1200C forming first semiconductor devices of a first type over a first substrate ~1235 forming, for at least one first semiconductor device, at least one of a first MGLI or a first MDLI ~1240 forming a multilayer structure over the first substrate, the multilayer structure comprising an interlayer metal structure over and in physical and electrical contact with the at least one of the first MGLI or the first MDLI ~1245 bonding a second substrate to the first substrate ~1250 forming second semiconductor devices of a second type over the second substrate ~1255 forming, for at least one second semiconductor device, at least one of a second MGLI or a second MDLI in physical and electrical contact with the interlayer metal structure ~1260

FIG. 12C

INTEGRATED CIRCUIT DEVICE AND METHOD OF MANUFACTURING

RELATED APPLICATION(S)

This application claims the benefit of U.S. Provisional Application No. 63/484,074, filed Feb. 9, 2023, which is herein incorporated by reference in its entirety.

BACKGROUND

An integrated circuit ("IC") device includes one or more semiconductor devices represented in an IC layout diagram (also referred to as "layout diagram"). A layout diagram is hierarchical and includes modules which carry out higher-level functions in accordance with the semiconductor device's design specifications. The modules are often built from a combination of cells, each of which represents one or more semiconductor structures configured to perform a specific function. Cells having pre-designed layout diagrams, sometimes known as standard cells, are stored in standard cell libraries (hereinafter "libraries" or "cell libraries" for simplicity) and accessible by various tools, such as electronic design automation (EDA) tools, to generate, optimize and verify designs for ICs.

To reduce the size of IC devices, sometimes a layer of semiconductor devices is formed, or bonded, over another layer of semiconductor devices. Examples include complementary field effect transistor (CFET) devices in which an upper or top semiconductor device overlies a lower or bottom semiconductor device in a stack configuration.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

6B includes schematic views at various layers of a corresponding layout diagram, in accordance with some embodiments.

Figure 7:
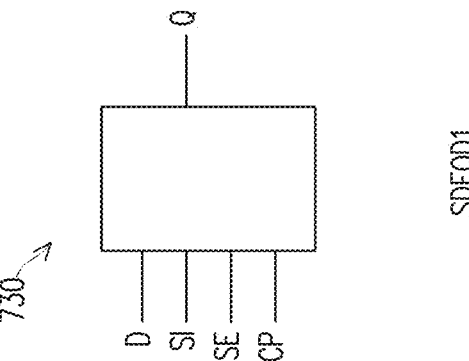
Figure 7:
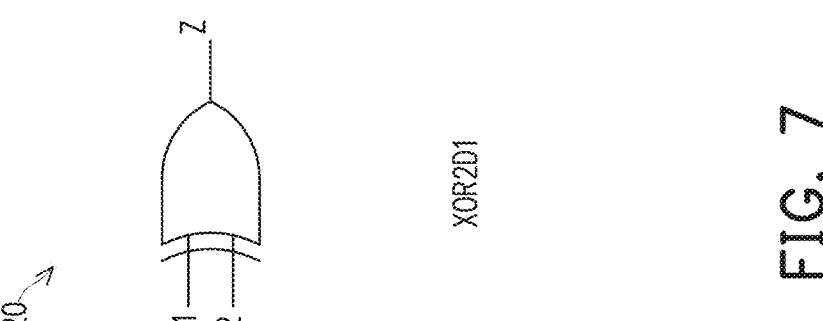
Figure 7:
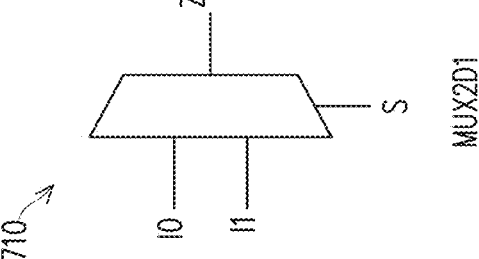

FIG. 7 includes schematic circuit diagrams of various circuit regions of one or more IC device, in accordance with some embodiments.

FIGS. 8A-8B and 9A-9B include schematic views at various layers of various layout diagrams, in accordance with some embodiments.

Figures 10A, 10B:
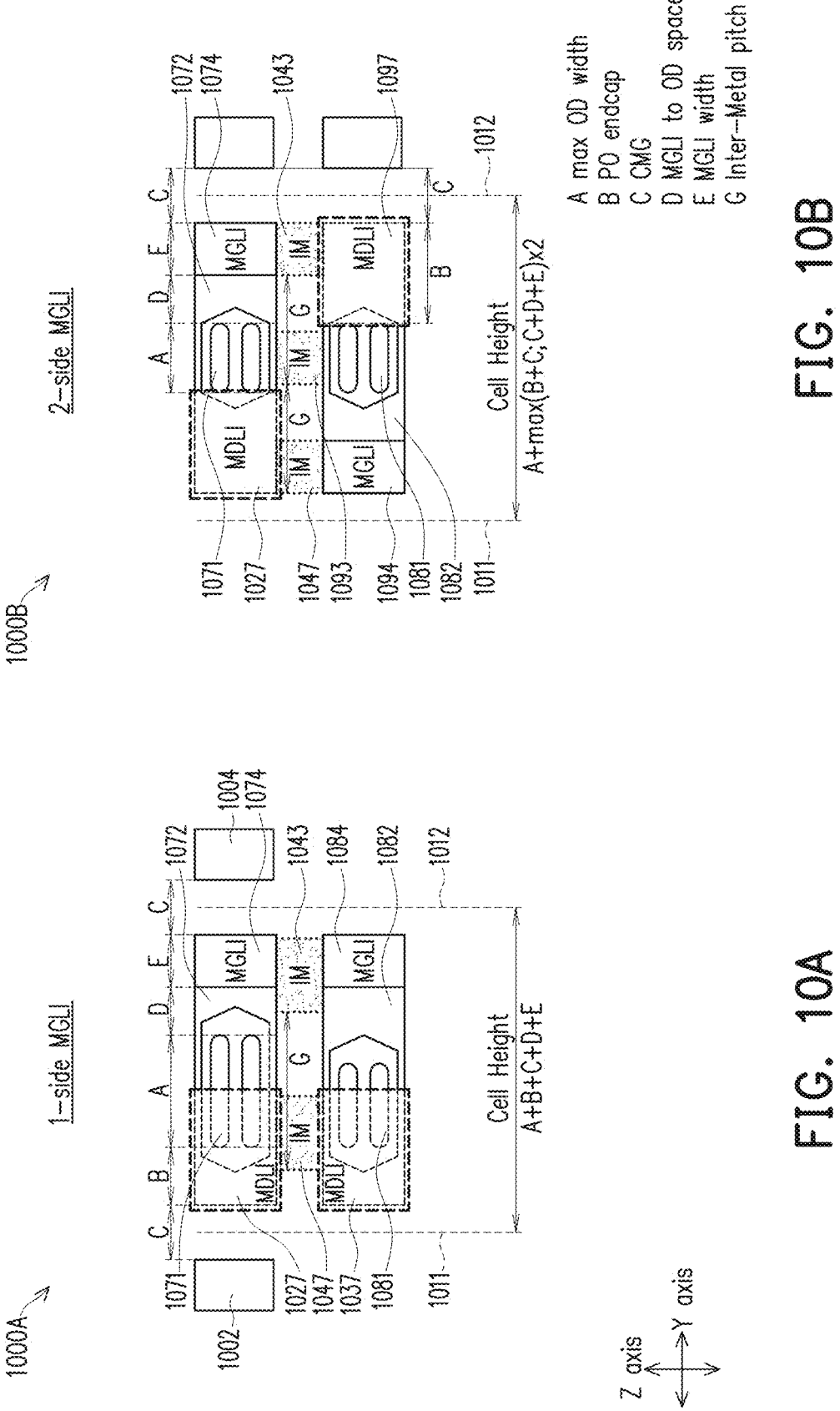

FIGS. 10A-10B are schematic views showing dimensions in various cells, in accordance with some embodiments.

FIGS. 11A-11D are schematic cross-sectional views of an IC device at various stages in manufacturing processes, in accordance with some embodiments.

Figure 12A:
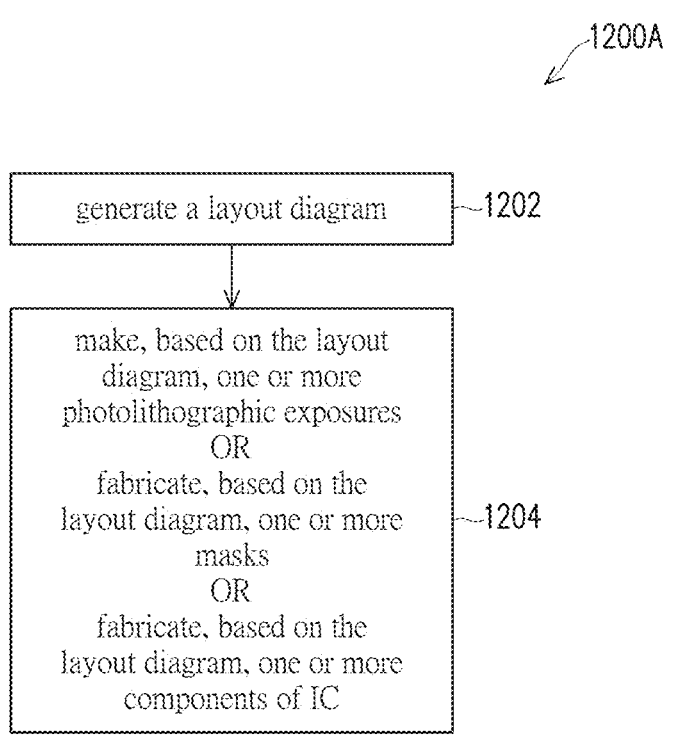
Figure 12B:
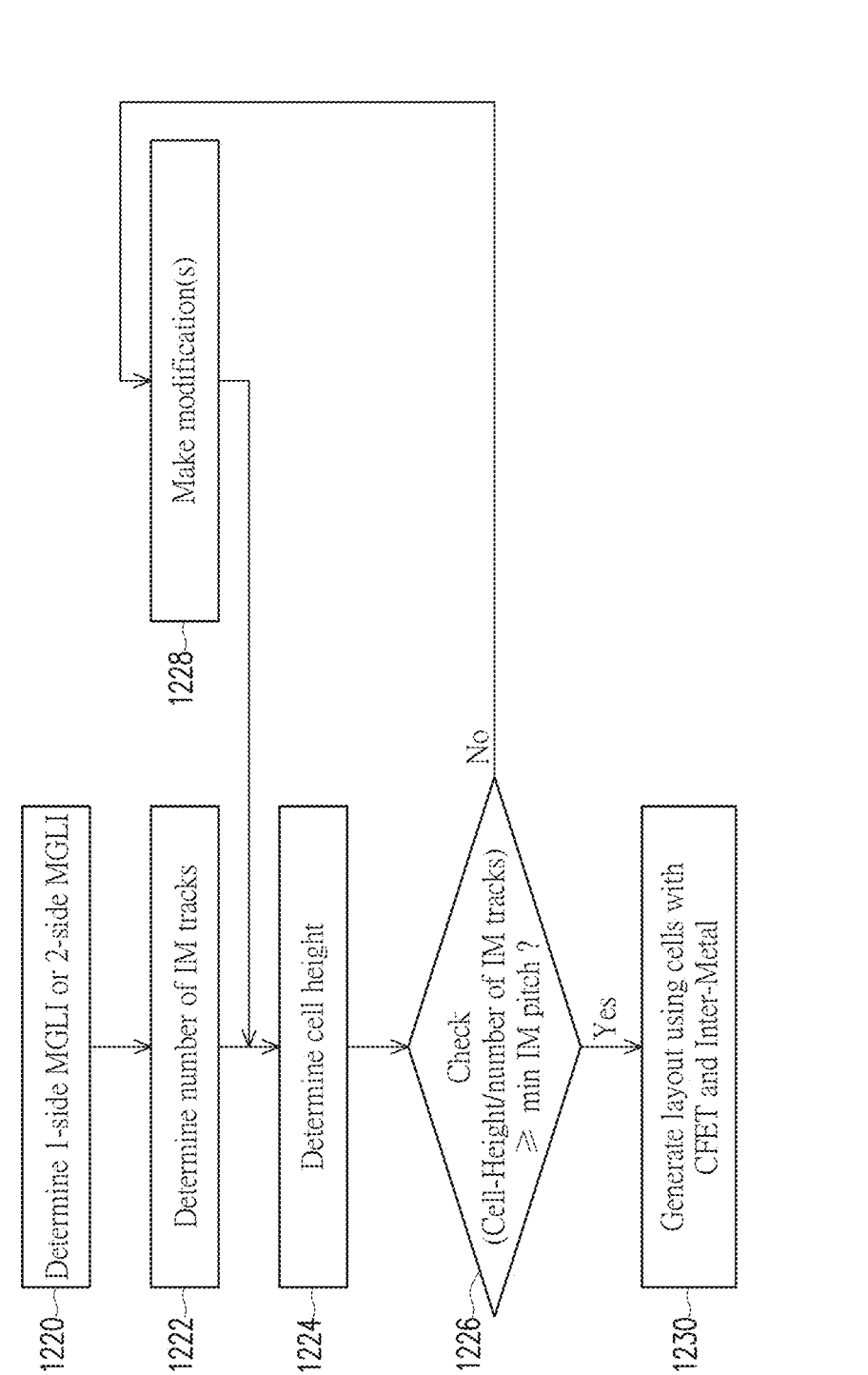

FIGS. 12A-12C are flowcharts of various methods, in accordance with some embodiments.

Figure 13:
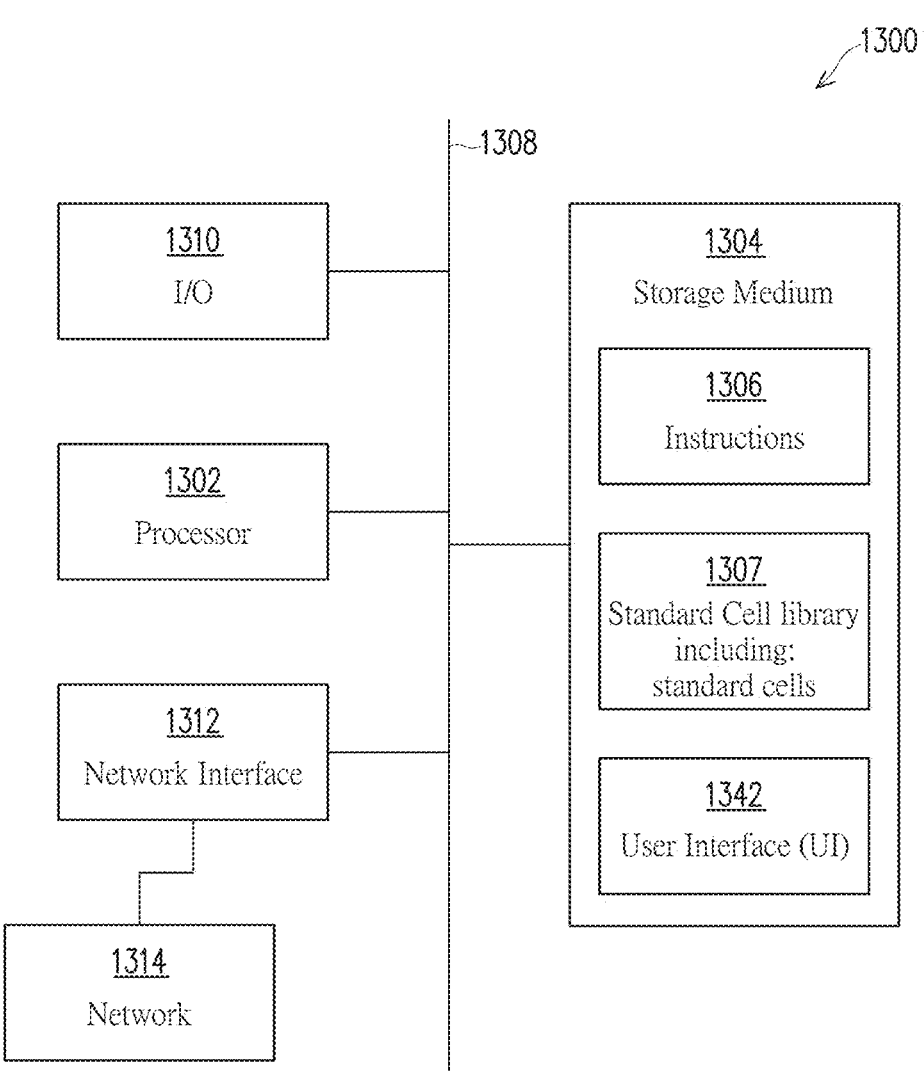

FIG. 13 is a block diagram of an electronic design automation (EDA) system in accordance with some embodiments.

Figure 14:
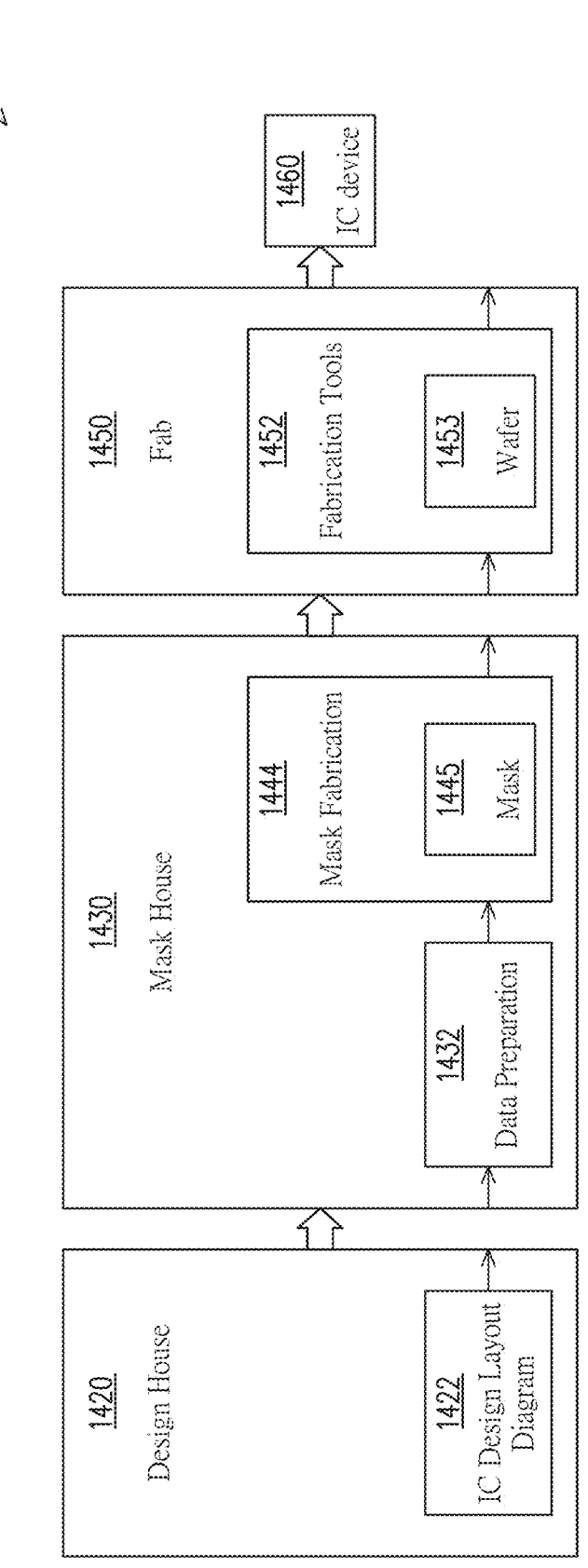

FIG. 14 is a block diagram of an IC device manufacturing system, and an IC manufacturing flow associated therewith, in accordance with some embodiments.

DETAILED DESCRIPTION

The following disclosure provides different embodiments, or examples, for implementing features of the provided subject matter. Specific examples of components, materials, values, steps, arrangements, or the like, are described below to simplify the present disclosure. These are, of course, merely examples and are not limiting. Other components, materials, values, steps, arrangements, or the like, are contemplated. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed. Source/drain(s) may refer to a source or a drain, individually or collectively dependent upon the context.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

In some embodiments, a multilayer structure is sandwiched, in a thickness direction of an IC device, between a top semiconductor device and a bottom semiconductor device of the IC device. The multilayer structure comprises at least one interlayer metal structure which is electrically coupled to at least one of the top semiconductor device or the bottom semiconductor device. The interlayer metal structure electrically couples the top semiconductor device and the bottom semiconductor device together and/or electrically couples the at least one of the top semiconductor device or the bottom semiconductor device to at least one further top or bottom semiconductor device. As a result, in one or more embodiments, it is possible to provide electrical connections among semiconductor devices of the IC device by one or more interlayer metal structures arranged between an upper layer of top semiconductor devices of the IC device and a lower layer of bottom semiconductor devices of the IC device. Such electrical connections are placed close to the semiconductor devices on both the upper layer and the lower layer of the IC device and, in one or more embodiments, advantageously reduce the lengths and/or resistance/capacitance (R/C) of electrical connections between the semiconductor devices. In some embodiments, further advantages include, but are not limited to, reduction of routing resources, no impact on the width of active regions, improvements in power, performance and/or area (PPA) of IC devices, simplified manufacturing processes, or the like.

Figure 1:
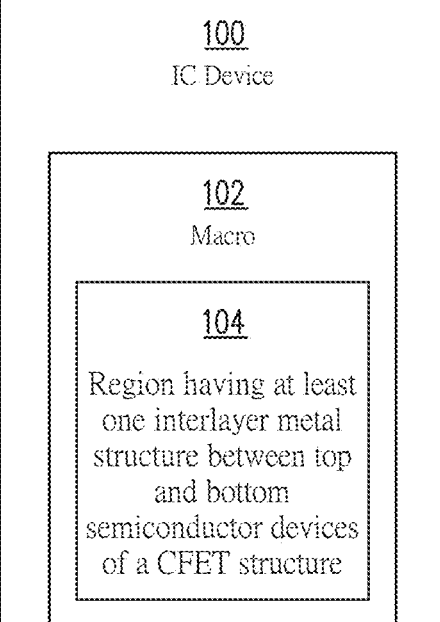
FIG. 1 is a block diagram of an IC device, in accordance with some embodiments.
Figure 1:
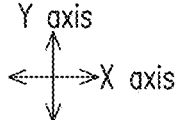

FIG. 1 is a block diagram of an IC device 100, in accordance with some embodiments.

In FIG. 1, the IC device 100 comprises, among other things, a macro 102. In some embodiments, the macro 102 comprises one or more of a memory, a power grid, a cell or cells, an inverter, a latch, a buffer and/or any other type of circuit arrangement that may be represented digitally in a cell library. In some embodiments, the macro 102 is understood in the context of an analogy to the architectural hierarchy of modular programming in which subroutines/procedures are called by a main program (or by other subroutines) to carry out a given computational function. In this context, the IC device 100 uses the macro 102 to perform one or more given functions. Accordingly, in this context and in terms of architectural hierarchy, the IC device 100 is analogous to the main program and the macro 102 is analogous to subroutines/procedures. In some embodiments, the macro 102 is a soft macro. In some embodiments, the macro 102 is a hard macro. In some embodiments, the macro 102 is a soft macro which is described digitally in register-transfer level (RTL) code. In some embodiments, synthesis, placement and routing have yet to have been performed on the macro 102 such that the soft macro can be synthesized, placed and routed for a variety of process nodes. In some embodiments, the macro 102 is a hard macro which is described digitally in a binary file format (e.g., Graphic Database System II (GDSII) stream format), where the binary file format represents planar geometric shapes, text labels, other information and the like of one or more layout-diagrams of the macro 102 in hierarchical form. In some embodiments, synthesis, placement and routing have been performed on the macro 102 such that the hard macro is specific to a particular process node.

The macro 102 includes a region 104, which comprises at least one interlayer metal structure between top and bottom semiconductor devices of a CFET device. In some embodiments, the region 104 comprises a semiconductor substrate having circuitry formed thereon, in a front-end-of-line (FEOL) fabrication. Furthermore, above and/or below the semiconductor substrate, the region 104 comprises various metal layers that are stacked over and/or under insulating layers in a Back End of Line (BEOL) fabrication. The BEOL provides routing for circuitry of the IC device 100, including the macro 102 and the region 104. The metal layers comprise conductive patterns that extend in a first direction (e.g., along an X axis) or in a second direction (e.g., along a Y axis) transverse to the first direction. In some embodiments, the first direction is orthogonal to the second direction.

Figure 2A:
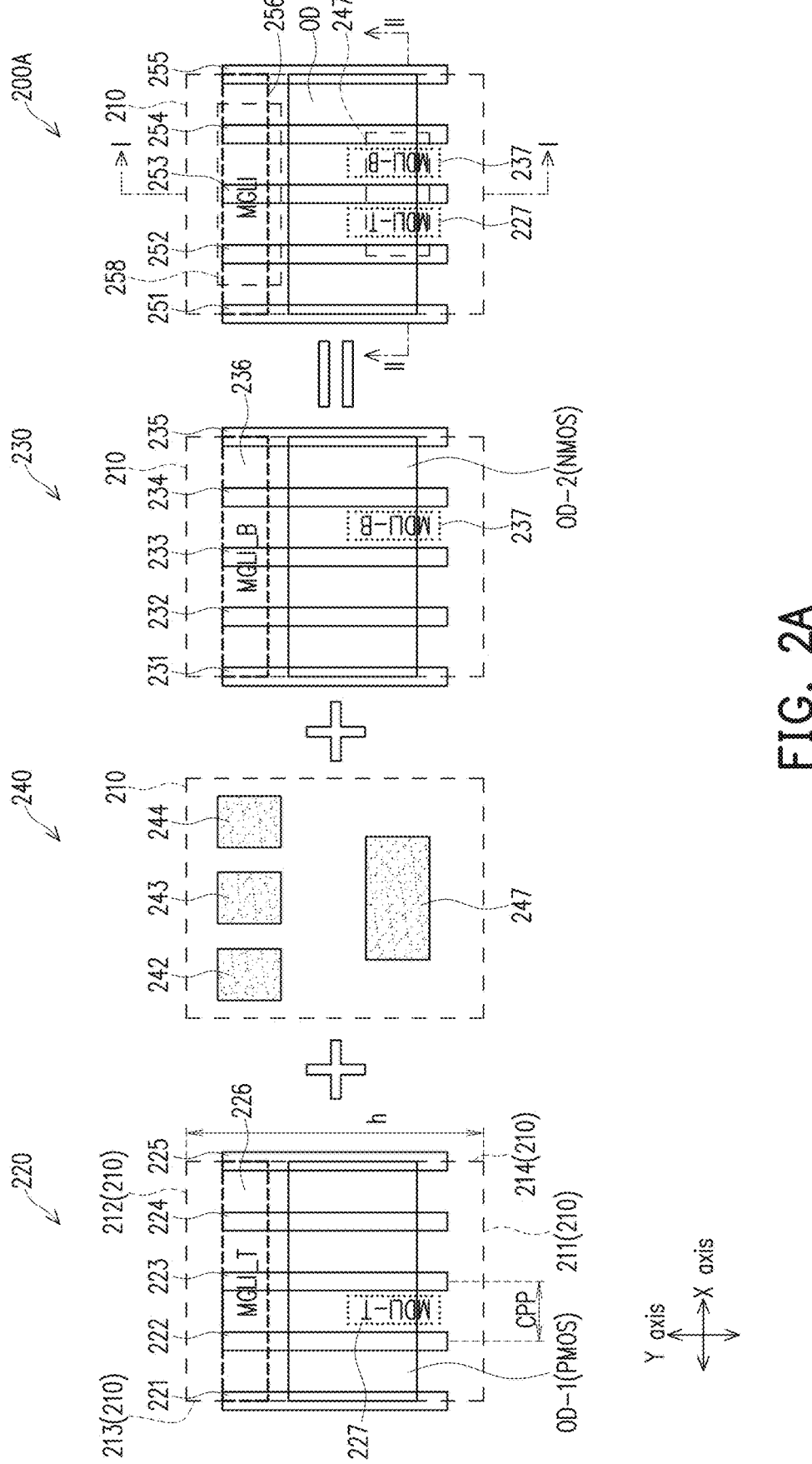
FIG. 2A includes schematic views at various layers of a layout diagram of a circuit region of an IC device, in accordance with some embodiments.

FIG. 2A includes schematic views at various layers of a layout diagram 200A of a circuit region of an IC device, in accordance with some embodiments. In some embodiments, the circuit region corresponds to a portion of the region 104 in FIG. 1. In some embodiments, the circuit region is a cell, and the layout diagram 200A is a layout of the cell.

In the example configuration in FIG. 2A, the circuit region corresponding to the layout diagram 200A comprises CFET devices each comprising a top semiconductor device and a bottom semiconductor device. The layout diagram 200A comprises a top layer 220 corresponding to one or more top semiconductor devices, a middle layer 240, and a bottom layer 230 corresponding to one or more bottom semiconductor devices. The middle layer 240 corresponds to at least one interlayer metal structure as described herein. A combination of the middle layer 240 stacked on the bottom layer 230, and the top layer 220 stacked on the middle layer 240 results in the layout diagram 200A.

The layout diagram 200A comprises a boundary 210 which is the same for all of the top layer 220, the middle layer 240, and the bottom layer 230. In at least one embodiment, the circuit region is a cell and the boundary 210 is a cell boundary. Examples of cells include, but are not limited to, AND, OR, NAND, NOR, XOR, INV, OR-AND-Invert (OAI), MUX, Flip-flop, BUFF, Latch, delay, clock, memory such as static random-access memory (SRAM), de-coupling capacitor, analog amplifier, logic driver, digital driver, or the like. The boundary 210 comprises edges 211, 212, 213, 214. The edges 211, 212 are elongated along the X axis, and the edges 213, 214 are elongated along the Y axis. In some embodiments, the X axis is an example of one of a first direction and a second direction, and the Y axis is an example of the other of the first direction and the second direction. The edges 211, 212, 213, 214 are connected together to form the closed boundary 210. In a place-and-route operation (also referred to as "automated placement and routing (APR)") described herein, cells are placed in an IC layout diagram in abutment with each other at their respective boundaries. The boundary 210 is sometimes referred to as "place-and-route boundary" or "prBoundary." The rectangular shape of the boundary 210 is an example. Other boundary shapes for various cells are within the scope of various embodiments.

The top layer 220 comprises a layout of one or more top semiconductor devices of a first type, and the bottom layer 230 comprises a layout of corresponding one or more bottom semiconductor devices of a second type different from the first type. In some embodiments, the first type is one of a P-type and an N-type, and the second type is the other of the P-type and N-type.

Each of the top layer 220 and bottom layer 230 comprises at least one active region. Active regions are sometimes referred to as oxide-definition (OD) regions or source/drain regions, and are schematically illustrated in the drawings with the label "OD." For example, the top layer 220 comprises an active region OD-1, and the bottom layer 230 comprises an active region OD-2. In the layout diagram 200A, the active regions OD-1, OD-2 overlap each other, or are stacked one over another, along a thickness direction of a substrate as described herein, and are commonly referred to as an active region OD.

In at least one embodiment, the active regions OD-1, OD-2 are over a first side, or a front side, of the substrate as described herein. The active regions OD-1, OD-2 are elongated along the X axis. The active regions OD-1, OD-2 include P-type dopants and/or N-type dopants to form one or more circuit elements or semiconductor devices. Examples of circuit elements include, but are not limited to, transistors and diodes. Examples of transistors include, but are not limited to, metal oxide semiconductor field effect transistors (MOSFET), complementary metal oxide semiconductors (CMOS) transistors, P-channel metal-oxide semiconductors (PMOS), N-channel metal-oxide semiconductors (NMOS), bipolar junction transistors (BJT), high voltage transistors, high frequency transistors, P-channel and/or N-channel field effect transistors (PFETs/NFETs), FinFETs, planar MOS transistors with raised source/drains, nanosheet FETs, nanowire FETs, or the like. An active region configured to form one or more PMOS devices is sometimes referred to as "PMOS active region," and an active region configured to form one or more NMOS devices is sometimes referred to as "NMOS active region." In the example configuration described with respect to FIG. 2A, the active region OD-1 comprises a PMOS active region, and the active region OD-2 comprise an NMOS active region. In some embodiments, the active region OD-1 comprises an NMOS active region, and the active region OD-2 comprise a PMOS active region.

The top layer 220 further comprises a plurality of gate regions 221-225, and the bottom layer 230 further comprises a plurality of corresponding gate regions 231-235. In the layout diagram 200A, the gate regions 221-225 correspondingly overlap, or are correspondingly stacked over, the gate regions 231-235 along the thickness direction of the substrate as described herein, and are commonly referred to as gate regions 251-255.

The gate regions 221-225 and gate regions 231-235 are correspondingly over the active regions OD-1, OD-2. The gate regions 221-225, 231-235 are elongated along the Y axis. The gate regions 221-225 are arranged along the X axis at a regular pitch designated as CPP (contacted poly pitch) in FIG. 2A. Likewise, the gate regions 231-235 and gate regions 251-255 are arranged along the X axis at a regular pitch CPP. CPP is a center-to-center distance along the X axis between two directly adjacent gate regions. Two gate regions are considered directly adjacent (or immediately adjacent) where there are no other gate regions therebetween. A width (or cell pitch) of the circuit region (or cell) in the layout diagram 200A along the X axis is 4 CPPs in the example configuration in FIG. 2A. The gate regions 221-225, 231-235 comprise a conductive material, such as, polysilicon, which is sometimes referred to as "poly." Other conductive materials for gate regions, such as metals, are within the scope of various embodiments. Gate regions of top semiconductor devices at the upper layer, e.g., the gate regions 221-225, are schematically illustrated in the drawings with the label "PO." Gate regions of bottom semiconductor devices at the lower layer, e.g., the gate regions 231-235, are schematically illustrated in the drawings with the label "BPO."

In the example configuration in FIG. 2A, the gate regions 222-224, 232-234 are functional gate regions which, together with the active regions OD-1, OD-2, configure a plurality of semiconductor devices or transistors, as described herein. In some embodiments, the gate regions 221, 225, 231, 235 are non-functional, or dummy, gate regions. Dummy gate regions are not configured to form transistors together with the underlying active regions, and/or one or more transistors formed by dummy gate regions together with the underlying active regions are not electrically coupled to other circuitry in the circuit region of the layout diagram 200A and/or the IC device corresponding to the layout diagram 200A. In at least one embodiment, non-functional, or dummy, gate regions include dielectric material in a manufactured IC device. Other configurations are within the scopes of various embodiments. For example, in one or more embodiments, at least one of the gate regions 222-224, 232-234 is a dummy gate region. Dummy gate regions at the upper layer, e.g., the gate regions 221, 225, are schematically illustrated in the drawings with the label "DPO." Dummy gate regions at the lower layer, e.g., the gate regions 231, 235, are schematically illustrated in the drawings with the label "BDPO."

The edges 213, 214 of the boundary 210 coincide with centerlines of dummy gate regions 221, 225, 231, 235, 251, 255. The edges 211, 212 of the boundary 210 coincide with centerlines of corresponding M0 (metal-zero) conductive patterns (not shown in FIG. 2A) as described herein. Between the edges 211, 212 and along the Y axis, the circuit region of the layout diagram 200A contains one PMOS active region, i.e., OD-1, and one NMOS active region, i.e., OD-2, and is considered to have a height corresponding to one cell height h. As described herein, another cell or circuit region containing along the Y axis two PMOS active regions and two NMOS active regions is considered to have a height corresponding to two cell heights, or double cell height, 2h.

The top layer 220 further comprises a plurality of semiconductor devices configured by the gate regions 222-224 and the active region OD-1. The bottom layer 230 further comprises a plurality of semiconductor devices configured by the gate regions 232-234 and the active region OD-2. For simplicity, a semiconductor device or transistor is referred herein by the same reference numeral of the corresponding gate region. For example, the top layer 220 comprises top semiconductor devices 222-224 which are PMOS transistors, and the bottom layer 230 comprises bottom semiconductor devices 232-234 which are NMOS transistors. In other words, the top semiconductor devices include PMOS transistors, and the bottom semiconductor devices include NMOS transistors. In one or more embodiments, the top semiconductor devices include NMOS transistors, and the bottom semiconductor devices include PMOS transistors. The circuit region in the layout diagram 200A comprises a plurality of CFET devices each comprising a top semiconductor device over a corresponding bottom semiconductor device. For simplicity, a CFET device is referred herein by the same reference numeral of the corresponding gate region. For example, a CFET device 252 comprises the top semiconductor device 222 stacked over the bottom semiconductor device 232.

The circuit region in the layout diagram 200A further comprises source/drain contacts (not shown) over and in electrical contact with the corresponding source/drains in the active regions OD-1, OD-2. Source/drain contacts are sometimes referred to as metal-to-device (MD) contacts. Source/drain contacts of top semiconductor devices at the upper layer are sometimes referred to as MD contacts. Source/drain contacts of bottom semiconductor devices at the lower layer are sometimes referred to as BMD contacts. For simplicity, an MD contact herein refers to either an MD contact at the upper layer or a BMD contact at the lower layer, unless specified otherwise. An MD contact includes a conductive material over a corresponding source/drain in the corresponding active region to define an electrical connection from one or more devices formed in the active region to other internal circuitry of the IC device or to outside circuitry. MD contacts are arranged alternatingly with the gate regions along the X axis. A pitch, i.e., a center-to-center distance along the X axis, between directly adjacent MD contacts is the same as the pitch CPP between directly adjacent gate regions.

At least one of the top semiconductor device or the bottom semiconductor device comprises at least one of a gate local interconnect (MGLI) or a source/drain local interconnect (MDLI). An MGLI is a conductive structure in physical and electrical contact with a gate of a semiconductor device. An MDLI is a conductive structure in physical and electrical contact with a source/drain of a semiconductor device. An MGLI and an MDLI of a top semiconductor device are correspondingly illustrated schematically in the drawings with the labels "MGLI-T" and "MDLI-T." An MGLI and an MDLI of a bottom semiconductor device are correspondingly illustrated schematically in the drawings with the labels "MGLI-B" and "MDLI-B."

The top layer 220 comprises an MGLI-T region 226 in which one or more MGLI-Ts are arranged. Each MGLI-T is over a corresponding gate region, as described herein. In the example configuration in FIG. 2A, there are three gate regions 222-224 in the top layer 220 and, in one or more embodiments, each of the gate regions 222-224 has a corresponding MGLI-T thereover resulting in three MGLI-Ts in the top layer 220. In at least one embodiment, the number of MGLI-Ts in the top layer 220 is zero, meaning that the top layer 220 does not include an MGLI-T. Various embodiments include different numbers of MGLI-Ts e.g., one MGLI-T or two MGLI-Ts. These are examples, and other numbers of gate regions and/or MGLI-Ts are within the scopes of various embodiments. In some embodiments, as described herein, the top layer 220 comprises two MGLI-T regions on opposite sides of the active region OD-1 along the Y axis. As shown in FIG. 2A, the MGLI-T region 226 is arranged to not overlap the active region OD-1 in plan view (or layout view). A reason for this arrangement is to prevent one or more MGLI-Ts in the MGLI-T region 226, and the corresponding one or more gate regions, from be shorted to the source/drains in the active region OD-1 as the one or more MGLI-T extend into contact with one or more underlying interlayer metal structures, as described herein.

In the example configuration in FIG. 2A, the top layer 220 further comprises an MDLI-T 227 over a source/drain between the gate regions 222, 223. This is an example. In at least one embodiment, the top layer 220 includes no MDLI-T. In some embodiments, the top layer 220 includes one or more MDLI-Ts each over a source/drain between any pair of immediately adjacent gate regions, e.g., between the gate regions 221 and 222, or the gate regions 222 and 223, or between the gate regions 223 and 224, or between the gate regions 224 and 225. Other numbers of MDLI-Ts are within the scopes of various embodiments. In some embodiments, as described herein, the top layer 220 comprises at least two MDLI-Ts on opposite sides of the active region OD-1 along the Y axis. As shown in FIG. 2A, the MDLI-T 227 is arranged to overlap the active region OD-1 in plan view (or layout view), so that the MDLI-T 227, in a manufactured IC device, is in physical and electrical contact with the underlying source/drain. In some embodiments, an MDLI-T replaces an MD contact over the same source/drain in the upper layer, i.e., a source/drain in the upper layer has either an MD contact or an MDLI-T thereon. In some embodiments, an MDLI-T is over an MD contact.

The bottom layer 230 comprises an MGLI-B region 236 in which one or more MGLI-Bs are arranged. In some embodiments, the bottom layer 230 does not include an MGLI-B. In some embodiments, the MGLI-B region 236 and one or more MGLI-Bs in the bottom layer 230 are configured similarly to the MGLI-T region 226 and one or more MDLI-Ts in the top layer 220. In some embodiments, as described herein, the bottom layer 230 comprises two MGLI-B regions on opposite sides of the active region OD-2 along the Y axis.

In the example configuration in FIG. 2A, the bottom layer 230 further comprises an MDLI-B 237 over a source/drain between the gate regions 233, 234. In at least one embodiment, the bottom layer 230 includes no MDLI-B. In some embodiments, the bottom layer 230 includes one or more MDLI-Bs configured similarly to one or more MDLI-Ts in the top layer 220. In some embodiments, as described herein, the bottom layer 230 comprises at least two MDLI-Bs on opposite sides of the active region OD-2 along the Y axis. In some embodiments, an MDLI-B replaces a BMD contact over the same source/drain in the lower layer, i.e., a source/drain in the lower layer has either a BMD contact or an MDLI-B thereon. In some embodiments, an MDLI-B is over a BMD contact.

The middle layer 240 comprises one or more interlayer metal structures 242, 243, 244, 247. The number, arrangements, sizes and/or shapes of the interlayer metal structures in FIG. 2A are examples. Other numbers and/or arrangements of interlayer metal structures in the middle layer 240 are within the scopes of various embodiments. In some embodiments, the middle layer 240 includes no interlayer metal structure. Interlayer metal structures are schematically illustrated in the drawings with the label "inter metal" or "IM." Each of the interlayer metal structures 242, 243, 244 is arranged over an MGLI-B and/or under an MGLI-T, and is electrically coupled to at least one of the MGLI-T or the MGLI-B. The interlayer metal structure 247 is arranged over an MDLI-B and/or under an MDLI-T, and is electrically coupled to at least one of the MDLI-T or the MDLI-B. As illustrated in FIG. 2A, the interlayer metal structures 242, 243, 244, 247 are confined within the boundary 210 of the layout diagram 200A, and are configured to provide internal electrical connections among elements or devices within a cell having the layout diagram 200A.

For example, as shown in the layout diagram 200A, the interlayer metal structure 247 is over the MDLI-B 237 and under the MDLI-T 227, and electrically couples the MDLI-T 227 to MDLI-B 237. In the layout diagram 200A, the interlayer metal structures 242, 243, 244 are collectively schematically illustrated by a region 258 in which at least one MGLI-T in the top layer 220 and/or at least one MGLI-B in the bottom layer 230 is electrically coupled to at least one interlayer metal structures 242, 243, 244. Various examples of electrical connections among MGLIs, MDLIs and/or interlayer metal structures are described herein.

Figures 2B, 2C:
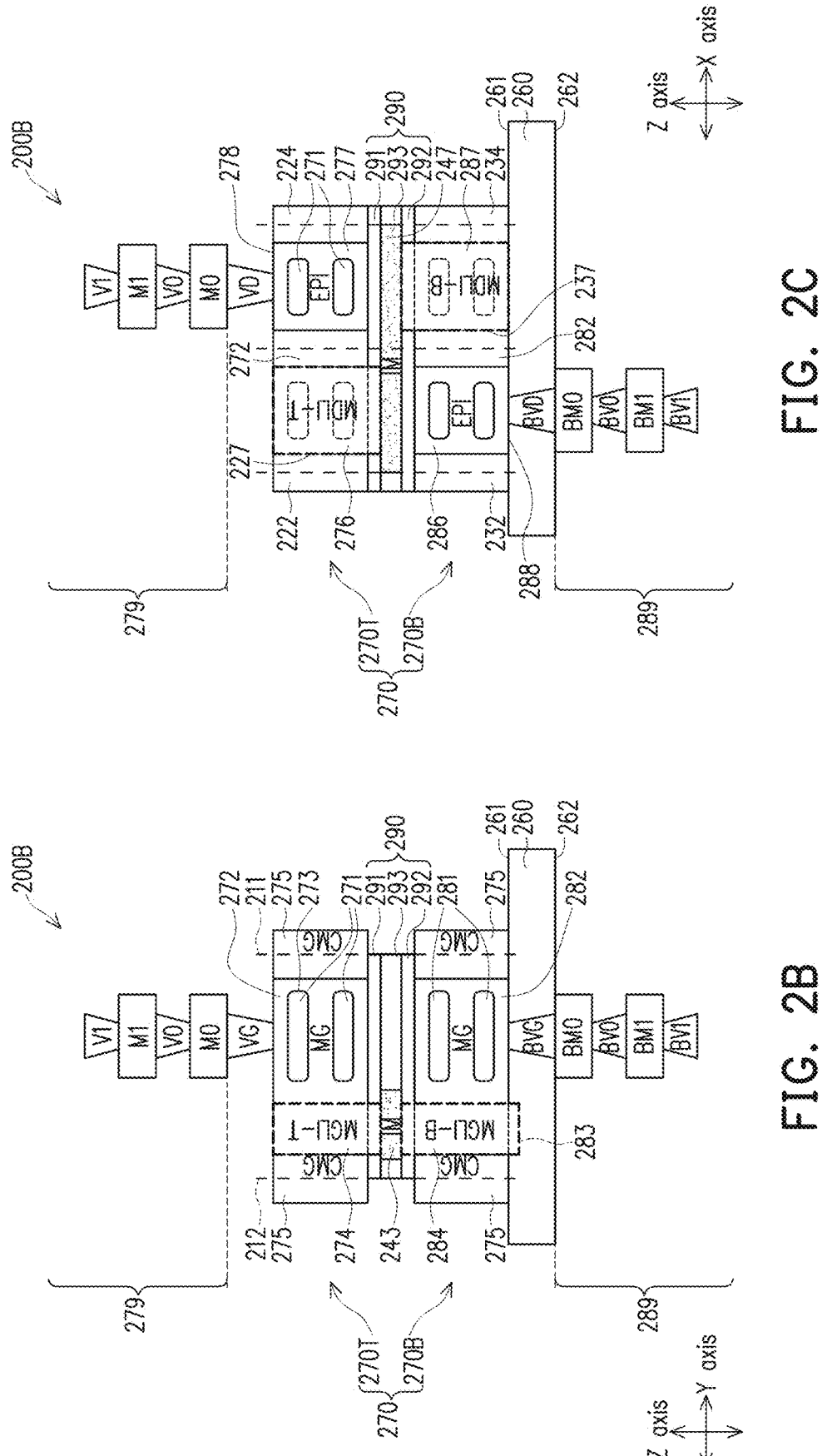
FIGS. 2B-2C are schematic cross-sectional views of a CFET device in an IC device, in accordance with some embodiments.

FIGS. 2B and 2C are schematic cross-sectional views of a CFET device in an IC device 200B, in accordance with some embodiments. In some embodiments, the IC device 200B corresponds to the layout diagram 200A, FIG. 2B corresponds to a Y axis cross-sectional view taken along line I-I in FIG. 2A, and FIG. 2C corresponds to an X axis cross-sectional view taken along line II-II in FIG. 2A. For simplicity, corresponding components in FIGS. 2A, 2B, 2C are designated by the same reference numerals.

As illustrated in FIG. 2B, the IC device 200B comprises a substrate 260 having a front side 261, and a back side 262 opposite to the front side 261 in a thickness direction of the substrate 260. In at least one embodiment, the front side 261 is referred to as "first side," "upper side" or "device side," whereas the back side 262 is referred to as "second side," or "lower side." The thickness direction of the substrate 260 is also a thickness direction of the IC device 200B, and is designated as Z axis in the drawings. In some embodiments, the substrate 260 comprises a semiconductor material, such as silicon, silicon germanium (SiGe), gallium arsenic, or other suitable semiconductor materials. In some embodiments, the substrate 260 comprises a dielectric material, such as silicon nitride, silicon oxide, ceramic, glass, or other suitable materials. In some embodiments, the substrate 260 comprises a multi-layer structure. In some embodiments, the substrate 260 is omitted, or comprises an insulation layer that replaces an initial semiconductor bulk used during manufacture.

The IC device 200B further comprises a CFET device 270 over the front side 261 of the substrate 260. The CFET device 270 comprises a top semiconductor device 270T over a bottom semiconductor device 270B. The top semiconductor device 270T is an example of semiconductor devices in an upper layer of the IC device 200B, and the bottom semiconductor device 270B is an example of semiconductor devices in a lower layer of the IC device 200B. Gate features of the top semiconductor device 270T and bottom semiconductor device 270B are described with respect to FIG. 2B, and source/drain features of the top semiconductor device 270T and bottom semiconductor device 270B are described with respect to FIG. 2C.

At the upper layer, the top semiconductor device 270T comprises a channel which is arranged in an active region corresponding to the active region OD-1. In the example configuration in FIG. 2B, the channel comprises a semiconductor material, such as Si, and is configured as a plurality of nanosheets 271 stacked over, while being spaced from, each other. The described channel material and nanosheets are examples. Other channel materials and/or channel types, such as nanowire, FinFET, planar, or the like, are within the scopes of various embodiments.

The top semiconductor device 270T further comprises a gate 272 corresponding to the gate region 223. In some embodiments, the gate 272 is a metal gate. Other gate materials, such as polysilicon, are within the scopes of various embodiments. In the example configuration in FIG. 2B, the gate 272 is an all-around gate, and the gate material of the gate 272 replaces a sacrificial material, such as SiGe, in the active region. Gates are schematically designated as "MG" in the drawings.

The top semiconductor device 270T further comprises a gate dielectric between the gate 272 and the nanosheets 271, and extending around each of the nanosheets 271. For simplicity, a gate dielectric 273 is designated for one of the nanosheets 271 in FIG. 2B. Example materials of the gate dielectric include high-k dielectric materials, or the like.

The top semiconductor device 270T further comprises an MGLI-T 274 over a portion of the gate 272 outside the active region. In some embodiments, the MGLI-T 274 corresponds to an MGLI-T in the MGLI-T region 226. An example material of the MGLI-T 274 comprises a metal. In the example configuration in FIG. 2B, the MGLI-T 274 extends along at least a full height of the gate 272 along the Z axis, and further downwardly to come into physical and electrical contact with the interlayer metal structure 243 at a lower end of the MGLI-T 274, as described herein.

The top semiconductor device 270T further comprises isolation structures 275 of a dielectric material at opposite ends of the gate 272 along the Y axis. In some embodiments, the isolation structures 275 correspond to patterns in a mask referred to as a cut-metal-gate (CMG) mask. In the example configuration in FIG. 2B, centerlines of the isolation structures 275 coincide with the edges 211, 212 of the boundary 210.

As illustrated in FIG. 2C, the top semiconductor device 270T further comprises source/drains 276, 277 arranged, along the X axis, on opposite sides of the gate 272. The source/drain 276 is arranged between the gate 272 and a gate corresponding to the gate region 222. The source/drain 277 is arranged between the gate 272 and a gate corresponding to the gate region 224. For simplicity, details of the gates and associated features are omitted in FIG. 2C. In the example configuration in FIG. 2C, each of the source/drains 276, 277 comprises an epitaxy structure extending around the nanosheets 271. In some embodiments, the source/drains 276, 277 are grown by epitaxy processes. Epitaxy structures are schematically illustrated in the drawings with the label "EPI."

The top semiconductor device 270T further comprises the MDLI-T 227 over at least a portion of the source/drain 276. An example material of the MDLI-T 227 comprises a metal. In the example configuration in FIG. 2C, the MDLI-T 227 extends along at least a full height of the source/drain 276 along the Z axis, and further downwardly to come into physical and electrical contact with the interlayer metal structure 247 as described herein.

In some embodiments, the top semiconductor device 270T further comprises one or more MD contacts (not shown). For example, an MD contact is arranged over a top or upper surface 278 of the source/drain 277 to electrically couple the source/drain 277 to a via-to-device (VD) via as described herein. In some embodiments, the MDLI-T 227 is also configured as an MD contact to be electrically coupled both at a lower end to the interlayer metal structure 247, and at an upper end to a VD via. In at least one embodiment where the MDLI-T 227 is also configured as an MD contact, the upper end of the MDLI-T 227 projects upwardly beyond the upper surface 278 of the source/drain 277. Other configurations are within the scopes of various embodiments.

The IC device 200B further comprises vias over and in electrical contact with the corresponding gates or MD contacts. A via over and in electrical contact with an MD contact is sometimes referred to as via-to-device (VD) via. A via over and in electrical contact with a gate is sometimes referred to as via-to-gate (VG) via. VD and VG vias are schematically illustrated in the drawings with the corresponding labels "VD" and "VG." An example material of the VD and VG vias includes metal. Other configurations are within the scopes of various embodiments. In the example configuration in FIGS. 2B, 2C, a VG via is over the gate 272 and a VD via is over the source/drain 277. In at least one embodiment, an MD contact is between the VD via and the source/drain 277. Other VG and/or VD vias of the IC device 200B are within the scopes of various embodiments.

The IC device 200B further comprises a redistribution structure 279 which is over the VD, VG vias. The redistribution structure 279 comprises a plurality of metal layers and via layers sequentially and alternatingly arranged over the VD, VG vias. The redistribution structure 279 further comprises various interlayer dielectric (ILD) layers (not shown) in which the metal layers and via layers are embedded. The metal layers and via layers of the redistribution structure 279 are configured to electrically couple various elements or circuits of the IC device 200B with each other, and with external circuitry. In the redistribution structure 279, the lowermost metal layer immediately over and in electrical contact with the VD, VG vias is an M0 (metal-zero) layer, a next metal layer immediately over the M0 layer is an M1 layer, a next metal layer immediately over the M1 layer is an M2 layer, or the like. Conductive patterns in the M0 layer are referred to as M0 conductive patterns, conductive patterns in the M1 layer are referred to as M1 conductive patterns, or the like. A via layer Vn is arranged between and electrically couple the Mn layer and the Mn+1 layer, where n is an integer from zero and up. For example, a via-zero (V0) layer is the lowermost via layer which is arranged between and electrically couple the M0 layer and the M1 layer. Other via layers are V1, V2, or the like. Vias in the V0 layer are referred to as V0 vias, vias in the V1 layer are referred to as V1 vias, or the like. For simplicity, metal layers and via layers in the redistribution structure 279 are not fully illustrated in FIGS. 2B, 2C. The redistribution structure 279 and interconnects therein are formed over the front side 261, and are sometimes referred to as the front side redistribution structure and front side interconnects. The IC device 200B further comprises a back side redistribution structure 289 and corresponding back side interconnects on the back side 262, as described herein.

At the lower layer, the bottom semiconductor device 270B comprises a channel with nanosheets 281, a gate 282, an MGLI-B 284, source/drain 286, 287, and the MDLI-B 237 corresponding to the channel and nanosheets 271, the gate 272, MGLI-T 274, source/drains 276, 277, and MDLI-T 227 described with respect to the top semiconductor device 270T. Various details of the bottom semiconductor device 270B are similar to those of the top semiconductor device 270T, and are omitted in the subsequent description.

A difference between the top semiconductor device 270T and bottom semiconductor device 270B involves their P-type or N-type. For example, in at least one embodiment, the top semiconductor device 270T is a P-type device and comprises P-type source/drains 276, 277 and an N-type channel (i.e., N-type nanosheets 271), whereas the bottom semiconductor device 270B is an N-type device and comprises N-type source/drains 286, 287 and a P-type channel (i.e., P-type nanosheets 281). In some embodiments, the top semiconductor device 270T is an N-type device, and the bottom semiconductor device 270B is a P-type device.

In some embodiments, the gate 282 of the bottom semiconductor device 270B corresponds to the gate region 233. The MGLI-B 284 is over a portion of the gate 282 outside the active region of the bottom semiconductor device 270B. In some embodiments, the MGLI-B 284 corresponds to an MGLI-B in the MGLI-B region 236. In the example configuration in FIG. 2B, the MGLI-B 284 extends along at least a full height of the gate 282 along the Z axis, and further upwardly to come into physical and electrical contact with the interlayer metal structure 243 at an upper end of the MGLI-B 284, as described herein. The MGLI-B 284 further comprises a lower end 283 protrudes downwardly into the substrate 260. This is an example. In at least one embodiment, the lower end 283 of the MGLI-B 284 is flush with the front side 261 of the substrate 260. In some embodiments, the lower end 283 is flush with the back side 262 of the substrate 260, i.e., the MGLI-B 284 extends through the substrate 260, for example, to come into physical and electrical contact with a back side interconnect. For simplicity, isolation structures at opposite ends of the gate 282 along the Y axis are also designated as isolation structures 275.

The MDLI-B 237 is over the source/drain 287 of the bottom semiconductor device 270B. In the example configuration in FIG. 2C, the MDLI-B 237 extends along at least a full height of the source/drain 287 along the Z axis, and further upwardly to come into physical and electrical contact with the interlayer metal structure 247. In some embodiments, the bottom semiconductor device 270B further comprises one or more BMD contacts (not shown). For example, a BMD contact is arranged over a bottom or lower surface 288 of the source/drain 286 to electrically couple the source/drain 286 to a back side via-to-device (BVD) via as described herein. In some embodiments, the MDLI-B 237 is also configured as a BMD contact to be electrically coupled both at an upper end to the interlayer metal structure 247, and at a lower end to a BVD via. In at least one embodiment where the MDLI-B 237 is also configured as a BMD contact, the lower end of the MDLI-B 237 projects downwardly beyond the lower surface 288 of the source/drain 286. Other configurations are within the scopes of various embodiments.

The IC device 200B further comprises back side VD and/or VG vias in electrical contact with the corresponding gates and/or MD contacts of the bottom semiconductor device 270B. Back side VD and VG vias are schematically illustrated in the drawings with the corresponding labels "BVD" and "BVG." An example material of the BVD and BVG vias includes metal. Other configurations are within the scopes of various embodiments. In the example configuration in FIG. 2B, a BVG via extends through the substrate 260 from the back side 262 to the front side 261, to come in physical and electrical contact with the gate 282. In the example configuration in FIG. 2C, a BVD via extends through the substrate 260 from the back side 262 to the front side 261, to come in physical and electrical contact with the lower surface 288 of the source/drain 286. In at least one embodiment, a BMD contact is between the BVD via and the source/drain 286. Other BVG and/or BVD vias of the IC device 200B are within the scopes of various embodiments.

The back side redistribution structure 289 comprises a plurality of back side metal layers and a plurality of back side via layers arranged alternatingly in the thickness direction of the substrate 260, i.e., along the Z axis. The back side redistribution structure 289 further comprises various interlayer dielectric (ILD) layers in which the back side metal layers and back side via layers are embedded. The back side metal layers and back side via layers of the back side redistribution structure 289 are configured to supply power and/or signals from external circuitry to various elements or circuits of the IC device 200B. The back side metal layer immediately adjacent the back side 262 of the substrate 260 is a back side M0 (BM0) layer, a next back side metal layer is a back side M1 (BM1) layer, or the like. A back side via layer BVn is arranged between and electrically couples the BMn layer and the BMn+1 layer, where n is an integer from zero and up. For example, a via layer BV0 is the back side via layer arranged between and electrically couples the BM0 layer and the BM1 layer. Other back side via layers are BV1, BV2, or the like. For simplicity, back side metal layers and back side via layers in the back side redistribution structure 289 are not fully illustrated in FIGS. 2B, 2C.

The IC device 200B further comprises a multilayer structure 290 arranged, along the Z axis, between top semiconductor devices in the upper layer and bottom semiconductor devices in the lower layer of the IC device 200B. For example, as illustrated in FIGS. 2B, 2C, the multilayer structure 290 is sandwiched, along the Z axis, i.e., in the thickness direction, between the top semiconductor device 270T and the bottom semiconductor device 270B. The multilayer structure 290 comprises an upper dielectric layer 291, a lower dielectric layer 292, a middle dielectric layer 293 between the upper dielectric layer 291 and lower dielectric layer 292. The upper dielectric layer 291 is under the upper layer of the IC device 200B, and the lower dielectric layer 292 is over the lower layer of the IC device 200B. In the example configuration in FIGS. 2B, 2C, the upper dielectric layer 291 is under the top semiconductor device 270T, and the lower dielectric layer 292 is over the bottom semiconductor device 270B.

Example materials of one or more of the upper dielectric layer 291, lower dielectric layer 292, middle dielectric layer 293 include, but are not limited to, nitride, oxide, carbide, or the like. In some embodiments, a dielectric material of the middle dielectric layer 293 is different from a dielectric material or dielectric materials of the upper dielectric layer 291 and lower dielectric layer 292. In at least one embodiment, the material of the middle dielectric layer 293 has a sufficient etching selectivity with respect to the material or materials of the upper dielectric layer 291 and/or the lower dielectric layer 292, so that the lower dielectric layer 292 serves as an etch stop layer for the middle dielectric layer 293, and/or the middle dielectric layer 293 serves as an etch stop layer for the upper dielectric layer 291 during different etching operations. In at least one embodiment, the upper dielectric layer 291 comprises an oxide, the middle dielectric layer 293 comprises a nitride, and the lower dielectric layer 292 comprises an oxide. In some embodiments, the upper dielectric layer 291 comprises a nitride, the middle dielectric layer 293 comprises an oxide, and the lower dielectric layer 292 comprises a nitride. Other configurations and/or materials are within the scopes of various embodiments.

The multilayer structure 290 further comprises at least one interlayer metal structure embedded in the middle dielectric layer 293, and electrically coupled to at least one top semiconductor device and/or at least one bottom semiconductor device. In the example configuration in FIG. 2B, the interlayer metal structure 243 is embedded in the middle dielectric layer 293, and is electrically coupled to both the MGLI-T 274 which extends downwardly through the upper dielectric layer 291, and the MGLI-B 284 which extends upwardly through the lower dielectric layer 292. As a result, the gate 272 of the top semiconductor device 270T and the gate 282 of the bottom semiconductor device 270B are electrically coupled together by the MGLI-T 274, interlayer metal structure 243, MGLI-B 284. In the example configuration in FIG. 2C, the interlayer metal structure 247 is embedded in the middle dielectric layer 293, and is electrically coupled to both the MDLI-T 227 which extends downwardly through the upper dielectric layer 291, and the MDLI-B 237 which extends upwardly through the lower dielectric layer 292. As a result, the source/drain 276 of the top semiconductor device 270T and the source/drain 287 of the bottom semiconductor device 270B are electrically coupled together by the MDLI-T 227, interlayer metal structure 247, MDLI-B 237. The described arrangements and/or connections of an interlayer metal structure with an MGLI and/or an MDLI are examples. Other configurations are within the scopes of various embodiments, for example, as described with respect to one or more of FIGS. 3A-3C, 4A-4B, 5A-5B, 6B, 8A-8B, 9A-9B.

Figure 3A:
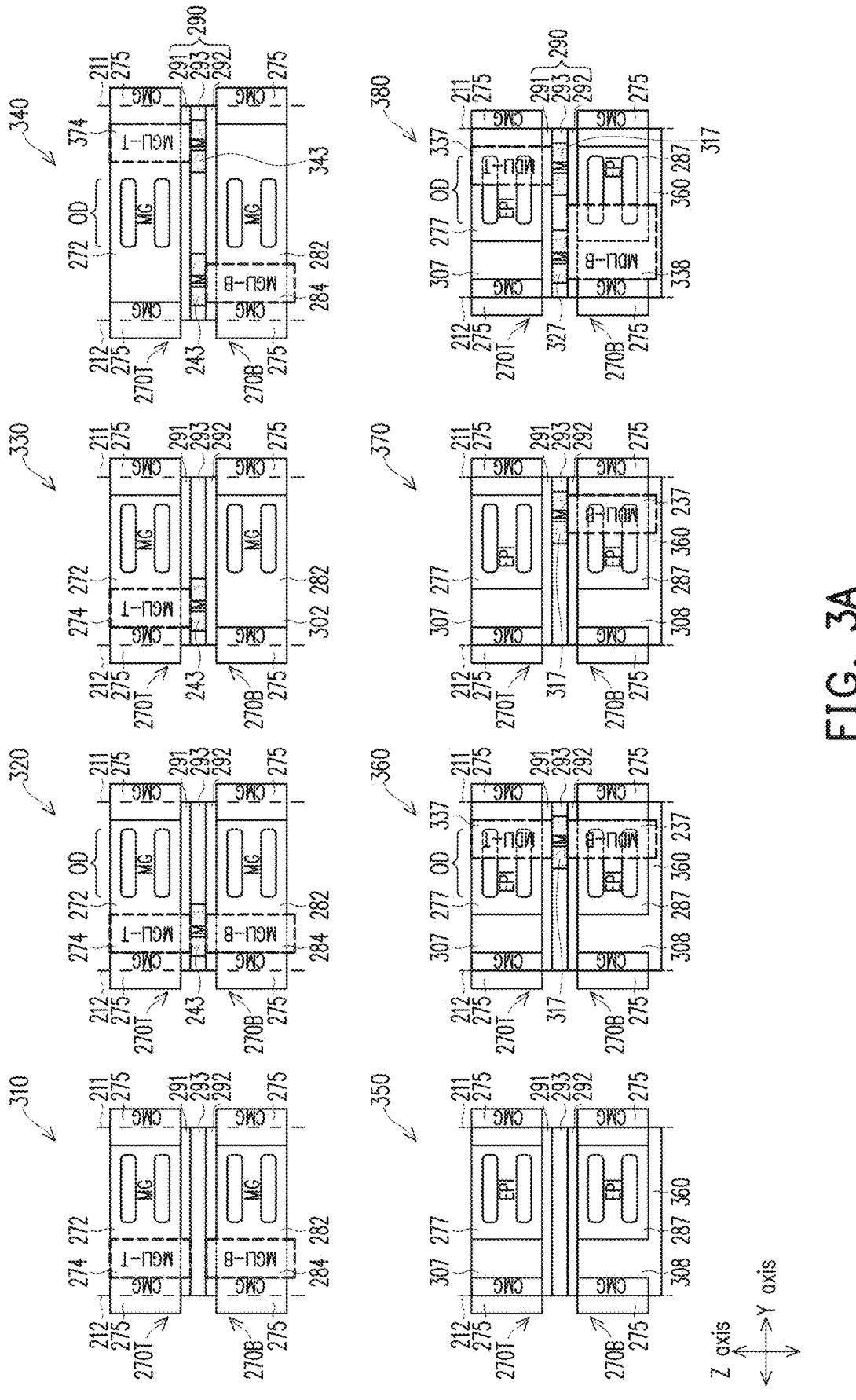
FIG. 3A includes schematic cross-sectional views of various CFET devices in one or more IC devices, in accordance with some embodiments.

FIG. 3A includes schematic cross-sectional views of various CFET devices 310-380 of one or more IC devices, in accordance with some embodiments. In some embodiments, the CFET devices 310-380 are included in the same IC device. The cross-sectional views of the CFET devices 310-340 in FIG. 3A are Y axis cross-sectional views taken along a gate, similarly to the cross-sectional view in FIG. 2B, and as further detailed in FIG. 3B. The cross-sectional views of CFET devices 350-380 are also Y axis cross-sectional views taken, however, along a source/drain, as further detailed in FIG. 3C. For simplicity, corresponding components in FIGS. 2A-2C and 3A-3C are designated by the same reference numerals.

The CFET device 310 is similar to the CFET device 270 in FIG. 2B, except that the interlayer metal structure 243 of the CFET device 270 is not included in the CFET device 310. In other words, in the CFET device 310, the MGLI-T 274 of the top semiconductor device 270T and the MGLI-B 284 of the bottom semiconductor device 270B are not electrically coupled to an interlayer metal structure between the top semiconductor device 270T and bottom semiconductor device 270B.

The CFET device 320 is the same as the CFET device 270 in FIG. 2B. In the CFET device 320, the interlayer metal structure 243 electrically couples the MGLI-T 274 to the MGLI-B 284. In some embodiments, the interlayer metal structure 243 further electrically couples the MGLI-T 274 and MGLI-B 284 to at least one MGLI and/or at least one MDLI of one or more further CFET devices (not shown). The structure in the CFET device 310 where an MGLI-T (e.g., 274) is directly over an MGLI-B (e.g., 284) is sometimes referred to herein as "MGLI_TB" (e.g., top-to-bottom MGLI).

The CFET device 330 is similar to the CFET device 320, except that the MGLI-B 284 is omitted. The cross-sectional view of the CFET device 330 shows a region 302 of the gate 282. The region 302 is covered by, and in physical and electrical contact with, the MGLI-B 284 in the CFET devices 310, 320, 340. In the CFET device 330, the interlayer metal structure 243 electrically couples the MGLI-T 274 to at least one MGLI and/or at least one MDLI of one or more further CFET devices (not shown). The structure in the CFET device 330 where an MGLI-T (e.g., 274) is present, but without an MGLI-B directly under the MGLI-T (i.e., without MGLI-B 284), is sometimes referred to herein as "MGLI_T" (e.g., top-only MGLI). A structure where an MGLI-B is present, but without an MGLI-T directly over the MGLI-B, is sometimes referred to herein as "MGLI_B" (e.g., bottom-only MGLI). An example MGLI_B is described with respect to the CFET device 340. Various examples of MGLI_TB, MGLI_T, and MGLI_B are described with respect to one or more of FIGS. 6B, 8A-8B, 9A-9B.

The CFET device 340 is different from the CFET devices 310-330 in that the CFET device 340 comprises, along the Y axis, MGLIs on two opposite sides of the active region OD. In contrast, MGLIs in the CFET devices 310-330 are arranged on one side of the active region OD, e.g., as illustrated for the CFET device 320. Specifically, along the Y axis, the CFET device 340 comprises the MGLI-B 284 at one side of the active region OD, and an MGLI-T 374 at the opposite side of the active region OD. In some embodiments, the MGLI-T 374 is configured similarly to the MGLI-T 274. The MGLI-T 374 extends along the Z axis through the upper dielectric layer 291 to come in physical and electrical contact with an interlayer metal structure 343 embedded in the middle dielectric layer 293. Within the multilayer structure 290, the interlayer metal structure 343 is electrically isolated from the interlayer metal structure 243. Each of the interlayer metal structures 243, 343 electrically couples the corresponding MGLI-B 284 or MGLI-T 374 to at least one MGLI and/or at least one MDLI of one or more further CFET devices (not shown). In the CFET device 340, the configuration of the MGLI-T 274 electrically coupled to the interlayer metal structure 243 corresponds to an MGLI_B, and the configuration of the MGLI-T 374 electrically coupled to the interlayer metal structure 343 corresponds to an MGLI_T. Further examples of MGLIs on opposite sides of an active region include two MGLI_Ts, and two MGLI_Bs.

The CFET device 350 is similar to the right hand side of the CFET device 270 in FIG. 2C, except that the MDLI-B 237 and the interlayer metal structure 247 of the CFET device 270 is not included in the CFET device 350. In other words, in the CFET device 350, the source/drain 277 directly over the source/drain 287 are not electrically coupled to each other by an interlayer metal structure between the top semiconductor device 270T and bottom semiconductor device 270B. The cross-sectional view of the CFET device 350 shows an insulation layer 360 under the bottom semiconductor device 270B. In some embodiments, the insulation layer 360 corresponds to the substrate 260. The CFET device 350 further comprises an insulation region 307 and an insulation region 308 correspondingly between the source/drains 277, 287 and the adjacent isolation structures 275. In some embodiments, the insulation region 308 is at least partially covered by, and in physical contact with, an MDLI-B as described, e.g., with respect to the CFET device 380. In at least one embodiment, the insulation region 307 is at least partially covered by, and in physical contact with, an MDLI-T in a similar manner.

The CFET device 360 is similar to the CFET device 350, but additionally includes the MDLI-B 237, an MDLI-T 337 directly over the MDLI-B 237, and an interlayer metal structure 317 between the MDLI-B 237 and MDLI-T 337. Each of the MDLI-B 237, MDLI-T 337 at least partially covers, and is in physical and electrical contact with, the corresponding source/drain 287, 277. The MDLI-T 337 is configured similarly to the MDLI-T 227. The MDLI-T 337 extends along the Z axis through the upper dielectric layer 291 to come in physical and electrical contact with an interlayer metal structure 317 embedded in the middle dielectric layer 293. The interlayer metal structure 317 electrically couples the MDLI-T 337 to the MDLI-B 237. In some embodiments, the interlayer metal structure 317 further electrically couples the MDLI-T 337 and MDLI-B 237 to at least one MGLI and/or at least one MDLI of one or more further CFET devices (not shown). The structure in the CFET device 360 where an MDLI-T (e.g., 337) is directly over an MDLI-B (e.g., 237) is sometimes referred to herein as "MDLI_TB" (e.g., top-to-bottom MDLI).

The CFET device 370 is similar to the CFET device 360, except that the MDLI-T 337 is omitted. In the CFET device 370, the interlayer metal structure 317 electrically couples the MDLI-B 237 to at least one MGLI and/or at least one MDLI of one or more further CFET devices (not shown). The structure in the CFET device 370 where an MDLI-B (e.g., 237) is present, but without an MDLI-T directly over the MDLI-B (i.e., without MDLI-T 337), is sometimes referred to herein as "MDLI_B" (e.g., bottom-only MDLI). A structure where an MDLI-T is present, but without an MDLI-B directly under the MDLI-T, is sometimes referred to herein as "MDLI_T" (e.g., top-only MDLI). An example MDLI_T is described with respect to the CFET device 380. Various examples of MDLI_TB, MDLI_T, and MDLI_B are described with respect to one or more of FIGS. 6B, 8A-8B, 9A-9B.

The CFET device 380 is different from the CFET devices 350-370 in that the CFET device 380 comprises, along the Y axis, MDLIs on two opposite sides of the active region OD. In contrast, MDLIs in the CFET devices 350-370 are arranged on one side of the active region OD, e.g., as illustrated for the CFET device 360. Specifically, along the Y axis, the CFET device 380 comprises the MDLI-T 337 at one side of the active region OD, and an MDLI-B 338 at the opposite side of the active region OD. In some embodiments, the MDLI-B 338 is configured similarly to the MDLI-B 237. The region 308 is at least partially covered by, and in physical contact with, the MDLI-B 338. The MDLI-B 338 extends along the Z axis through the lower dielectric layer 292 to come in physical and electrical contact with an interlayer metal structure 327 embedded in the middle dielectric layer 293. Within the multilayer structure 290, the interlayer metal structure 327 is electrically isolated from the interlayer metal structure 317.

Each of the interlayer metal structures 317, 327 electrically couples the corresponding MDLI-T 337 or MDLI-B 338 to at least one MGLI and/or at least one MDLI of one or more further CFET devices (not shown). In the CFET device 380, the configuration of the MDLI-B 338 electrically coupled to the interlayer metal structure 327 corresponds to an MDLI_B, and the configuration of the MDLI-T 337 electrically coupled to the interlayer metal structure 317 corresponds to an MDLI_T. Further examples of MDLIs on opposite sides of an active region include two MDLI_Ts, and two MDLI_Bs.

Figure 3B:
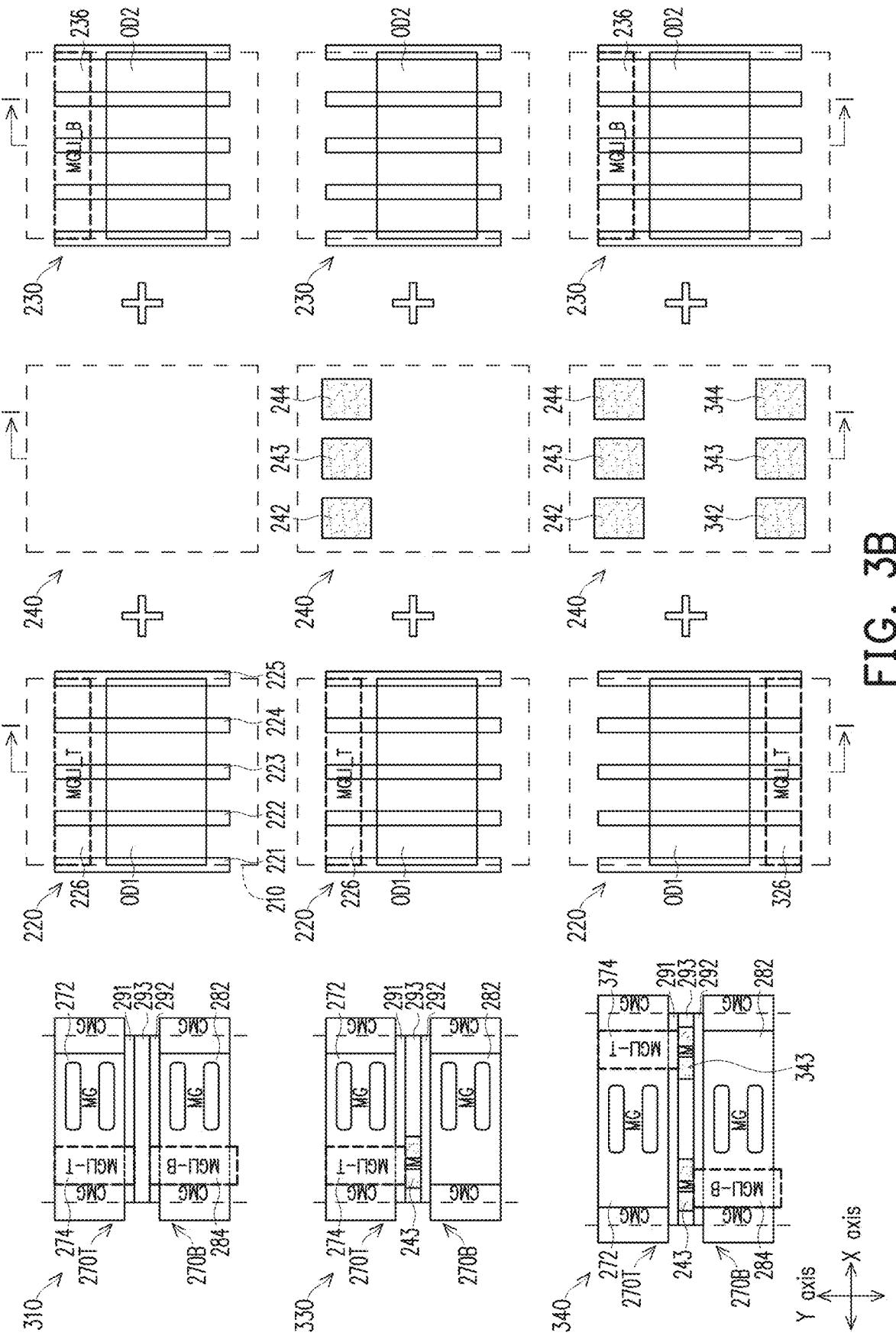
FIGS. 3B-3C include schematic cross-sectional views of various CFET devices, and schematic views of corresponding layout diagrams at various layers, in accordance with some embodiments.

FIG. 3B includes schematic cross-sectional views of the CFET devices 310, 330, 340, and schematic views of corresponding layout diagrams at various layers, in accordance with some embodiments. In the layout diagrams, various features are omitted for simplicity. For example, MDLIs and corresponding interlayer metal structures are omitted. The CFET devices 310, 330, 340 correspond to cross-sectional views taken along lines I-I in layers 220-240 of the corresponding layout diagrams.

In the layout diagram for the CFET device 310, the top layer 220 and bottom layer 230 are correspondingly similar to the top layer 220 and bottom layer 230 in FIG. 2A. However, the middle layer 240 comprises no interlayer metal structure, corresponding to the MGLI-T 274 and MGLI-B 284 in the CFET device 310 being not electrically coupled to an interlayer metal structure.

In the layout diagram for the CFET device 330, the top layer 220 and middle layer 240 are correspondingly similar to the top layer 220 and middle layer 240 in FIG. 2A. However, the bottom layer 230 does not comprise the MGLI-B region 236, corresponding to the MGLI-B 284 being absent in the CFET device 330.

In the layout diagram for the CFET device 340, the bottom layer 230 is similar to the bottom layer 230 in FIG. 2A. However, the top layer 220 includes, instead of the MGLI-T region 226 at one side (e.g., the upper side in FIG. 3B) of the active region OD1, an MGLI-T region 326 on the opposite side (e.g., the lower side in FIG. 3B) of the active region OD1. Further, the middle layer 240 additionally comprises interlayer metal structures 342, 343, 344 which are similar to the interlayer metal structures 242, 243, 244 and correspond to the MGLI-T region 326. This configuration corresponds to the MGLI-T 374 being electrically coupled to the interlayer metal structure 343 on one side (e.g., the right side) of the CFET device 380. The MGLI-B region 236 and interlayer metal structures 242, 243, 244 correspond to the MGLI-B 284 being electrically coupled to the interlayer metal structure 243 on the other side (e.g., the left side) of the CFET device 380.

Figure 3C:
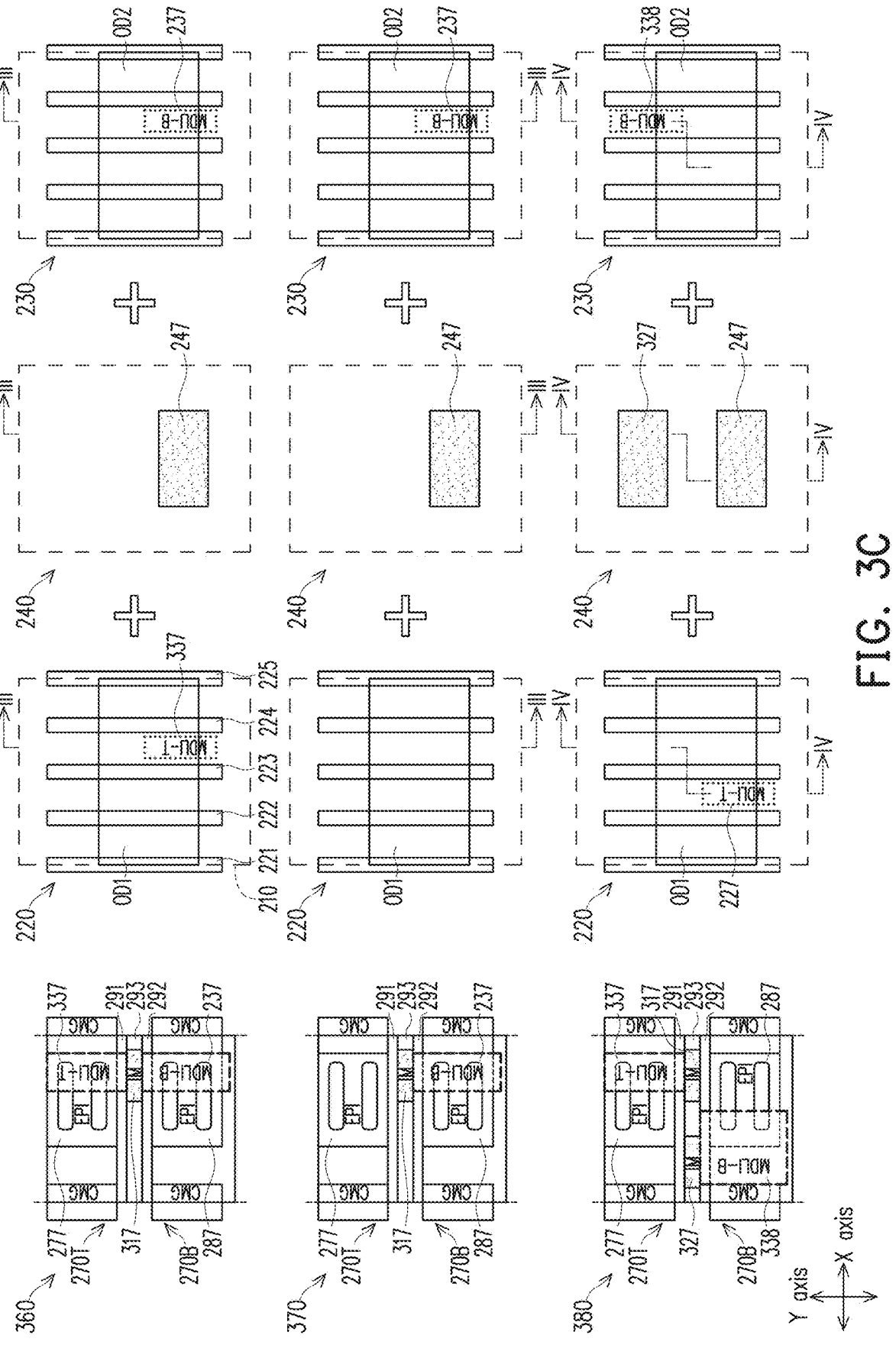

FIG. 3C includes schematic cross-sectional views of the CFET devices 360, 370, 380, and schematic views of corresponding layout diagrams at various layers, in accordance with some embodiments. In the layout diagrams, various features are omitted for simplicity. For example, MGLIs and corresponding interlayer metal structures are omitted. The CFET devices 360, 370 correspond to cross-sectional views taken along lines III-III in layers 220-240 of the corresponding layout diagrams. The CFET device 380 corresponds to a cross-sectional view taken along lines IV-IV in layers 220-240 of the corresponding layout diagram.

In the layout diagram for the CFET device 360, the bottom layer 230 and middle layer 240 are correspondingly similar to the bottom layer 230 and middle layer 240 in FIG. 2A. However, the top layer 220 comprises the MDLI-T 337 instead of the MDLI-T 227, corresponding to the MDLI-T 337 and MDLI-B 237 in the CFET device 360 being electrically coupled to each other by the interlayer metal structure 317 which corresponds to the interlayer metal structure 247 in the middle layer 240.

In the layout diagram for the CFET device 370, the bottom layer 230 and middle layer 240 are correspondingly similar to the bottom layer 230 and middle layer 240 in FIG. 2A. However, the top layer 220 includes no MDLI-T, corresponding to an MDLI-T being absent in the CFET device 370.

In the layout diagram for the CFET device 380, the top layer 220 is similar to the top layer 220 in FIG. 2A. However, the bottom layer 230 includes, instead of the MDLI-B 237 at one side (e.g., the lower side in FIG. 3C) of the active region OD2, the MDLI-B 338 on the opposite side (e.g., the upper side in FIG. 3C) of the active region OD2. Further, the middle layer 240 additionally comprises the interlayer metal structure 327 which is similar to the interlayer metal structure 247 and corresponds to the MDLI-B 338. This configuration corresponds to the MDLI-B 338 being electrically coupled to the interlayer metal structure 327 on one side (e.g., the left side) of the CFET device 380. The MDLI-T 227 and the interlayer metal structure 247 correspond to the MDLI-T 337 being electrically coupled to the interlayer metal structure 317 on the other side (e.g., the right side) of the CFET device 380.

Figure 4A:
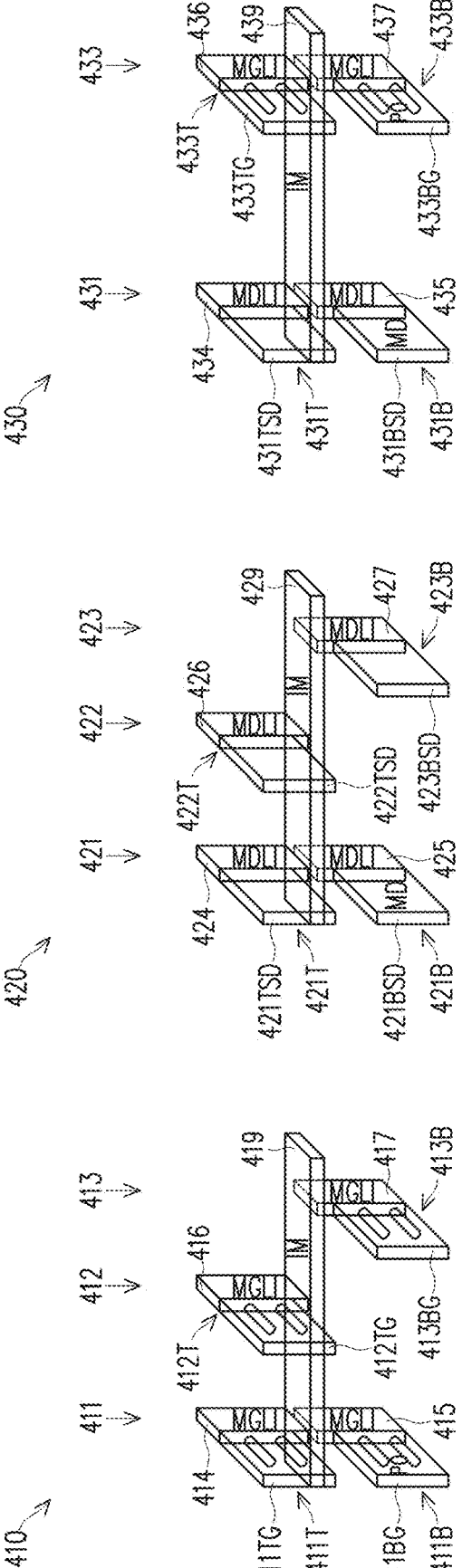
FIGS. 4A-4B include schematic perspective views of various configurations in which CFET devices are electrically coupled by interlayer metal structures, in accordance with some embodiments.
Figure 4B:
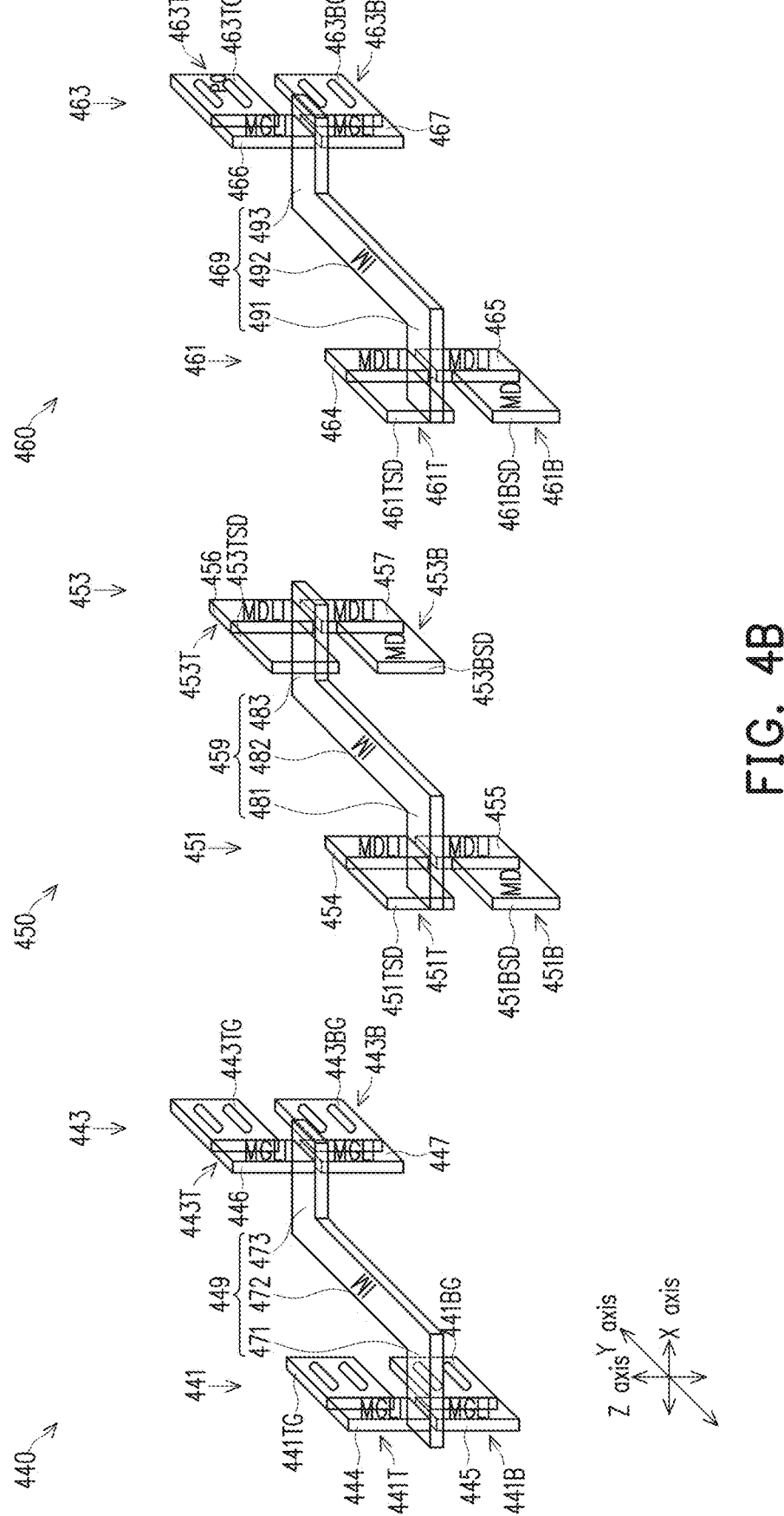

FIGS. 4A-4B include schematic perspective views of various configurations 410-460 in which CFET devices are electrically coupled by interlayer metal structures, in accordance with some embodiments. In some embodiments, one or more of the configurations 410-460 are included in the same IC device which corresponds to one or more IC devices as described herein. In some embodiments, one or more CFET devices and/or interlayer metal structures in one or more of the configurations 410-460 correspond to one or more of CFET devices and/or interlayer metal structures described with respect to one or more of FIGS. 2A-2C, 3A-3C.

In FIG. 4A, the configuration 410 is an example of a gate-to-gate connection in which various gates in CFET devices 411, 412, 413 are electrically coupled by an interlayer metal structure 419. The CFET device 412 is adjacent to or spaced from the CFET device 411 along the X axis. The CFET device 413 is further adjacent to or spaced from the CFET device 412 along the X axis. The CFET device 411 comprises a top semiconductor device 411T and a bottom semiconductor device 411B, the CFET device 412 comprises a top semiconductor device 412T and a bottom semiconductor device (not shown), and the CFET device 413 comprises a top semiconductor device (not shown) and a bottom semiconductor device 413B. The top semiconductor device 411T comprises a gate 411TG, and an MGLI-T 414 over the gate 411TG. The bottom semiconductor device 411B comprises a gate 411BG, and an MGLI-B 415 over the gate 411BG. The top semiconductor device 412T comprises a gate 412TG, and an MGLI-T 416 over the gate 412TG. The bottom semiconductor device 413B comprises a gate 413BG, and an MGLI-B 417 over the gate 413BG. The interlayer metal structure 419 is arranged between, and electrically coupled to, the MGLI-T 414 and MGLI-B 415. The interlayer metal structure 419 is further under, and electrically coupled to, the MGLI-T 416. The interlayer metal structure 419 is further over, and electrically coupled to, the MGLI-B 417. In some embodiments, the connection of the MGLI-T 414, interlayer metal structure 419 and MGLI-B 415 corresponds to an MGLI_TB, the connection of the MGLI-T 416 and interlayer metal structure 419 corresponds to an MGLI_T, and the connection of the MGLI-B 417 and interlayer metal structure 419 corresponds to an MGLI_B.

The configuration 420 is an example of a source/drain-to-source/drain connection in which various source/drains in CFET devices 421, 422, 423 are electrically coupled by an interlayer metal structure 429. The CFET device 422 is adjacent to or spaced from the CFET device 421 along the X axis. The CFET device 423 is further adjacent to or spaced from the CFET device 422 along the X axis. The CFET device 421 comprises a top semiconductor device 421T and a bottom semiconductor device 421B, the CFET device 422 comprises a top semiconductor device 422T and a bottom semiconductor device (not shown), and the CFET device 423 comprises a top semiconductor device (not shown) and a bottom semiconductor device 423B. The top semiconductor device 421T comprises a source/drain 421TSD, and an MDLI-T 424 over the source/drain 421TSD. The bottom semiconductor device 421B comprises a source/drain 421BSD, and an MDLI-B 425 over the source/drain 421BSD. The top semiconductor device 422T comprises a source/drain 422TSD, and an MDLI-T 426 over the source/drain 422TSD. The bottom semiconductor device 423B comprises a source/drain 423BSD, and an MDLI-B 427 over the source/drain 423BSD. The interlayer metal structure 429 is arranged between, and electrically coupled to, the MDLI-T 424 and MDLI-B 425. The interlayer metal structure 429 is further under, and electrically coupled to, the MDLI-T 426. The interlayer metal structure 429 is further over, and electrically coupled to, the MDLI-B 427. In some embodiments, the connection of the MDLI-T 424, interlayer metal structure 429 and MDLI-B 425 corresponds to an MDLI_TB, the connection of the MDLI-T 426 and interlayer metal structure 429 corresponds to an MDLI_T, and the connection of the MDLI-B 427 and interlayer metal structure 429 corresponds to an MDLI_B.

The configuration 430 is an example of a source/drain-to-gate connection in which at least one source/drain in a CFET device 431 is electrically coupled by an interlayer metal structure 439 to at least one gate in a CFET device 433. The CFET device 433 is adjacent to or spaced from the CFET device 431 along the X axis. The CFET device 431 comprises a top semiconductor device 431T and a bottom semiconductor device 431B, the CFET device 433 comprises a top semiconductor device 433T and a bottom semiconductor device 433B. The top semiconductor device 431T comprises a source/drain 431TSD, and an MDLI-T 434 over the source/drain 431TSD. The bottom semiconductor device 431B comprises a source/drain 431BSD, and an MDLI-B 435 over the source/drain 431BSD. The top semiconductor device 433T comprises a gate 433TG, and an MGLI-T 436 over the gate 433TG. The bottom semiconductor device 433B comprises a gate 433BG, and an MGLI-B 437 over the gate 433BG. The interlayer metal structure 439 is arranged between, and electrically coupled to, the MDLI-T 434 and MDLI-B 435. The interlayer metal structure 439 is further arranged between, and electrically coupled to, the MGLI-T 436 and MGLI-B 437. In some embodiments, at least one of the MDLI-T 434 or MDLI-B 435 is omitted and/or at least one of the MGLI-T 436 or MGLI-B 437 is omitted.

The interlayer metal structures 419, 429, 439 in the corresponding configurations 410, 420, 430 in FIG. 4A are examples of one-dimensional (1D) interlayer metal structures which extend linearly, or are elongated, along a single direction, e.g., the X axis. In some embodiments, examples of two-dimensional (2D) interlayer metal structures, which include sections elongated along multiple directions, are provided, e.g., as described with respect to configurations 440-460 in FIG. 4B.

In FIG. 4B, the configuration 440 is an example of a 2D gate-to-gate connection in which at least one gate in a CFET device 441 is electrically coupled by a 2D interlayer metal structure 449 to at least one gate in a CFET device 443. The CFET device 443 is adjacent to or spaced from the CFET device 441 not only along the X axis, but also along the Y axis. The CFET device 441 comprises a top semiconductor device 441T and a bottom semiconductor device 441B, the CFET device 443 comprises a top semiconductor device 443T and a bottom semiconductor device 443B. The top semiconductor device 441T comprises a gate 441TG, and an MGLI-T 444 over the gate 441TG. The bottom semiconductor device 441B comprises a gate 441BG, and an MGLI-B 445 over the gate 441BG. The top semiconductor device 443T comprises a gate 443TG, and an MGLI-T 446 over the gate 443TG. The bottom semiconductor device 443B comprises a gate 443BG, and an MGLI-B 447 over the gate 443BG. The interlayer metal structure 449 comprises a section 471 arranged between, and electrically coupled to, the MGLI-T 444 and MGLI-B 445. The interlayer metal structure 449 further comprises a section 473 arranged between, and electrically coupled to, the MGLI-T 446 and MGLI-B 447. The interlayer metal structure 449 further comprises a section 472 contiguous to and connecting the sections 471 and 473. In the example configuration in FIG. 4B, the section 472 is elongated along the Y axis, and has opposite ends from which the sections 471 and 473 correspondingly project along the X axis. In some embodiments, at least one of the MGLI-T 444 or MGLI-B 445 is omitted and/or at least one of the MGLI-T 446 or MGLI-B 447 is omitted.

The configuration 450 is an example of a 2D source/drain-to-source/drain connection in which at least one source/drain in a CFET device 451 is electrically coupled by a 2D interlayer metal structure 459 to at least one source/drain in a CFET device 453. The CFET device 453 is adjacent to or spaced from the CFET device 451 not only along the X axis, but also along the Y axis. The CFET device 451 comprises a top semiconductor device 451T and a bottom semiconductor device 451B, the CFET device 453 comprises a top semiconductor device 453T and a bottom semiconductor device 453B. The top semiconductor device 451T comprises a source/drain 451TSD, and an MDLI-T 454 over the source/drain 451TSD. The bottom semiconductor device 451B comprises a source/drain 451BSD, and an MDLI-B 455 over the source/drain 451BSD. The top semiconductor device 453T comprises a source/drain 453TSD, and an MDLI-T 456 over the source/drain 453TSD. The bottom semiconductor device 453B comprises a source/drain 453BSD, and an MDLI-B 457 over the source/drain 453BSD. The interlayer metal structure 459 comprises a section 481 arranged between, and electrically coupled to, the MDLI-T 454 and MDLI-B 455. The interlayer metal structure 459 further comprises a section 483 arranged between, and electrically coupled to, the MDLI-T 456 and MDLI-B 457. The interlayer metal structure 459 further comprises a section 482 contiguous to and connecting the sections 481 and 483. In the example configuration in FIG. 4B, the section 482 is elongated along the Y axis, and has opposite ends from which the sections 481 and 483 correspondingly project along the X axis. In some embodiments, at least one of the MDLI-T 454 or MDLI-B 455 is omitted and/or at least one of the MDLI-T 456 or MDLI-B 457 is omitted.

The configuration 460 is an example of a 2D source/drain-to-gate connection in which at least one source/drain in a CFET device 461 is electrically coupled by a 2D interlayer metal structure 469 to at least one gate in a CFET device 463. The CFET device 463 is adjacent to or spaced from the CFET device 461 not only along the X axis, but also along the Y axis. The CFET device 461 comprises a top semiconductor device 461T and a bottom semiconductor device 461B, the CFET device 463 comprises a top semiconductor device 463T and a bottom semiconductor device 463B. The top semiconductor device 461T comprises a source/drain 461TSD, and an MDLI-T 464 over the source/drain 461TSD. The bottom semiconductor device 461B comprises a source/drain 461BSD, and an MDLI-B 465 over the source/drain 461BSD. The top semiconductor device 463T comprises a gate 463TG, and an MGLI-T 466 over the gate 463TG. The bottom semiconductor device 463B comprises a gate 463BG, and an MGLI-B 467 over the gate 463BG. The interlayer metal structure 469 comprises a section 491 arranged between, and electrically coupled to, the MDLI-T 464 and MDLI-B 465. The interlayer metal structure 469 further comprises a section 493 arranged between, and electrically coupled to, the MGLI-T 466 and MGLI-B 467. The interlayer metal structure 469 further comprises a section 492 contiguous to and connecting the sections 491 and 493. In the example configuration in FIG. 4B, the section 492 is elongated along the Y axis, and has opposite ends from which the sections 491 and 493 correspondingly project along the X axis. In some embodiments, at least one of the MDLI-T 464 or MDLI-B 465 is omitted and/or at least one of the MGLI-T 466 or MGLI-B 467 is omitted. The Z-shape of the interlayer metal structures 449, 459, 469 in FIG. 4 is an example. Other 2D shapes, such as C-shape, L-shape, U-shape, or the like, are within the scopes of various embodiments.

Figure 5A:
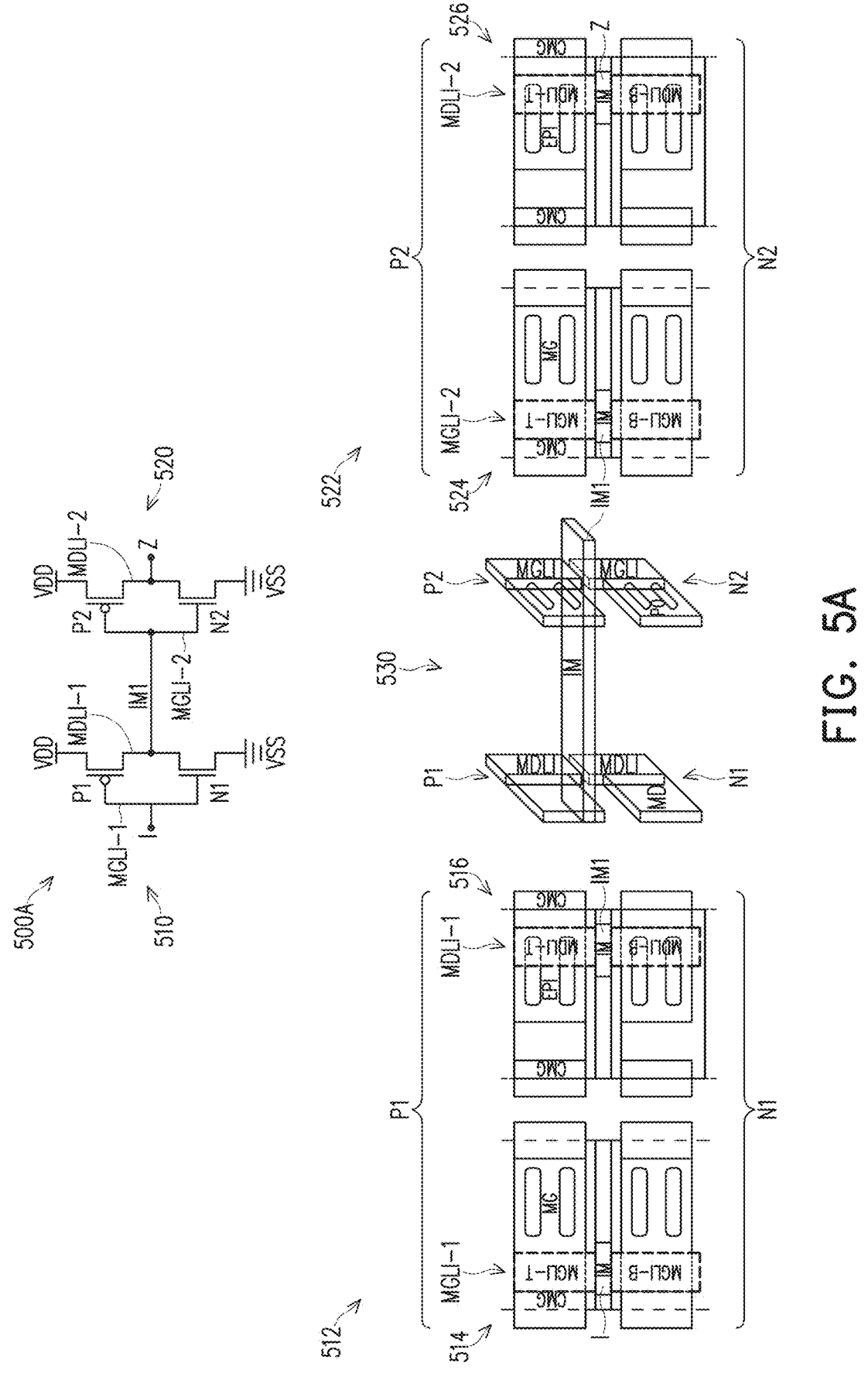
FIGS. 5A-5B include schematic circuit diagrams of various circuits, and schematic cross-sectional and perspective views of corresponding CFET devices and interlayer metal structures, in accordance with some embodiments.

FIG. 5A includes a schematic circuit diagram of a circuit 500A, and schematic cross-sectional and perspective views of corresponding CFET devices and interlayer metal structure of an IC device comprising the circuit 500A, in accordance with some embodiments.

The circuit 500A is an example of a multistage circuit or multistage cell. The circuit 500A comprises a first inverter 510 configuring a first stage, and a second inverter 520 configuring a second stage. The first inverter 510 and the second inverter 520 are coupled in series between an input I and an output Z. The first inverter 510 comprises a P-type transistor P1 and an N-type transistor N1. The second inverter 520 comprises a P-type transistor P2 and an N-type transistor N2. Gates of the transistor P1 and transistor N1 are coupled to the input I. A first source/drain of each of the transistors P1, P2 is coupled to a node of a power supply voltage VDD. A first source/drain of each of the transistors N1, N2 is coupled to a node of a reference voltage VSS, e.g., the ground voltage. Second source/drains of the transistor P1 and transistor N1 are coupled to gates of the transistor P2 and transistor N2. Second source/drains of the transistor P2 and transistor N2 are coupled to the output Z.

In the example configuration in FIG. 5A, an IC device comprises CFET devices 512, 522 to realize the circuit 500A. In the CFET device 512, the transistor P1 is the top semiconductor device and the transistor N1 is the bottom semiconductor device. FIG. 5A includes a cross-sectional view 514 taken along gates of the transistors P1, N1, and a cross-sectional view 516 taken along second source/drains of the transistors P1, N1. The cross-sectional view 514 shows a structure which is similar to the CFET device 320, and in which the gates of the transistors P1, N1 are electrically coupled together by a connection MGLI-1 comprising an MGLI-T over the gate of the transistor P1, an MGLI-B over the gate of the transistor N1, and an interlayer metal structure corresponding to the input I. The cross-sectional view 516 shows a structure which is similar to the CFET device 360, and in which the second source/drains of the transistors P1, N1 are electrically coupled together by a connection MDLI-1 comprising an MDLI-T over the second source/drain of the transistor P1, an MDLI-B over the second source/drain of the transistor N1, and an interlayer metal structure IM1.

In the CFET device 522, the transistor P2 is the top semiconductor device and the transistor N2 is the bottom semiconductor device. FIG. 5A includes a cross-sectional view 524 taken along gates of the transistors P2, N2, and a cross-sectional view 526 taken along second source/drains of the transistors P2, N2. The cross-sectional view 524 shows a structure which is similar to the CFET device 320, and in which the gates of the transistors P2, N2 are electrically coupled together by a connection MGLI-2 comprising an MGLI-T over the gate of the transistor P2, an MGLI-B over the gate of the transistor N2, and the interlayer metal structure IM1. The cross-sectional view 526 shows a structure which is similar to the CFET device 360, and in which the second source/drains of the transistors P2, N2 are electrically coupled together by a connection MDLI-2 comprising an MDLI-T over the second source/drain of the transistor P2, an MDLI-B over the second source/drain of the transistor N2, and an interlayer metal structure corresponding to the output Z. The connections MGLI-1, MGLI-2, MDLI-1, MDLI-2 and interlayer metal structure IM1 are also indicated in the circuit diagram of the circuit 500A. FIG. 5A further includes a cross-sectional view 530 which is similar to the configuration 430 and shows that the interlayer metal structure IM1 configures a source/drain-to-gate connection between the second source/drains of the transistors P1, N1 and the gates of the transistors P2, N2.

Figure 5B:
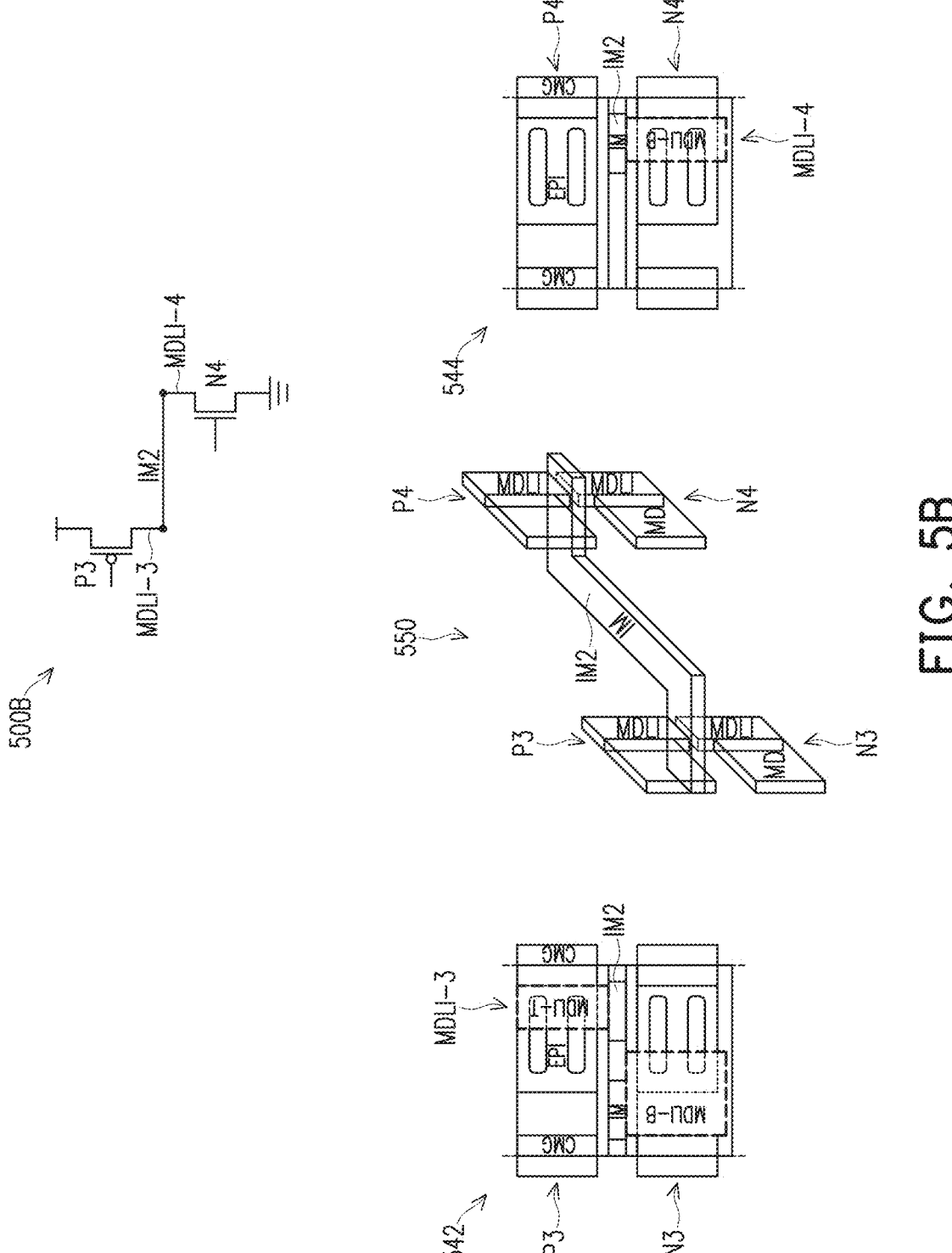

FIG. 5B includes a schematic circuit diagram of a circuit 500B, and schematic cross-sectional and perspective views of corresponding CFET devices and interlayer metal structure of an IC device comprising the circuit 500B, in accordance with some embodiments.

The circuit 500B is an example of an N-type-to-P-type diagonal interconnect. The circuit 500B comprises a P-type transistor P3 and an N-type transistor N4. A source/drain of the transistor P3 is coupled to a source/drain of the transistor N4.

In the example configuration in FIG. 5B, an IC device comprises CFET devices 542, 544 to realize the circuit 500B. In the CFET device 542, the transistor P3 is the top semiconductor device over a transistor N3 being the bottom semiconductor device. FIG. 5B includes a cross-sectional view of the CFET device 542 which is similar to the CFET device 380. The CFET device 542 comprises a connection MDLI-3 in which an MDLI-T over the source/drain of the transistor P3 is electrically coupled with an interlayer metal structure IM2. In the CFET device 544, the transistor N4 is the bottom semiconductor device under a transistor P4 being the top semiconductor device. FIG. 5B includes a cross-sectional view of the CFET device 544 which is similar to the CFET device 370. The CFET device 544 comprises a connection MDLI-4 in which an MDLI-B over the source/drain of the transistor N4 is electrically coupled with the interlayer metal structure IM2. The connections MDLI-3, MDLI-4 and interlayer metal structure IM2 are also indicated in the circuit diagram of the circuit 500B. FIG. 5B further includes a cross-sectional view 550 which is similar to the configuration 450 and shows that the interlayer metal structure IM2 configures a source/drain-to-source/drain connection between the transistor P3 and transistor N4.

As described herein, CFET devices advantageously permit size reduction of IC devices. However, in designing/forming an electrical connection between a top semiconductor device and a bottom semiconductor device in an IC device having CFET devices, there are concerns and/or considerations such as parasitic resistance and capacitance (R/C), reduced active region widths (or OD widths), or the like. In some embodiments, one or more such concerns and/or considerations are addressed by configuring one or more interlayer metal structures between an upper layer of top semiconductor devices and a lower layer of bottom semiconductor devices in an IC device having CFET devices, and using the one or more interlayer metal structures to form one or more electrical connections between the semiconductor devices of the IC device.

In some other approaches, an electrical connection between a top semiconductor device and a bottom semiconductor device, herein referred to as a top-device-to-bottom-device connection, includes a deep via (DV), and/or one or more conductive patterns in one or more metal layers such as M0, M1, BM0, BM1, and/or one or more vias between the metal layers. A DV is a via that extends from an upper side of the top semiconductor device to the underlying bottom semiconductor device, and has a depth of at least the height of the top semiconductor device in the thickness direction of the IC device. Top-device-to-bottom-device connections in accordance with the other approaches are long and/or complex, with large R/C which potentially affects timing and circuit performance of the IC device. In contrast, because features such as DVs, M0, M1, BM0, BM1 conductive patterns and/or vias are not required, in one or more embodiments, to configure an electrical connection between semiconductor devices using an interlayer metal structure, routing operations in accordance with some embodiments are simplified, routing resources are saved, the length and/or R/C of electrical connections are reduced which, in turn, improves timing and circuit performance.

In the other approaches, the ability to provide top-device-to-bottom-device connections using corresponding two DVs on opposite sides of an active region is limited, due to the clearances required by the two DVs. Such clearances often lead to a small or reduced OD width. In contrast, because DVs are not required, in one or more embodiments, to configure electrical connections on opposite sides of the active region, limitations on OD widths are avoidable in one or more embodiments. With larges OD widths, shorter electrical connections having lower R/C, some embodiments using interlayer metal structures for interconnects among semiconductor devices are advantageous over the other approaches in one or more aspects including, but not limited to, routing efficiency, power, performance and/or area (PPA), simplified manufacturing processes, or the like.

In some embodiments, routing flexibility is achieved by forming electrical connections using one or more interlayer metal structures. In at least one embodiment, it is possible to individually couple any of a gate or a source/drain of a top semiconductor device with any of a gate or source/drain of a bottom semiconductor device. In one or more embodiments, electrical connections using interlayer metal structures are configurable not only between the top and bottom semiconductor devices of the same CFET device, but also among two or more CFET devices. In at least one embodiment, an interlayer metal structure is configured for signal connection in a cell. In some embodiments, an interlayer metal structure is implemented as a 1D or 2D conductive feature. In one or more embodiments, a cell comprises interlayer metal structures arranged in multiple IM tracks. In at least one embodiment, it is possible to arrange MGLIs and/or MDLIs at opposite sides of an active region. For example, it is possible to arrange MDLIs at opposite sides of an active region, whereas MGLIs are arranged at one of the opposite sides of the active region.

In some embodiments, an interlayer metal structure is embedded in a multilayer structure between the upper layer of top semiconductor devices and the lower layer of bottom semiconductor devices. In some embodiments, the multilayer structure comprises multiple dielectric layers of different dielectric materials. Such a multilayer structure is a difference from other approaches which include a single layer of a bonding material, and/or lack an interlayer metal structure, between the upper layer and the lower layer.

Several examples of specific circuits or cells comprising one or more CFET devices and/or interlayer metal structures as described with respect to one or more of FIGS. 2A-2C, 3A-3C, 4A-4B, 5A-5B will now be described with respect to one or more of FIGS. 6A-6B, 7, 8A-8B, 9A-9B.

Figure 6B:
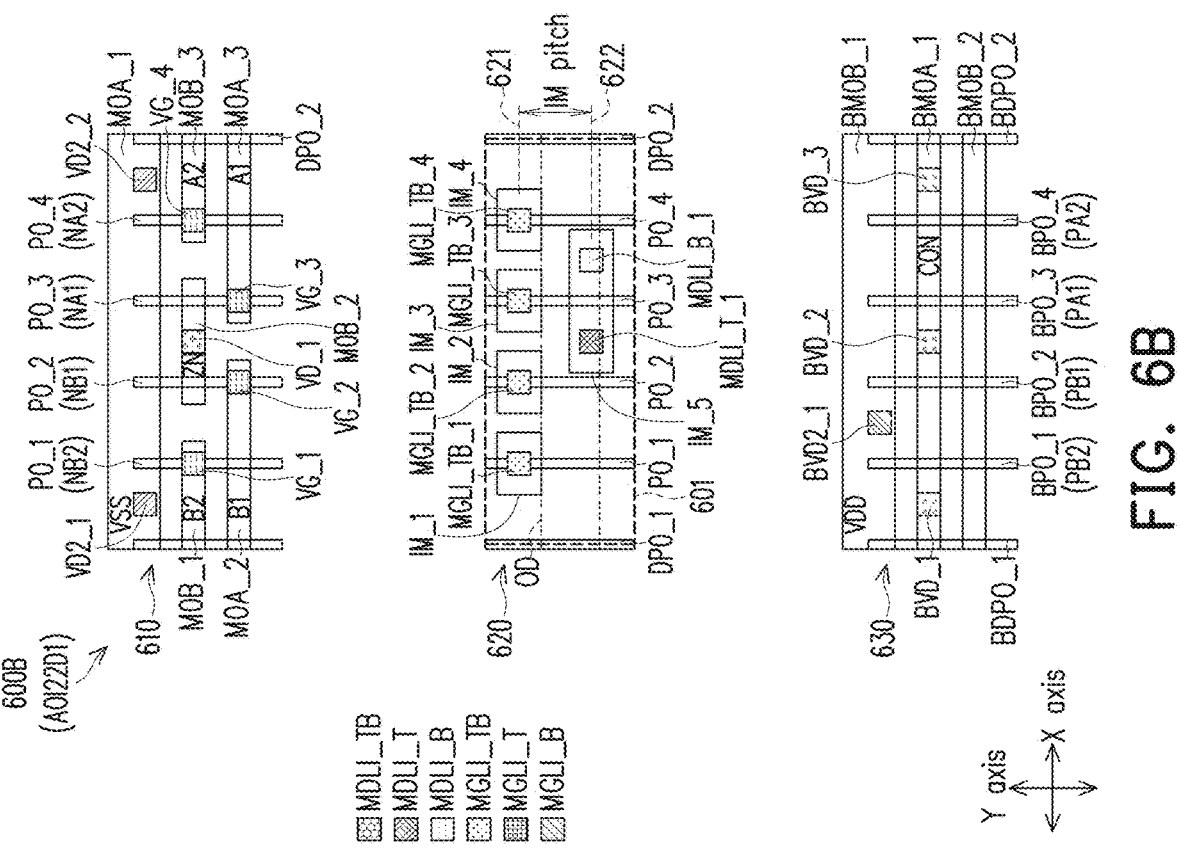
FIG. 6A is a schematic circuit diagram of a circuit of an IC device, in accordance with some embodiments, and FIG.
Figure 6A:
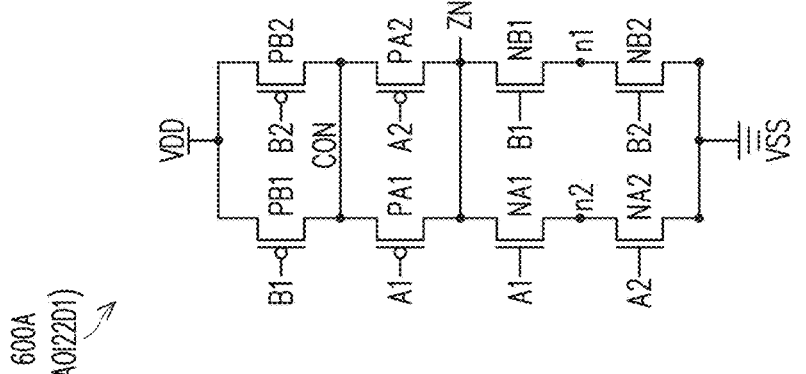

FIG. 6A is a schematic circuit diagram of a circuit 600A of an IC device, in accordance with some embodiments. In at least one embodiment, the circuit 600A corresponds to a portion of the region 104 in FIG. 1. In the example configuration in FIG. 6A, the circuit 600A comprises an AND-OR-Invert (AOI) logic corresponding to a standard cell sometimes referred to as an AOI22D1 cell.

The circuit 600A comprises inputs A1, A2, B1, B2, an output ZN, and a plurality of transistors PA1, PA2, PB1, PB2, NA1, NA2, NB1, NB2 electrically coupled together to perform, in operation, a predetermined function of the circuit 600A. In the example configuration in FIG. 6A, the circuit 600A comprises PMOS transistors PA1, PA2, PB1, PB2 and NMOS transistors NA1, NA2, NB1, NB2.

Gates of the transistors PA1, NA1 are electrically coupled to the input A1. Gates of the transistors PA2, NA2 are electrically coupled to the input A2. Gates of the transistors PB1, NB1 are electrically coupled to the input B1. Gates of the transistors PB2, NB2 are electrically coupled to the input B2.

Sources of the transistors PB1, PB2 are electrically coupled to a first node (or rail) of a first power supply voltage. The first node (or rail) and the first power supply voltage are commonly referred to herein as VDD. Drains of the transistors PB1, PB2 are electrically coupled to a node CON. As a result, the transistors PB1, PB2 are electrically coupled in parallel between VDD and the node CON. Sources of the transistors PA1, PA2 are electrically coupled to the node CON. Drains of the transistors PA1, PA2 are electrically coupled to the output ZN. As a result, the transistors PA1, PA2 are electrically coupled in parallel between the node CON and the output ZN. The parallel coupled transistors PB1, PB2 and the parallel coupled transistors PA1, PA2 are electrically coupled in series at the node CON.

Sources of the transistors NA2, NB2 are electrically coupled to a second node (or rail) of a second power supply voltage. The second node (or rail) and the second power supply voltage are commonly referred to herein as VSS (or ground). A drain of the transistor NA2 is electrically coupled to a source of the transistor NA1 at a node n2. As a result, the transistors NA1, NA2 are electrically coupled in series.

A drain of the transistor NB2 is electrically coupled to a source of the transistor NB1 at a node n1. As a result, the transistors NB1, NB2 are electrically coupled in series. Drains of the transistors NA1, NB1 are electrically coupled to the output ZN. As a result, the serially coupled transistors NA1, NA2 and the serially coupled transistors NB1, NB2 are coupled in parallel between the output ZN and VSS.

FIG. 6B includes schematic views at various layers of a layout diagram 600B of the circuit 600A in an IC device, in accordance with some embodiments. In some embodiments, the layout diagram 600B is a layout diagram of an AOI22D1 cell comprising CFET devices.

The layout diagram 600B comprises a top layer 610, a middle layer 620, and a bottom layer 630 corresponding to the top layer 220, middle layer 240, bottom layer 230. The top layer 610 comprises top semiconductor devices which are NMOSs. The bottom layer 630 comprises bottom semiconductor devices which are PMOSs. In at least one embodiment, the top semiconductor devices are PMOSs and the bottom semiconductor devices are NMOSs. For simplicity, MD contacts are omitted, and active regions of the top layer 610 and bottom layer 630 are commonly illustrated as an active region OD in the middle layer 620.

The top layer 610 comprises gate regions PO_1 to PO_4, dummy gate regions DPO_1, DPO_2, VG vias VG_1 to VG_4 correspondingly over the gate regions PO_1 to PO_4, signal VD via VD_1, power VD vias VD2_1, VD2_2, a first set of M0 conductive patterns M0A_1 to M0A_3, and a second set of M0 conductive patterns M0B_1 to M0B_3. The first set of M0 conductive patterns, i.e., M0A conductive patterns, belong to one mask, whereas the second set of M0 conductive patterns, i.e., M0B conductive patterns, belong to another mask. The M0A conductive patterns and M0B conductive patterns are arranged alternatingly along the Y axis.

The top layer 610 comprises NMOSs NB2, NB1, NA1, NA2 having the corresponding gate regions PO_1 to PO_4. Inputs B2, B1, A1, A2 correspond to M0 conductive patterns M0B_1, M0A_2, M0A_3, M0B_3, which are electrically coupled by corresponding VG vias VG_1 to VG_4 to corresponding gate regions PO_1 to PO_4. Output ZN corresponds to M0 conductive pattern M0B_2 which is electrically coupled by VD via VD_1 to a common source/drain of NMOSs NA1, NB1. A source/drain of each of NMOSs NB2, NA2 is electrically coupled by a corresponding power VD via VD2_1, VD2_2 to M0 conductive pattern M0A_1 which is a VSS power rail.

The bottom layer 630 comprises gate regions BPO_1 to BPO_4, dummy gate regions BDPO_1, BDPO_2, signal BVD vias BVD_1, BVD_2, BVD_3, power BVD via BVD2_1, a first set of BM0 conductive patterns having a BM0 conductive pattern BM0A_1, and a second set of BM0 conductive patterns BM0B_1, BM0B_2. The first set of BM0 conductive patterns, i.e., BM0A conductive patterns, belong to one mask, whereas the second set of BM0 conductive patterns, i.e., BM0B conductive patterns, belong to another mask. The BM0A conductive patterns and BM0B conductive patterns are arranged alternatingly along the Y axis.

The bottom layer 630 comprises PMOSs PB2, PB1, PA1, PA2 having the corresponding gate regions BPO_1 to BPO_4. The node CON corresponds to BM0 conductive pattern BM0A_1 which is electrically coupled by corresponding signal BVD vias BVD_1, BVD_2, BVD_3 to corresponding source/drains of PMOSs PB2, PB1, PA1, PA2. A common source/drain of PMOSs PB2, PB1 is electrically coupled by power BVD via BVD2_1 to BM0 conductive pattern BM0B_1 which is a VDD power rail. As illustrated in FIG. 6B, a power rail, e.g., a VDD power rail or a VSS power rail, is implemented by a M0 conductive pattern which is wider (along the Y axis) than other, non-power-rail M0 conductive patterns.

In the middle layer 620, for convenience of explanation and/or illustrative purposes, gate regions PO_1 to PO_4 and dummy gate regions DPO_1, DPO_2 (which correspondingly coincide with gate regions BPO_1 to BPO_4 and dummy gate regions BDPO_1, BDPO_2) are illustrated. For similar reasons, a single active region OD is illustrated in the middle layer 620, instead of separate NMOS and PMOS active regions in the top layer 610 and bottom layer 630.

The middle layer 620 comprises interlayer metal structures IM_1 to IM_5, structures MGLI_TB_1 to MGLI_TB_4, a structure MDLI_T_1, and a structure MDLI_B_1. The interlayer metal structures IM_1 to IM_4 are correspondingly over gate regions PO_1 to PO_4, and structures MGLI_TB_1 to MGLI_TB_4 are correspondingly over the interlayer metal structures IM_1 to IM_4. The interlayer metal structure IM_1 and structure MGLI_TB_1 electrically couple gate regions PO_1 and BPO_1, the interlayer metal structure IM_2 and structure MGLI_TB_2 electrically couple gate regions PO_2 and BPO_2, the interlayer metal structure IM_3 and structure MGLI_TB_3 electrically couple gate regions PO_3 and BPO_3, and the interlayer metal structure IM_4 and structure MGLI_TB_4 electrically couple gate regions PO_4 and BPO_4.

The common source/drain of NMOSs NA1, NB1 (which corresponds to the output ZN) is electrically coupled to the structure MDLI_T_1, which is then electrically coupled to the interlayer metal structure IM_5, which is then electrically coupled to the structure MDLI_B_1, which is then electrically coupled to a common source/drain of PMOSs PA1, PA2. As a result, the common source/drain of PMOSs PA1, PA2 is electrically coupled to the output ZN. The interlayer metal structure IM_5 crosses over from one side of the gate region PO_3 to the other side of the gate region PO_3 along the X axis.

The layout diagram 600B has a boundary 601 which is the same for all of the top layer 610, middle layer 620, bottom layer 630, and is illustrated in the middle layer 620. Two vertical sides (along the Y axis) of the boundary 601 coincide with centerlines of dummy gate regions DPO_1, DPO_2. Two horizontal sides (along the X axis) of the boundary 601 coincide correspondingly with the upper edges (in FIG. 6B) and lower edges (in FIG. 6B) of the gate regions PO_1 to PO_4 and dummy gate regions DPO_1, DPO_2. All interlayer metal structures of the middle layer 620 are within the boundary 601, and do not cross the boundary 601 to outside the cell. A cell width, along the X axis, of the layout diagram 600B is 5 CPPs.

The layout diagram 600B is an example of interlayer metal structures arranged at one side of an active region. For example, all MGLIs, i.e., MGLI_TB_1 to MGLI_TB_4, are on one side (i.e., the upper side in FIG. 6B) of the active region OD. Likewise, all MDLIs, i.e., MDLI_T_1 and MDLI_B_1, are on one side (i.e., the lower side in FIG. 6B) of the active region OD. The layout diagram 600B is further an example of 1D interlayer metal structures which are elongated along the X axis. The layout diagram 600B is further an example of arranging interlayer metal structures in several IM tracks along the X axis. For example, interlayer metal structures IM_1 to IM_4 are arranged along a first IM track 621, and the interlayer metal structure IM_5 is arranged along a second IM track 622. For simplicity, the IM tracks 621, 622 are illustrated as coinciding with the centerlines of the corresponding interlayer metal structures, e.g., the IM track 621 coincides with the centerline of the interlayer metal structures IM_1 to IM_4, and the IM track 622 coincides with the centerline of the interlayer metal structure IM_5. The IM tracks 621, 622 are elongated along the X axis. An IM pitch is the distance along the Y axis between the adjacent IM tracks 621, 622. Although the IM pitch is illustrated as a center-to-center distance, it also corresponds, in one or more embodiments, to an edge-to-edge distance. Example details related to the IM pitch in accordance with some embodiments are described with respect to one or more of FIGS. 10A-10B.

In some embodiments, by configuring electrical connections among devices of the circuit 600A through interlayer metal structures as in the layout diagram 600B, it is possible to save routing resources, e.g., M0, M1, BM0, BM1 conductive patterns and/or vias, which would be required in other approaches. In at least one embodiment, it is possible to provide a layout diagram for the AOI22D1 cell with a cell width of 5 CPPs, e.g., as shown in FIG. 6B. In some embodiments, this is a chip area improvement over other approaches which require a cell width of 6 CPPs or more for an AOI22D1 cell. In at least one embodiment, one or more advantages described herein are achievable by the layout diagram 600B, and/or an IC device corresponding to the layout diagram 600B.

FIG. 7 includes schematic circuit diagrams of various circuits 710, 720, 730 in one or more IC device, in accordance with some embodiments. In at least one embodiment, each of the circuits 710, 720, 730 corresponds to a portion of the region 104 in FIG. 1.

The circuit 710 comprises a multiplexer with two inputs 10, 11, a selection input S, and an output Z. In some embodiments, the circuit 710 corresponds to a standard cell sometimes referred to as a MUX2D1 cell. The circuit 720 comprises a XOR logic gate with two inputs A1, A2, and an output Z. In some embodiments, the circuit 720 corresponds to a standard cell sometimes referred to as a XOR2D1 cell. The circuit 730 comprises a scan D-flip-flop with a data input D, a scan-in input SI, a scan-enable input SE, a clock input CP, and an output Q. In some embodiments, the circuit 730 corresponds to a standard cell sometimes referred to as an SDFQD1 cell. The specific circuits or cells described with respect to one or more of FIGS. 6A and 7 are example. Other cells are within the scopes of various embodiments.

Figure 8A:
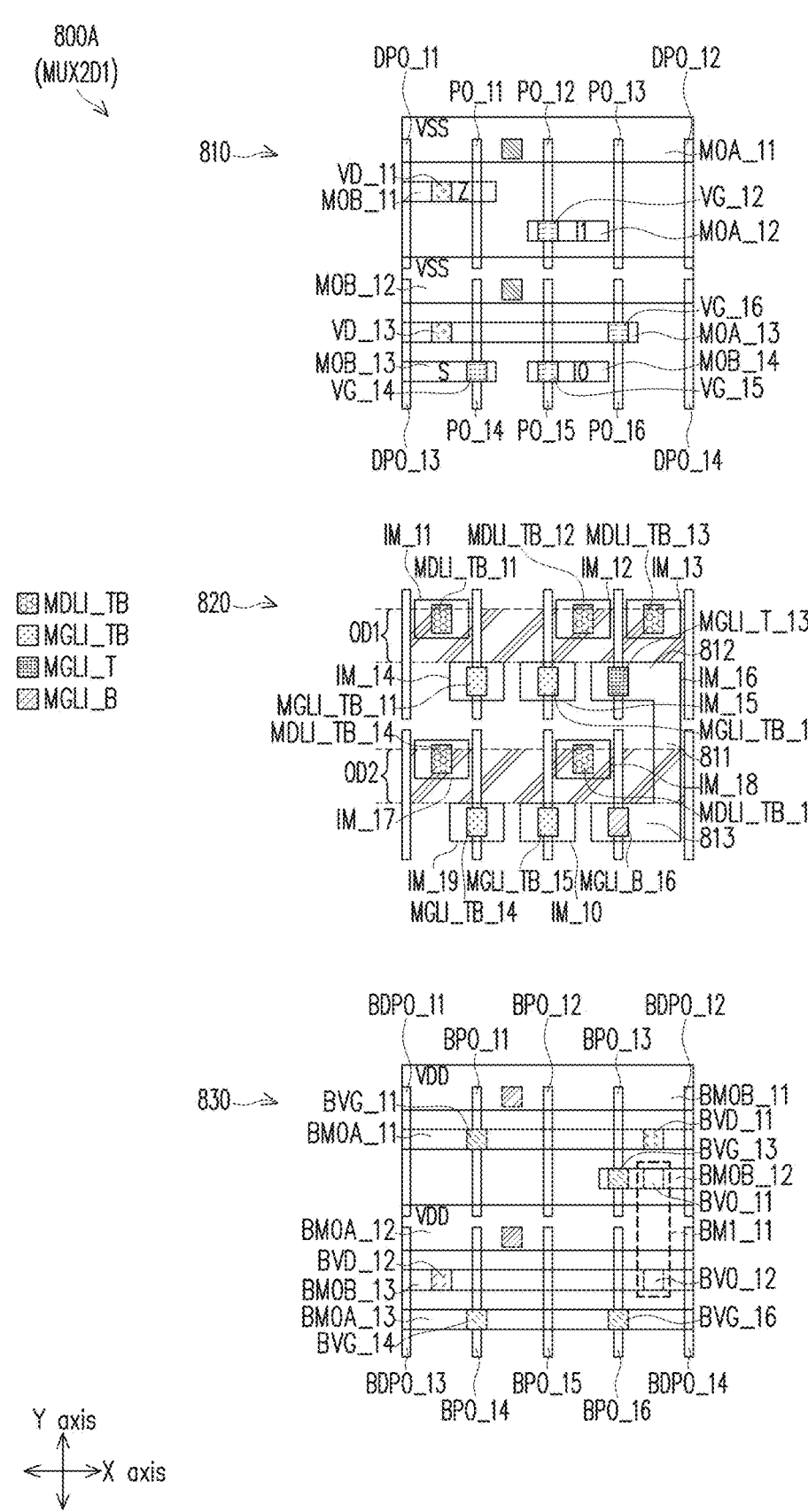

FIG. 8A includes schematic views at various layers of a layout diagram 800A of the circuit 710, in accordance with some embodiments. In some embodiments, the layout diagram 800A is a layout diagram of a MUX2D1 cell comprising CFET devices.

The layout diagram 800A comprises a top layer 810, a middle layer 820, and a bottom layer 830 corresponding to the top layer 220, middle layer 240, bottom layer 230, or to the top layer 610, middle layer 620, bottom layer 630. The top layer 810 comprises top semiconductor devices which are NMOSs. The bottom layer 830 comprises bottom semiconductor devices which are PMOSs. In at least one embodiment, the top semiconductor devices are PMOSs and the bottom semiconductor devices are NMOSs. For simplicity, MD contacts are omitted, active regions of the top layer 810 and bottom layer 830 are commonly illustrated as active regions OD1, OD2 in the middle layer 820, and a boundary configured similarly to the boundary 601 is omitted.

Compared to the layout diagram 600B, the layout diagram 800A comprises 2 active regions OD1, OD2 arranged with a spacing along the Y axis. The layout diagram 800A has a double cell height, in contrast to the layout diagram 600B which has a single cell height.

The top layer 810 comprises gate regions PO_11 to PO_16, dummy gate regions DPO_11 to DPO_14, VG vias VG_12, VG_14 to VG_16 correspondingly over the gate regions PO_12, PO_14 to PO_16, signal VD vias VD_11, VD_13, two VSS power VD vias (not numbered), a first set of M0 conductive patterns M0A_11 to M0A_13, and a second set of M0 conductive patterns M0B_11 to M0B_14. Inputs 10, 11, S and output Z correspond to M0 conductive patterns M0B_14, M0A_12, M0B_13, M0B_11. M0 conductive patterns M0A_11 and M0B_12 are VSS power rails.

The bottom layer 830 comprises gate regions BPO_11 to BPO_16, dummy gate regions BDPO_11 to BDPO_14, BVG vias BVG_11, BVG_13, BVG_14, BVG_16 correspondingly over the gate regions BPO_11, BPO_13, BPO_14, BPO_16, signal BVD vias BVD_11, BVD_12, two VDD power BVD vias (not numbered), a first set of BM0 conductive patterns BM0A_11 to BM0A_13, a second set of BM0 conductive patterns BM0B_11 to BM0B_13, BV0 vias BV0_11, BV0_12 correspondingly over and coupled to BM0 conductive patterns BM0B_12, BM0B_13, and a BM1 conductive pattern BM1_11 over and coupled to the BV0 vias BV0_11, BV0_12. BM0 conductive patterns BM0B_11 and BM0A_12 are VDD power rails.

The middle layer 820 comprises interlayer metal structures IM_10 to IM_19, structures MGLI_TB_11 to MGLI_TB_15, a structure MGLI_T_13, a structure MGLI_B_16, and structures MDLI_TB_11 to MDLI_TB_15. The interlayer metal structures IM_10 to IM_19 are arranged in four IM tracks each elongated along the X axis and spaced from an adjacent IM track along the Y axis. The interlayer metal structures IM_11, IM_12, IM_13 are arranged in a first IM track, the interlayer metal structures IM_14, IM_15, and the second section 812 of the interlayer metal structure IM_16 are arranged in a second IM track, the interlayer metal structures IM_17, IM_18, are arranged in a third IM track, and the interlayer metal structures IM_19, IM_10, and the third section 813 of the interlayer metal structure IM_16 are arranged in a fourth IM track. Connection using the structures MGLI_TB_11 to MGLI_TB_15 are similar to those described with respect to FIG. 6B. In an example connection using a structure MDLI_TB, the interlayer metal structure IM_11 and structure MDLI_TB_11 electrically couple a source/drain of an NMOS having a gate being the gate region PO_11 to a source/drain of a PMOS having a gate being the gate region BPO_11.

Compared to the layout diagram 600B where all interlayer metal structures are 1D, the layout diagram 800A comprises a 2D interlayer metal structure IM_16. The 2D interlayer metal structure IM_16 comprises a first section 811 elongated along the Y axis, and second and third sections 812, 813 correspondingly projecting from opposite ends of the first section 811 along the X axis. The 2D interlayer metal structure IM_16 has a U-shape, or C-shape, or bracket shape. The gate region PO_13 is electrically coupled via the structure MGLI_T_13 to the 2D interlayer metal structure IM_16 at the second section 812. The 2D interlayer metal structure IM_16 is further electrically coupled, at the third section 813, to the structure MGLI_B_16, and then to the gate region BPO_16. As a result, the gate region PO_13 is electrically coupled to the gate region BPO_16 by the 2D interlayer metal structure IM_16.

The 2D interlayer metal structure IM_16 is an example of a gate-to-gate connection. The layout diagram 800A is a further example of interlayer metal structures arranged at one side of an active region.

The layout diagram 800A comprises a BM1 conductive pattern and no M1 conductive pattern, which is an improvement in terms of routing resource usage over other approaches which require three BM1 conductive patterns and one M1 conductive pattern for a MUX2D1 cell. In at least one embodiment, one or more advantages described herein are achievable by the layout diagram 800A, and/or an IC device corresponding to the layout diagram 800A.

Figure 8B:
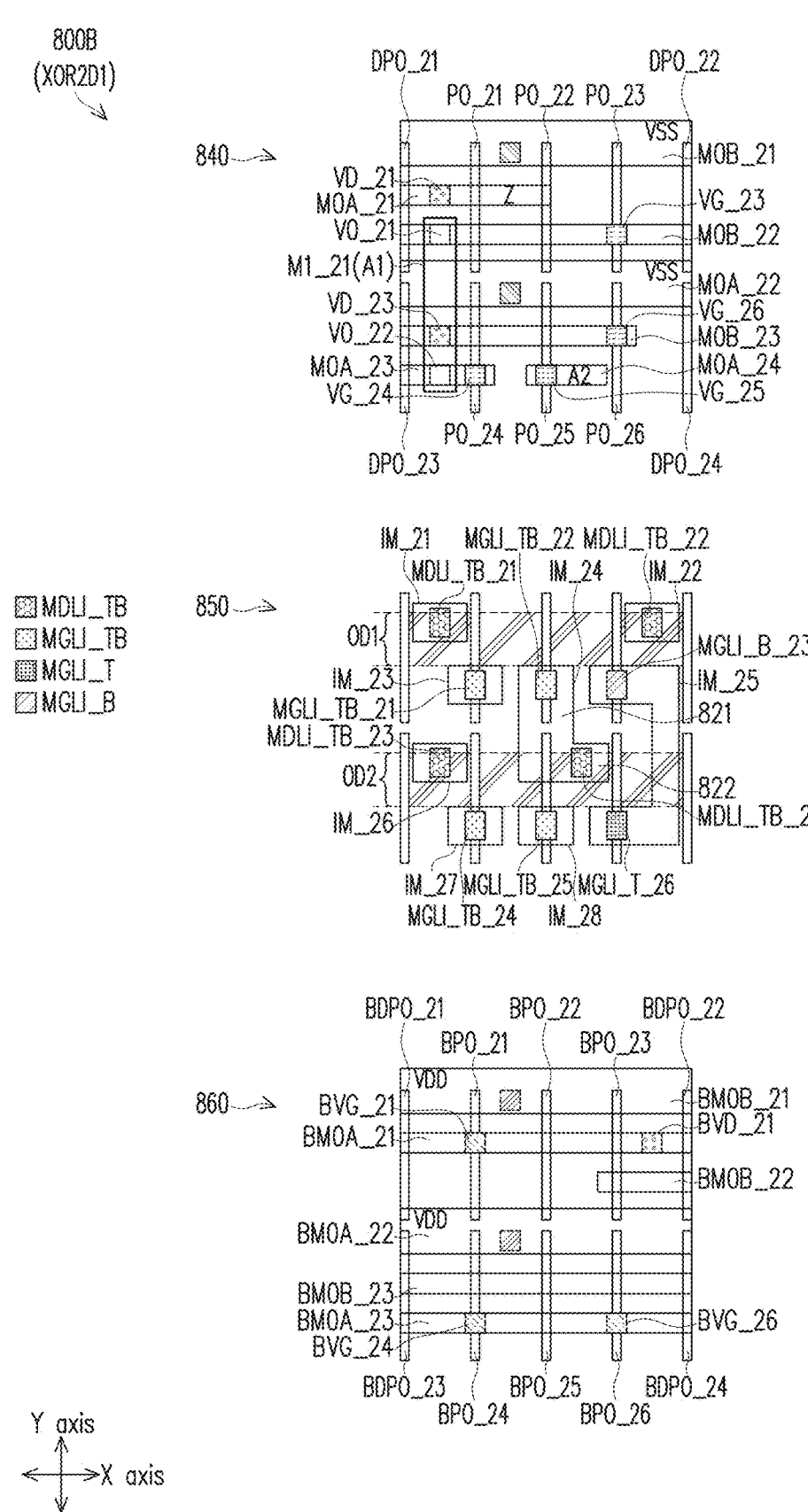

FIG. 8B includes schematic views at various layers of a layout diagram 800B of the circuit 720, in accordance with some embodiments. In some embodiments, the layout diagram 800B is a layout diagram of a XOR2D1 cell comprising CFET devices.

The layout diagram 800B comprises a top layer 840, a middle layer 850, and a bottom layer 860 corresponding to the top layer 220, middle layer 240, bottom layer 230, or to the top layer 810, middle layer 820, bottom layer 830. The top layer 840 comprises top semiconductor devices which are NMOSs. The bottom layer 860 comprises bottom semiconductor devices which are PMOSs. In at least one embodiment, the top semiconductor devices are PMOSs and the bottom semiconductor devices are NMOSs. For simplicity, MD contacts are omitted, active regions of the top layer 840 and bottom layer 860 are commonly illustrated as active regions OD1, OD2 in the middle layer 850, and a boundary configured similarly to the boundary 601 is omitted. The layout diagram 800B comprises 2 active regions OD1, OD2 arranged with a spacing along the Y axis, and has a double cell height.

The top layer 840 comprises gate regions PO_21 to PO_26, dummy gate regions DPO_21 to DPO_24, VG vias VG_23 to VG_26 correspondingly over the gate regions PO_23 to PO_26, signal VD vias VD_21, VD_23, two VSS power VD vias (not numbered), a first set of M0 conductive patterns M0A_21 to M0A_24, a second set of M0 conductive patterns M0B_21 to M0B_23, V0 vias V0_21, V0_22 correspondingly over and coupled to M0 conductive patterns M0B_22, M0A_23, and an M1 conductive pattern M1_21 over and coupled to the V0 vias V0_21, V0_22. Inputs A1, A2, and output Z correspond to M1 conductive pattern M1_21, M0 conductive pattern M0A_24, and M0 conductive pattern M0A_21. M0 conductive patterns M0B_21 and M0A_22 are VSS power rails.

The bottom layer 860 comprises gate regions BPO_21 to BPO_26, dummy gate regions BDPO_21 to BDPO_24, BVG vias BVG_21, BVG_24, BVG_26 correspondingly over the gate regions BPO_21, BPO_24, BPO_26, a signal BVD via BVD_21, two VDD power BVD vias (not numbered), a first set of BM0 conductive patterns BM0A_21 to BM0A_23, and a second set of BM0 conductive patterns BM0B_21 to BM0B_23. BM0 conductive patterns BM0B_21 and BM0A_22 are VDD power rails.

The middle layer 850 comprises interlayer metal structures IM_21 to IM_28, structures MGLI_TB_21, MGLI_TB_22, MGLI_TB_24, MGLI_TB_25, a structure MGLI_T_26, a structure MGLI_B_23, and structures MDLI_TB_21 to MDLI_TB_24. The interlayer metal structures IM_21 to IM_28 are arranged in four IM tracks each elongated along the Y axis and spaced from an adjacent IM track along the Y axis. Connections using structures MGLI_TB, MGLI_T, MGLI_B, MDLI_TB are similar to those described with respect to one or more of FIGS. 6B, 8A.

Compared to the layout diagram 800A, the layout diagram 800B also includes a 2D interlayer metal structure IM_25 which has a U-shape, or C-shape, or bracket shape, and which is an example of a gate-to-gate connection. The layout diagram 800B comprises a further 2D interlayer metal structure IM_24 which has an L-shape. The 2D interlayer metal structure IM_24 comprises a first section 821 elongated along the Y axis, and a second section 822 projecting from an end of the first section 821 along the X axis. The gate region PO_22 is electrically coupled via the structure MGLI_TB_22 to both the gate region BPO_22 and the 2D interlayer metal structure IM_24 at the first section 821. The 2D interlayer metal structure IM_24 is further electrically coupled, at the second section 822, to the structure MDLI_TB_24 which is electrically coupled to both a source/drain of an NMOS having a gate being the gate region PO_26 and to a source/drain of a PMOS having a gate being the gate region BPO_26.

The 2D interlayer metal structure IM_24 is an example of a source/drain-to-gate connection. The layout diagram 800B is a further example of interlayer metal structures arranged at one side of an active region.

The layout diagram 800B comprises an M1 conductive pattern and no BM1 conductive pattern, which is an improvement in terms of routing resource usage over other approaches which require two M1 conductive patterns and two BM1 conductive pattern for a XOR2D1 cell. The layout diagram 800B occupies an area of 8 CPPs (a cell width of 4 CPPs multiplied with a double cell height), which is an improvement in terms of chip area over other approaches which require 10 CPPs for a XOR2D1 cell. In at least one embodiment, one or more advantages described herein are achievable by the layout diagram 800B, and/or an IC device corresponding to the layout diagram 800B.

Figure 9A:
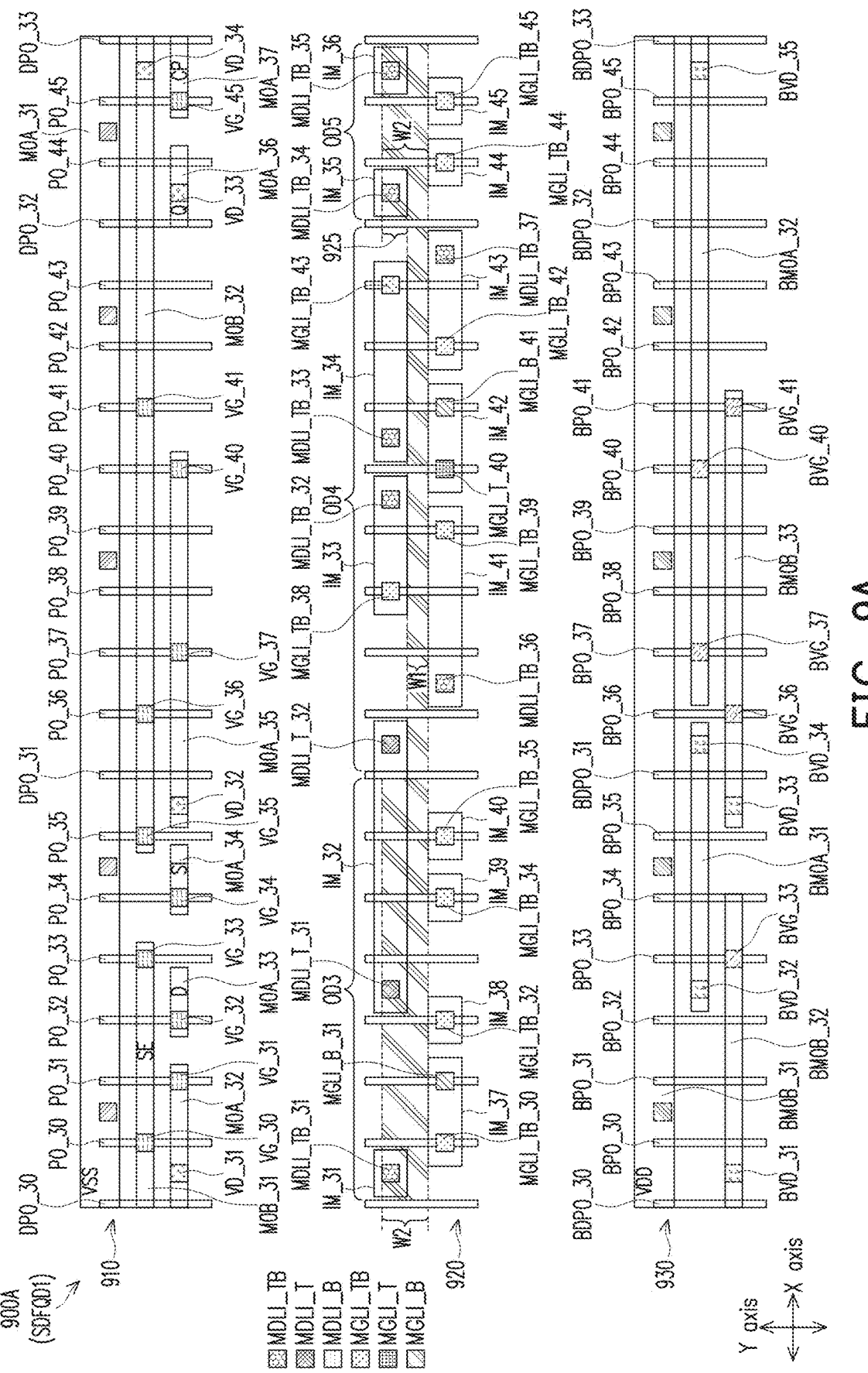
Figure 9B:
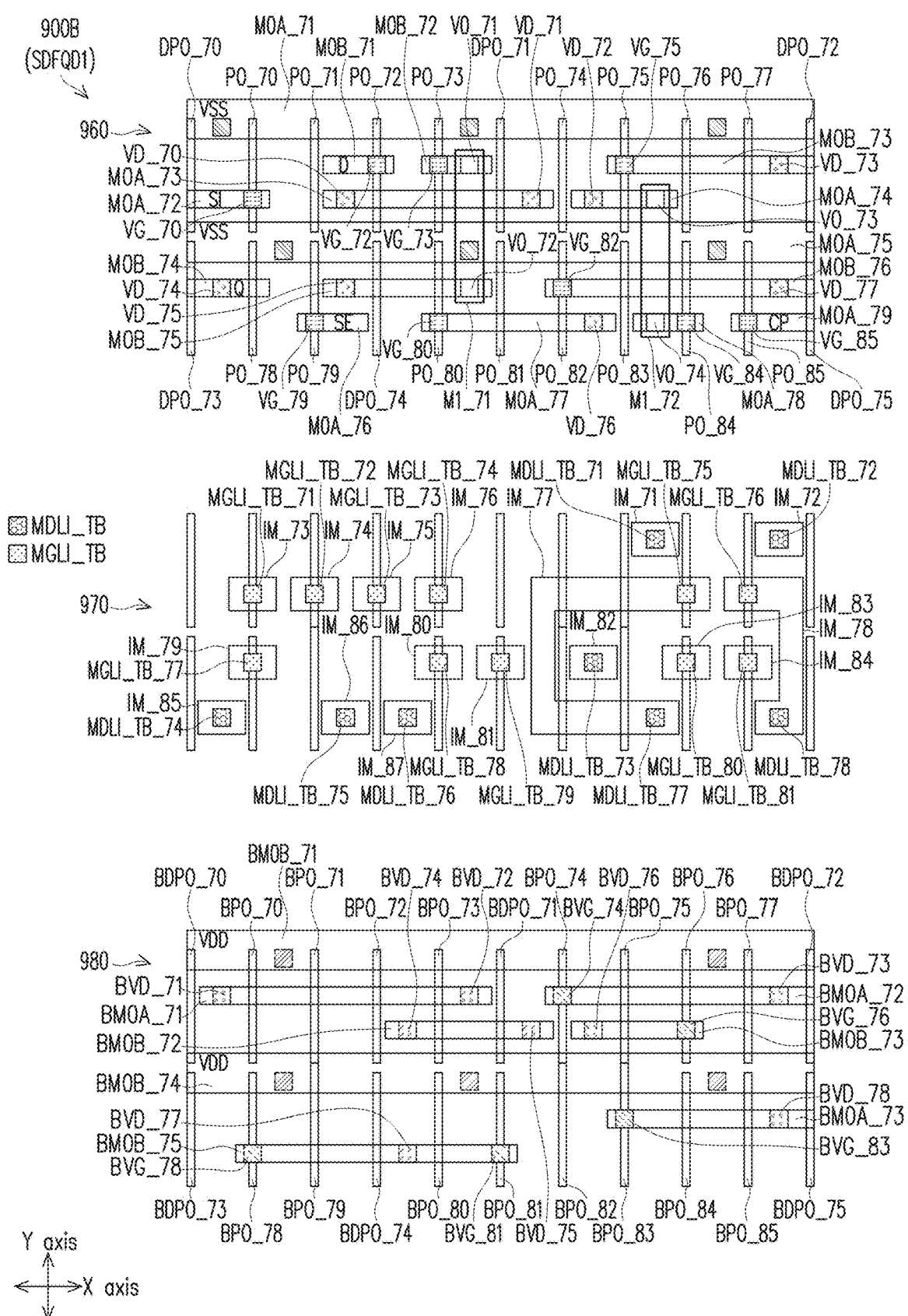

FIGS. 9A-9B each include schematic views at various layers of a corresponding layout diagram 900A-900B of the circuit 730, in accordance with some embodiments. In some embodiments, each of the layout diagrams 900A-900B is a layout diagram of an SDFQD1 cell comprising CFET devices.

In FIG. 9A, the layout diagram 900A comprises a top layer 910, a middle layer 920, and a bottom layer 930 corresponding to the top layer 220, middle layer 240, bottom layer 230, or to the top layer 810, middle layer 820, bottom layer 830. The top layer 910 comprises top semiconductor devices which are NMOSs. The bottom layer 930 comprises bottom semiconductor devices which are PMOSs. In at least one embodiment, the top semiconductor devices are PMOSs and the bottom semiconductor devices are NMOSs. For simplicity, MD contacts are omitted, active regions of the top layer 910 and bottom layer 930 are commonly illustrated as active regions OD3-OD5 in the middle layer 920, and a boundary configured similarly to the boundary 601 is omitted. The layout diagram 900A has a single cell height, but with different OD widths as described herein.

The top layer 910 comprises gate regions PO_30 to PO_45, dummy gate regions DPO_30 to DPO_33, VG vias VG_30 to VG_37, VG_40, VG_41, VG_45 correspondingly over the gate regions PO_30 to PO_37, PO_40, PO_41, PO_45, signal VD vias VD_31 to VD_34, five VSS power VD vias (not numbered), a first set of M0 conductive patterns M0A_31 to M0A_37, and a second set of M0 conductive patterns M0B_31, M0B_32. Inputs D, SI, SE, CP, and an output Q correspond to M0 conductive patterns M0A_33, M0A_34, M0B_31, M0A_37, and M0A_36. M0 conductive pattern M0A_31 is a VSS power rail.

The bottom layer 930 comprises gate regions BPO_30 to BPO_45, dummy gate regions BDPO_30 to BDPO_33, BVG vias BVG_33, BVG_36, BVG_37, BVG_40, BVG_41 correspondingly over the gate regions BPO_33, BPO_36, BPO_37, BPO_40, BPO_41, signal BVD vias BVD_31 to BVD_35, five VDD power BVD vias (not numbered), a first set of BM0 conductive patterns BM0A_31, BM0A_32, and a second set of BM0 conductive patterns BM0B_31 to BM0B_33. BM0 conductive pattern BM0B_31 is a VDD power rail.

The middle layer 920 comprises interlayer metal structures IM_31 to IM_45, structures MGLI_TB_30, MGLI_TB_32, MGLI_TB_34, MGLI_TB_35, MGLI_TB_38, MGLI_TB_39, MGLI_TB_42 to MGLI_TB_45, a structure MGLI_T_40, structures MGLI_B_31, MGLI_B_41, structures MDLI_TB_31 to MDLI_TB_37, and structures MDLI_T_31, MDLI_T_32. The interlayer metal structures IM_31 to IM_45 are arranged in two IM tracks each elongated along the X axis and spaced from the adjacent IM track along the Y axis. Connections using structures MGLI_TB, MGLI_T, MGLI_B, MDLI_TB, MDLI_T are similar to those described with respect to one or more of FIGS. 6B, 8A, 8B. The interlayer metal structure IM_32 is an example of a source/drain-to-source/drain connection, the interlayer metal structure IM_34 is an example of a source/drain-to-gate connection, and the interlayer metal structure IM_42 is an example of a gate-to-gate connection.

Compared to the layout diagrams 600B, 800A, 800B which have MGLIs or MDLIs on the same side of an active region, the layout diagram 900A comprises MGLIs and MDLIs on opposite sides of an active region. For this purpose, the layout diagram 900A comprises an active region OD4 having an OD width W1 (along the Y axis) smaller than an OD width W2 of other active regions OD3, OD5. In FIG. 9A, a region 925 indicates a difference in OD width between the active region OD4 and the other active regions OD3, OD5. The region 925 is outside the active region OD4 and permits MGLIs to be arranged thereover. Along the X axis, the active region OD3 is between the dummy gate regions DPO_30 and DPO_31, the active region OD4 is between the dummy gate regions DPO_31 and DPO_32, and the active region OD5 is between the dummy gate regions DPO_32 and DPO_33. It should be noted that the description herein with respect to the active regions OD3, OD4, OD5 is actually applicable to the top layer 910 and bottom layer 930. Specifically, the top layer 910 has NMOS active regions having the shapes and/or OD widths of active regions OD3, OD4, OD5, and the bottom layer 930 has PMOS active regions having the shapes and/or OD widths of active regions OD3, OD4, OD5.

The reduced OD width W2 of the active region OD4 makes it possible to arrange MGLIs and MDLIs on both sides of the active region OD4. For example, structures MGLI_TB_38, MGLI_TB_43 are arranged on one side (the upper side in FIG. 9A), whereas structures MGLI_TB_39, MGLI_T_40, MGLI_B_41, MGLI_TB_42 are arranged on the other side (the lower side in FIG. 9A) of the active region OD4. For another example, structures MDLI_T_32, MDLI_TB_32, MDLI_TB_33 are arranged on one side (the upper side in FIG. 9A), whereas structures MDLI_TB_36, MDLI_TB_37 are arranged on the other side (the lower side in FIG. 9A) of the active region OD4. In the active regions OD3, OD5 with the larger OD width W1, MGLIs or MDLIs are arranged on the same side of an active region OD3, OD5. In the example configuration in FIG. 9A, the structures MDLI_TB_31 to MDLI_TB_37 and structures MDLI_T_31, MDLI_T_32 are elongated along the Y axis, and touch or overlap the corresponding underlying active regions.

A configuration where MGLIs are arranged at the same side of an active region as described with respect to one or more of FIGS. 6B, 8A, 8B, and the active regions OD3, OD5 of FIG. 9A, is sometimes referred to as a one-side MGLI configuration. A configuration where MGLIs are arranged at opposite sides of an active region as described with respect to the active region OD4 in FIG. 9A, is sometimes referred to as a two-side MGLI configuration. In some embodiments, a one-side MGLI configuration provides a larger active region with larger currents (or larger power) and better performance. In at least one embodiment, a two-side MGLI configuration, although with a smaller active region and smaller currents, provides additional flexibility for circuit connections and is suitable for complicated circuits and/or structures. In some embodiments, these and/or other aspects are considered in determining whether an IC device, or a circuit region thereof, comprising CFET devices and interlayer metal structures is to be configured as a one-side MGLI configuration or a two-side MGLI configuration.

The layout diagram 900A comprises no M1 conductive pattern and no BM1 conductive pattern, which is an improvement in terms of routing resource usage over other approaches which require three M1 conductive patterns and three BM1 conductive pattern for an SDFQD1 cell. The layout diagram 900A occupies an area of 19 CPPs, which is an improvement in terms of chip area over other approaches which require 20 CPPs or more for an SDFQD1 cell. In at least one embodiment, one or more advantages described herein are achievable by the layout diagram 900A, and/or an IC device corresponding to the layout diagram 900A.

In FIG. 9B, the layout diagram 900B comprises a top layer 960, a middle layer 970, and a bottom layer 980 corresponding to the top layer 810, middle layer 820, bottom layer 830. The top layer 960 comprises top semiconductor devices which are NMOSs. The bottom layer 980 comprises bottom semiconductor devices which are PMOSs. In at least one embodiment, the top semiconductor devices are PMOSs and the bottom semiconductor devices are NMOSs. For simplicity, MD contacts are omitted, active regions are omitted, and a boundary configured similarly to the boundary 601 is omitted. The layout diagram 900B comprises 2 active regions (not shown) arranged with a spacing along the Y axis, and has a double cell height, similarly to the layout diagram 800A or layout diagram 800B.

The top layer 960 comprises gate regions PO_70 to PO_85, dummy gate regions DPO_70 to DPO_75, VG vias VG_70, VG_72, VG_73, VG_75, VG_79, VG_80, VG_82, VG_84, VG_85 correspondingly over the gate regions PO_70, PO_72, PO_73, PO_75, PO_79, PO_80, PO_82, PO_84, PO_85, signal VD vias VD_70 to VD_77, six VSS power VD vias (not numbered), a first set of M0 conductive patterns M0A_71 to M0A_79, a second set of M0 conductive patterns M0B_71 to M0B_76, V0 vias V0_71, V0_72 correspondingly over and coupled to M0 conductive patterns M0B_72, M0B_75, V0 vias V0_73, V0_74 correspondingly over and coupled to M0 conductive patterns M0A_74, M0A_78, an M1 conductive pattern M1_71 over and coupled to the V0 vias V0_71, V0_72, and an M1 conductive pattern M1_72 over and coupled to the V0 vias V0_73, V0_74. The M1 conductive patterns M1_71, M1_72 are configured for a low-toggle-rate signal. Inputs D, SI, SE, CP, and an output Q correspond to M0 conductive patterns M0B_71, M0A_72, M0A_76, M0A_79, and M0B_74. M0 conductive patterns M0A_71, M0A_75 are VSS power rails.

The bottom layer 980 comprises gate regions BPO_70 to BPO_85, dummy gate regions BDPO_70 to BDPO_75, BVG vias BVG_74, BVG_76, BVG_78, BVG_81, BVG_83 correspondingly over the gate regions BPO_74, BPO_76, BPO_78, BPO_81, BPO_83, signal BVD vias BVD_71 to BVD_78, five VDD power BVD vias (not numbered), a first set of BM0 conductive patterns BM0A_71 to BM0A_73, and a second set of BM0 conductive patterns BM0B_71 to BM0B_75. BM0 conductive patterns BM0B_71 and BM0B_74 are VDD power rails.

The middle layer 970 comprises interlayer metal structures IM_71 to IM_87, structures MGLI_TB_71 to MGLI_TB_81, and structures MDLI_TB_71 to MDLI_TB_78. The interlayer metal structures IM_71 to IM_87 are arranged in four IM tracks each elongated along the X axis and spaced from an adjacent IM track along the Y axis. Connections using structures MGLI_TB, MDLI_TB are similar to those described with respect to one or more of FIGS. 6B, 8A, 8B.

Compared to the layout diagram 900A which has a single cell height, the layout diagram 900B has a double cell height. Compared to the layout diagram 900A which has 1D interlayer metal structures, the layout diagram 900B comprises 2D interlayer metal structures IM_77, IM_78 which are also examples of source/drain-to-gate connections. Compared to the layout diagram 900A which has one or more active regions with a reduced OD width, the layout diagram 900B, in at least one embodiment, comprises no active regions with a reduced OD width. As a result, cell power of the layout diagram 900B is not affected by an active region with a reduced OD width, and the layout diagram 900B is applicable where cell power is a design feature to be considered.

The layout diagram 900B comprises two M1 conductive patterns and no BM1 conductive pattern, which is an improvement in terms of routing resource usage over other approaches which require more than four M1 and/or BM1 conductive patterns for an SDFQD1 cell. The layout diagram 900B occupies an area of 20 CPPs (a cell width of 10 CPPs multiplied with a double cell height), which is an improvement in terms of chip area over other approaches which require more than 20 CPPs for an SDFQD1 cell. In at least one embodiment, the layout diagram 900B further provides cell power improvements as described herein. In at least one embodiment, one or more advantages described herein are achievable by the layout diagram 900B, and/or an IC device corresponding to the layout diagram 900B.

FIGS. 10A-10B are schematic views correspondingly showing definitions for cells 1000A, 1000B, in accordance with some embodiments. The cell 1000A in FIG. 10A has a one-side MGLI configuration. The cell 1000B in FIG. 10B has to a two-side MGLI configuration. The schematic views in FIGS. 10A, 10B are similar to one or more Y axis cross-sectional views described with respect to one or more of FIGS. 2B, 2C, 3A.

In FIG. 10A, the cell 1000A has a boundary within which devices and features of the cell 1000A are arranged. In at least one embodiment, the boundary corresponds to the boundary 210 or boundary 601. Two edges 1011, 1012 of the boundary are illustrated in FIG. 10A. The edges 1011, 1012 oppose each other along the Y axis. The cell 1000A comprises a CFET device having a top semiconductor device over a bottom semiconductor device. The top semiconductor device comprises nanosheets 1071, a gate 1072 around the nanosheets 1071, an MGLI 1074 over the gate 1072, and an MDLI 1027 over a source/drain of the top semiconductor device. The bottom semiconductor device comprises nanosheets 1081, a gate 1082 around the nanosheets 1081, an MGLI 1084 over the gate 1082, and an MDLI 1037 over a source/drain of the bottom semiconductor device. The cell 1000A further comprises interlayer metal structures 1043, 1047 between the top semiconductor device and the bottom semiconductor device. In some embodiments, the edges 1011, 1012, nanosheets 1071, 1081, gates 1072, 1082, MGLIs 1074, 1084, MDLIs 1027, 1037, and interlayer metal structures 1043, 1047 correspond to the edges 211, 212, nanosheets 271, 281, gates 272, 282, MGLIs 274, 284, MDLIs 227, 237, and interlayer metal structures 243, 247.

Various dimensions A, B, C, D, E, G related to the cell 1000A are illustrated in FIG. 10A.

The width A is the max OD width among all active regions in the cell 1000A. An OD width of the top semiconductor device corresponds to the dimension of the nanosheets 1071 along the Y axis. An OD width of the bottom semiconductor device corresponds to the dimension of the nanosheets 1081 along the Y axis. In the example configuration in FIG. 10A, the OD width of the top semiconductor device is greater than that of the bottom semiconductor device, and is designated as the max OD width A. In one or more embodiments, the OD width of the bottom semiconductor device is greater than that of the top semiconductor device, and is designated as the max OD width A.

The spacing B along the Y axis between the nanosheets 1071 and an adjacent end of the corresponding gate 1072 is referred to as "PO end cap" in the drawings.

The spacing C corresponds to a dimension of a CMG pattern along the Y axis, and is referred to as "CMG" in the drawings. The spacing C indicates a distance to a feature of an adjacent cell. For example, the spacings C in FIG. 10A correspondingly indicate a distance between the MDLI 1027 and a feature 1002 (e.g., an MGLI) of an adjacent cell, and a distance between the MGLI 1074 and a feature 1004 of another adjacent cell. In at least one embodiment, the edge 1011 or 1012 bisects the corresponding spacing C.

The spacing D along the Y axis between the nanosheets 1071 and the MGLI 1074 is referred to as "MGLI-to-OD space" in the drawings.

A dimension E is a width of the MGLI 1074 along the Y axis, and is referred to as "MGLI width" in the drawings.

A pitch G between the interlayer metal structures 1043, 1047 is referred to as "inter-metal pitch" (or IM pitch) in the drawings. The IM pitch is the distance along the Y axis between two adjacent IM tracks elongated along the X axis. In the example configuration in FIG. 10A, the interlayer metal structure 1043 is on a first IM track and the interlayer metal structure 1047 is on an adjacent, second IM track. Examples of IM tracks and IM pitch are described with respect to FIG. 6B.

The cell height of the cell 1000A is the distance between the edges 1011, 1012 of the cell boundary, and is determined by the sum of A, B, C, D and E, i.e., by the following formula (1):

$$\text{Cell Height} = (A + B + C + D + E) \tag{1}$$

The IM pitch G is determined by the cell height divided by the number of IM tracks in the cell 1000A, i.e., by the following formula (2):

$$G = \text{Cell Height/Number of } IM \text{ tracks} \tag{2}$$

In the example configuration in FIG. 10A, the number of IM tracks is 2, and G is half the cell height. In some embodiments, the IM pitch G determined by formula (2) is used during an IC design to verify whether the IC device being designed satisfies one or more design rules, as described herein.

In FIG. 10B, components of the cell 1000B having corresponding components in the cell 1000A are designated by the reference numerals of the cell 1000A. Compared to the cell 1000A corresponding to the one-side MGLI configuration, the cell 1000B corresponding to the two-side MGLI configuration further comprises an MGLI 1094. The MGLIs 1074, 1094 are on opposite sides of the active region comprising the nanosheets 1071, 1081. The cell 1000B further comprises an interlayer metal structure 1093, and an MDLI 1097. The interlayer metal structure 1093 is on a third IM track between the first IM track corresponding to the interlayer metal structure 1043 and the second IM track corresponding to the interlayer metal structure 1047. The third IM track is spaced from the first and second IM tracks by the IM pitch G. The MDLIs 1027, 1097 are on opposite sides of the active region comprising the nanosheets 1071, 1081.

The cell height of the cell 1000B is determined by the following formula (3):

$$\text{Cell Height} = A + \max(B + C; C + D + E) \times 2 \tag{3}$$

The IM pitch G in the cell 1000B is determined by the formula (2), and is used, in one or more embodiments, during an IC design to verify whether the IC device being designed satisfies one or more design rules, as described herein. The illustrated numbers of IM tracks in the cells 1000A, 1000B are examples. The described formulas are for single cell height cells which the cells 1000A, 100B are. Other formulas for multiple cell height cells, such as double cell height cells, are within the scopes of various embodiments.

In some embodiments, a cell corresponding to the one-side MGLI configuration still includes MDLIs on opposite sides of the active region. An example of such a cell is the cell 1000B without the MGLI 1094. Another example is the cell 1000A with the MDLI 1097. The cell height of these cells is determined, in accordance with some embodiments, by formula (1). In at least one embodiment, one or more advantages described herein are achievable by IC devices comprising one or more cells described with respect to FIGS. 10A-10B.

FIGS. 11A-11D are schematic cross-sectional views of an IC device 1100 at various stages in manufacturing processes, in accordance with some embodiments. In at least one embodiment, one or more manufacturing processes described with respect to FIGS. 11A-11D are applicable to fabricate one or more of the IC devices described herein. For simplicity, corresponding components in FIGS. 2B-2C and in FIGS. 11A-11D are designated by the same reference numerals.

Figure 11B:
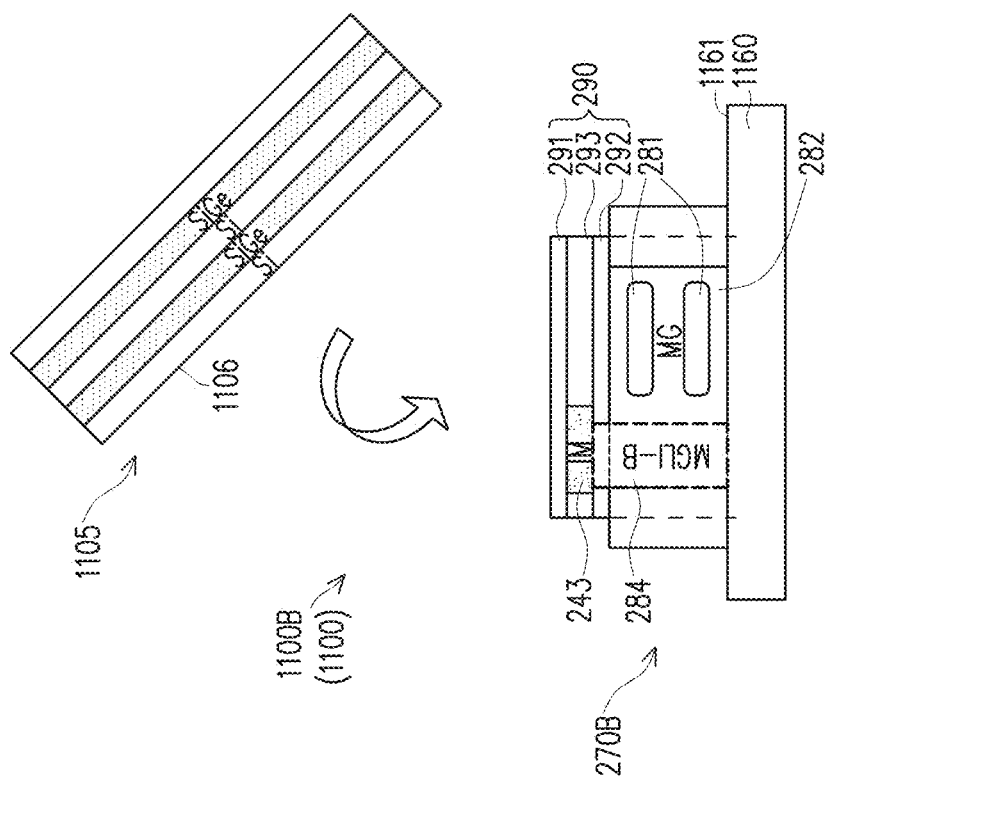
Figure 11A:
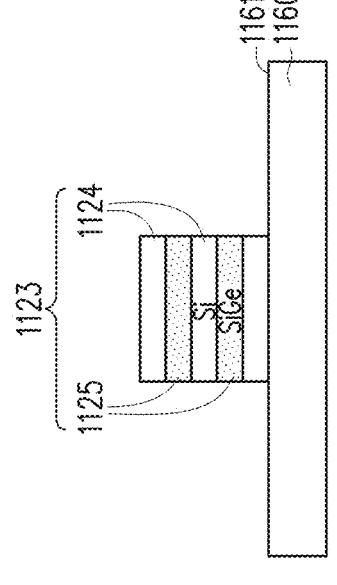

In FIG. 11A, an example manufacturing process starts from a substrate 1160. In some embodiments, the substrate 1160 is a silicon-on-insulator (SOI) substrate having a semiconductor bulk, and an insulation layer over the semiconductor bulk. Other substrate configurations are within the scopes of various embodiments. In some embodiments, the substrate 1160 comprises a P-type substrate for forming N-type devices thereon. In some embodiments, the substrate 1160 comprises an N-type substrate for forming P-type devices thereon. In some embodiments, substrate 1160 includes an elemental semiconductor including silicon or germanium in crystal, polycrystalline, or an amorphous structure; a compound semiconductor including silicon carbide, gallium arsenic, gallium phosphide, indium phosphide, indium arsenide, and indium antimonide; an alloy semiconductor including SiGe, GaAsP, AlInAs, AlGaAs, GaInAs, GaInP, and GaInAsP; any other suitable material; or combinations thereof. In some embodiments, the semiconductor substrate 1160 includes a doped epitaxial layer or a buried layer. In some embodiments, the compound semiconductor substrate has a multilayer structure, or the substrate includes a multilayer compound semiconductor structure.

Alternating layers of a first semiconductor material and a second semiconductor material different from the first semiconductor material are sequentially deposited over a front side 1161 of the substrate 1160. In some embodiments, the first semiconductor material comprises silicon, and the second semiconductor material comprises SiGe. As a result, alternating SiGe/Si/SiGe/Si layers are stacked over the front side 1161 of the substrate 1160. In some embodiments, the alternating layers SiGe/Si/SiGe/Si are formed by an epitaxy process. Other materials and/or manufacturing processes for the alternating layers of the different first and second semiconductor materials are within the scopes of various embodiments.

In some embodiments, dummy gate structures (not shown) are formed over the alternating layers SiGe/Si/SiGe/Si, to be used as a mask for subsequent patterning, and for later formation of a metal gate. In an example, each dummy gate structure includes various dummy layers, such as a dummy gate electrode (e.g., polysilicon), a hard mask layer (e.g., SiN, SiCN, SiO, or the like). The dummy gate structures are formed by deposition processes, lithography processes, etching processes, combinations thereof, or the like.

The alternating layers SiGe/Si/SiGe/Si are patterned by using the dummy gate structures as a mask, to obtain a multilayer stack 1123 having alternating layers 1124, 1125. The layers 1124 are patterned parts of the Si layers, and the layers 1125 are patterned parts of the SiGe layers. A resulting structure 1100A is thus obtained.

In FIG. 11B, various bottom semiconductor devices are fabricated based on the structure 1100A. In at least one embodiment, isolation regions (not shown and/or not numbered) are formed in trenches to separate and electrically isolate active regions of the devices to be manufactured. In some embodiments, one or more dielectric materials, such as SiO and/or SiN, are deposited over the structure 1100A, e.g., by chemical vapor deposition (CVD), plasma enhanced CVD (PECVD), atomic layer deposition (ALD), physical vapor deposition (PVD), thermal oxidation, or the like. Subsequently, the dielectric material is recessed, e.g., by etching and/or chemical mechanical polishing (CMP) to form the isolation regions.

In some embodiments, SiGe at exposed edges of the layers 1125 are selectively removed (not shown for simplicity) by an etching process to form gaps between edges of adjacent layers 1124. In some embodiments, the selective removal of SiGe at the exposed edges of the layers 1125 include an oxidation process followed by a selective etching.

In some embodiments, source/drain features (not shown) similar to the source/drains 276, 277 are epitaxially grown as epitaxy structures. The source/drain features are grown to be in contact with the exposed edges of the Si layers 1124. Example epitaxy processes include, but are not limited to, CVD deposition, ultra-high vacuum CVD (UHV-CVD), low-pressure CVD (LPCVD), plasma-enhanced CVD (PECVD), selective epitaxial growth (SEG) or the like.

In some embodiments, a metal gate replacement process is performed to replace the dummy gate structures with metal gate structures. In some embodiments, the dummy gate structures are removed by one or more etching processes, such as wet etching, dry etching, or the like. The layers 1124, 1125 are exposed as a result. SiGe in the layers 1125 is selectively removed by a selective oxidation/etching process similar to that used to remove SiGe at the exposed edges of the layers 1125. The layers 1124 remain, and configure nanosheets 281 for bottom semiconductor devices. Metal gate structures are formed to wrap around the nanosheets 281. In some embodiments, each metal gate structure includes a gate dielectric (not shown) wrapping around the nanosheets 281, and a metal gate 282 over the gate dielectric to obtain bottom semiconductor devices 270B. Example materials of the gate dielectric includes a high-k dielectric material, such as HfO2, HfSiO, HfSiO4, HfSION, HfLaO, HfTaO, HfTiO, HfZrO, HfAlOx, ZrO, ZrO2, ZrSiO2, AlO, AlSiO, Al2O3, TiO, TiO2, LaO, LaSiO, Ta2O3, Ta2O5, Y2O3, SrTiO3, BaZrO, BaTiO3 (BTO), (Ba,Sr)TiO3 (BST), Si3N4, hafnium dioxide-alumina (HfO2-Al2O3) alloy, or the like. In some embodiments, the gate dielectric is deposited by CVD, PVD, ALD, or the like. In some embodiments, each metal gate includes one or more metals such as Al, Cu, W, Ti, Ta, TiN, TaN, NiSi, CoSi, and is formed by, e.g., CVD, ALD, PVD, plating, chemical oxidation, thermal oxidation, or the like.

For at least one of the bottom semiconductor devices 270B, at least one MGLI-B 284 and/or at least one MDLI-B (not shown) similar to the MDLI-B 237 are formed, e.g., by etching and metal depositing operations.

A multilayer structure 290 is formed over the MGLI-B 284 and/or MDLI-B. For example, a lower dielectric layer 292 is deposited over the MGLI-B 284 and/or MDLI-B of the bottom semiconductor device(s) 270B. In some embodiments, the lower dielectric layer 292 comprises nitride, oxide, carbide or the like, and is formed by using one or more CVD, PVD, ALD spin-on coating, or the like. A planarization operation is performed to remove excess materials of the lower dielectric layer 292 to expose the MGLI-B 284 and/or MDLI-B. A middle dielectric layer 293 is deposited over the lower dielectric layer 292 and the exposed MGLI-B 284 and/or MDLI-B. In some embodiments, the middle dielectric layer 293 comprises nitride, oxide, carbide or the like, and is formed by using one or more CVD, PVD, ALD spin-on coating, or the like. In at least one embodiment, the dielectric material of the middle dielectric layer 293 is different from that of the lower dielectric layer 292. The middle dielectric layer 293 is patterned to form one or more trenches. The trenches are over the exposed MGLI-B 284 and/or MDLI-B, and correspond to one or more interlayer metal structures to be formed. An example patterning operation of the middle dielectric layer 293 comprises lithographic and etching operations. A conductive material is deposited into the trenches to form one or more interlayer metal structures 243. Example conductive materials include, but are not limited to, copper, silver, tungsten, titanium, nickel, tin, aluminum, or the like. Example conductive material deposition operations include, but are not limited to, CVD, PVD, ALD, plating, or the like. In some embodiments, a planarization operation is performed to remove excess materials of the conductive material of the interlayer metal structures. An upper dielectric layer 291 is deposited over the interlayer metal structures 243. In some embodiments, the upper dielectric layer 291 comprises nitride, oxide, carbide or the like, and is formed by using one or more CVD, PVD, ALD spin-on coating, or the like. In at least one embodiment, the dielectric material of the upper dielectric layer 291 is different from that of the middle dielectric layer 293. A planarization operation is performed in one or more embodiments. A resulting structure 1100B is thus obtained.

A substrate 1105 having thereon a plurality of alternating SiGe/Si/SiGe/Si layers similar to that described with respect to FIG. 11A is bonded to the structure 1100B. In at least one embodiment, the upper dielectric layer 291 comprises a bonding material, such as silicon oxide, that bonds the structure 1100B to a surface 1106 of the substrate 1105. In some embodiments, the bonding material, such as silicon oxide, is provided on the surface 1106 and bonds the substrate 1105 to the upper dielectric layer 291 of the structure 1100B.

Figure 11D:
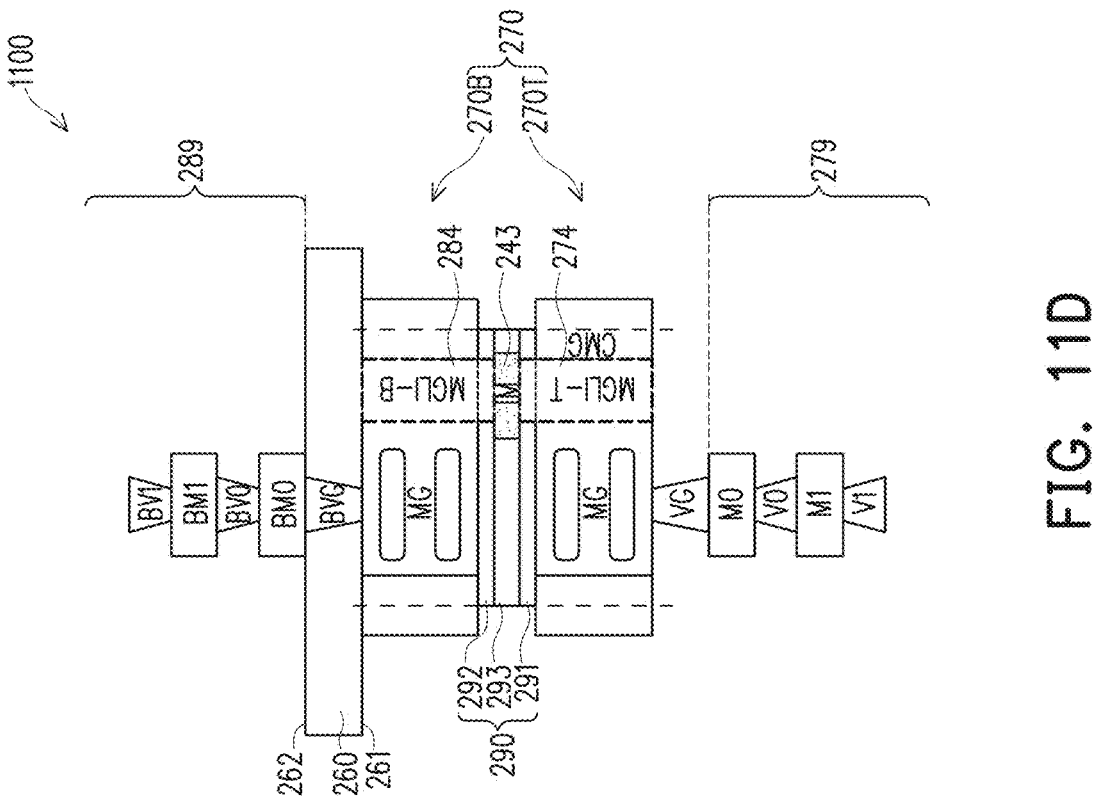
Figure 11C:
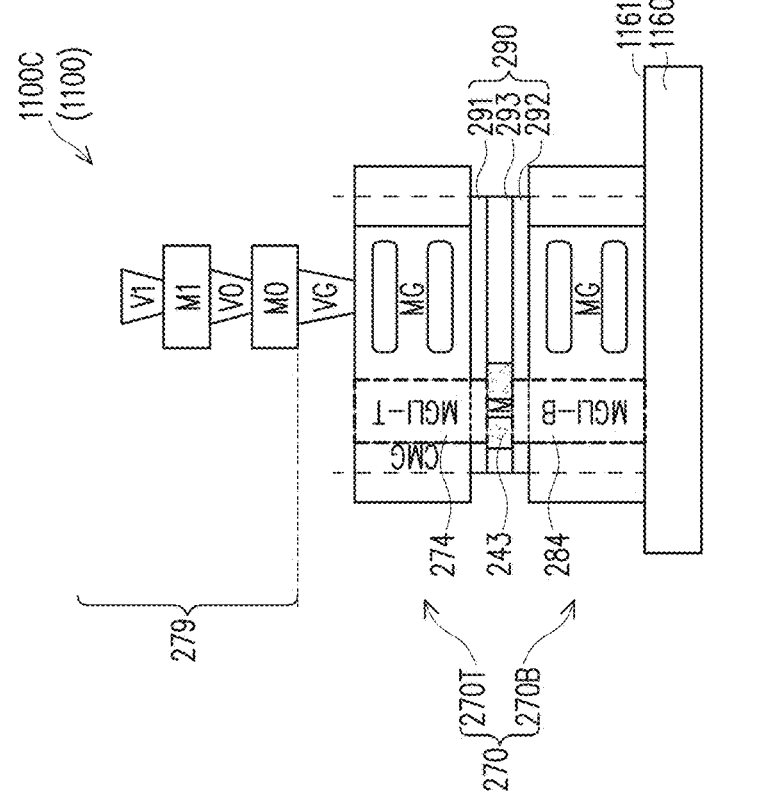

In FIG. 11C, after the bonding operation, the plurality of alternating SiGe/Si/SiGe/Si layers of the substrate 1105 are patterned, and top semiconductor devices 270T are formed using the patterned SiGe/Si/SiGe/Si layers of the substrate 1105 in a manner similar to that described with respect to the formation of the bottom semiconductor devices 270B. As a result, a plurality of CFET devices 270 are formed.

For at least one of the top semiconductor devices 270T, at least one MGLI-T 274 and/or at least one MDLI-T (not shown) similar to the MDLI-T 227 are formed, e.g., by etching and metal depositing operations. The formation of the MGLI-T 274 and/or MDLI-T also etches the upper dielectric layer 291 to expose the underlying interlayer metal structure 243, and permit the MGLI-T 274 and/or MDLI-T to come into contact with the interlayer metal structure 243.

Various MD contact structures, VD vias, VG vias, as well as metal layers and via layers of a redistribution structure 279 are formed to couple various CFET devices 270, into one or more circuits of the IC device being manufactured. In some embodiments, this process comprises a combination of photolithography, material removal and deposition processes. A resulting structure 1100C is thus obtained.

In FIG. 11D, the structure 1100C is flipped upside down and temporarily bonded to a carrier (not shown). Wafer thinning is performed from the back side (now facing upward) to remove a portion of the substrate 1160 to obtain a substrate 260. In some embodiments, the wafer thinning process includes a grinding operation, a polishing operation (such as, chemical mechanical polishing (CMP)), or the like. In at least one embodiment, the substrate 1160 is completely removed, and a substrate 260, e.g., an insulation substrate, is formed over the CFET devices 270. A back side redistribution structure 289 is formed over the back side 262 of the substrate 260 in a manner similar to that described with respect to the formation of the redistribution structure 279. The IC device 1100 is thus obtained.

In some embodiments, one or more advantages described herein are achievable by one or more IC devices manufactured by the processes described with respect to FIGS. 11A-11D. Although the described manufacturing processes include formation of nanosheet devices in one or more embodiments, other types of devices, e.g., nanowire, FinFET, planar, or the like, are within the scopes of various embodiments. The described manufacturing processes and/or orders of operations are examples. Other manufacturing processes and/or orders of operations are within the scopes of various embodiments.

FIG. 12A is a flowchart of a method 1200A of designing and/or manufacturing an IC device, in accordance with some embodiments. In some embodiments, the method 1200A is usable for designing and/or manufacturing one or more IC devices as described herein. The method 1200A is implementable, for example, using an EDA system discussed below, and/or a manufacturing system discussed below, in accordance with some embodiments.

At operation 1202, a layout diagram is generated which, among other things, includes one or more of layouts for various circuits as disclosed herein, or the like. Operation 1202 is implementable, for example, using an EDA system discussed below, in accordance with some embodiments. Examples of layout diagrams obtained at operation 1202 comprise one or more layout diagrams described herein. In some embodiments, operation 1202 is omitted.

At operation 1204, based on the layout diagram, at least one of (A) one or more photolithographic exposures are made or (B) one or more semiconductor masks are fabricated or (C) one or more components in a layer of an IC device are fabricated. Operation 1204 is implementable, for example, using a manufacturing system discussed below, in accordance with some embodiments. Examples of IC devices obtained at operation 1204 comprise one or more IC devices described herein. In some embodiments, operation 1204 is omitted.

FIG. 12B is a flowchart of a method 1200B of generating a layout diagram for an IC device, in accordance with some embodiments. In some embodiments, the method 1200B is an example of at least a part of the operation 1202. In at least one embodiment, the method 1200B is implementable at least in part using a processor, e.g., in an EDA system discussed below. In at least one embodiment, the IC device for which a layout diagram is to be generated includes CFET devices with interlayer metal structures, as described herein.

At operation 1220, it is determined whether CFET devices with interlayer metal structures in one or more circuits of the IC device are to be configured in the one-side MGLI configuration or two-side MGLI configuration. Examples of the one-side MGLI configuration include the layout diagram 600B in FIG. 6B, layout diagram 800A in FIG. 8A, layout diagram 800B in FIG. 8B, layout diagram 900B in FIG. 9B, and layout diagram 1000A in FIG. 10A. Examples of the two-side MGLI configuration include the layout diagram 900A in FIG. 9A, and layout diagram 1000B in FIG. 10B. In some embodiments, a portion of a circuit is configured in the one-side MGLI configuration, whereas another portion of the circuit is configured in the two-side MGLI configuration. For example, as described with respect to FIG. 9A, a first portion corresponding to the active region OD3 or active region OD5 is configured in the one-side MGLI configuration, whereas a second portion corresponding to the active region OD4 is configured in the two-side MGLI configuration. As also described herein, various factors are considered in determining whether the IC device, or a circuit thereof, or a portion of the circuit is to be configured in the one-side MGLI configuration or two-side MGLI configuration. Such factors include, but are not limited to, cell power, circuit complexity, design rules to be satisfied, or the like. In at least one embodiment, operation 1220 is omitted.

At operation 1222, a number of IM tracks in a cell is determined. For example, as described with respect to FIG. 6B, two IM tracks 621, 622 are arranged in a cell. Similar examples of two IM tracks in a cell are described with respect to FIG. 9A. In a further example, as described with respect to FIG. 8A, four IM tracks (not numbered) are arranged in a cell. Similar examples of four IM tracks in a cell are described with respect to FIGS. 8B, 9B. In some embodiments, the number of IM tracks in a cell is determined considering various factors including, but not limited to, circuit complexity, design rules to be satisfied, or the like. In at least one embodiment, operation 1222 is omitted.

At operation 1224, a cell height is determined. In at least one embodiment, for a cell comprising the one-side MGLI configuration, formular (1) is used to determine the cell height, for example, as described with respect to FIG. 10A. In some embodiments, for a cell comprising the two-side MGLI configuration, formular (3) is used to determine the cell height, for example, as described with respect to FIG. 10B.

At operation 1226, an IM pitch G is determined using formular (2), the cell height obtained at operation 1224, and the number of IM tracks determined at operation 1222. For example, as described with respect to FIG. 6B, the IM pitch G is the distance along the Y axis between the adjacent IM tracks 621, 622. The determined IM pitch G is then compared with a predetermined minimum IM pitch. In response to the determined IM pitch G being smaller than the predetermined minimum IM pitch (No from operation 1226), indicating a design rule violation, the process proceeds to operation 1228. In response to the determined IM pitch G being not smaller than the predetermined minimum IM pitch (Yes from operation 1226), the process proceeds to operation 1230.

At operation 1228, one or more modifications to one or more features of the cell that violates the design rule are performed. In at least one embodiment, the cell is re-configured from the one-side MGLI configuration to the two-side MGLI configuration, or vice versa. For example, an SDFQD1 cell is changed from the one-side MGLI configuration in FIG. 9B to the two-side MGLI configuration in FIG. 9A. In some embodiments, the number of IM tracks in the cell is changed, e.g., reduced. For example, an SDFQD1 cell is changed from a configuration or layout having four IM tracks as described with respect to FIG. 9B, to a configuration or layout having two IM tracks as described with respect to FIG. 9A. In at least one embodiment, one or more dimensions A-E as described with respect to FIGS. 10A, 10B is/are modified to therefore adjust the cell height with an aim to satisfy the design rule. Upon making one or more modifications to the cell, the process returns to operation 1224 to again determine the cell height in view of the modifications, and the design rule is checked again at operation 1226. In response to the modified cell passing the design rule (Yes at operation 1226), the process proceeds to operation 1230. In response to the modified cell again failing the design rule (No at operation 1226), the process proceeds to operation 1228 for further modifications.

At operation 1230, an IC layout diagram is generated using the cell that has passed the design rule at operation 1226. In an example, cells that have passed the design rule are placed in abutment in an IC layout diagram, and a routing operation is performed to generate interconnects among the placed cells. Example cells used for generating an IC layout diagram are described with respect to FIGS. 2A, 3B, 3C, 6B, 8A-8B, 9A-9B. The generated IC layout diagram is then subject to one or more verifications and/or simulation before manufacturing. In at least one embodiment, one or more advantages described herein are achievable by one or more IC layout diagrams generated by the method 1200B, and/or by IC devices manufactured based on such layout diagrams.

FIG. 12C is a flowchart of a method 1200C of manufacturing an IC device, in accordance with some embodiments. In some embodiments, the method 1200C is usable to manufacture one or more IC devices as described herein.

At operation 1235, first semiconductor devices of a first type are formed over a first substrate. For example, bottom semiconductor devices 270B are formed over a substrate 1160 as described with respect to FIGS. 11A-11B. In some embodiments, the bottom semiconductor devices 270B are N-type devices. In at least one embodiment, the bottom semiconductor devices 270B are P-type devices.

At operation 1240, at least one of a first MGLI or a first MDLI is formed for at least one first semiconductor device. For example, a MGLI-B 284 is formed for a bottom semiconductor device 270B as described with respect to FIG. 11B.

At operation 1245, a multilayer structure is formed over the first substrate. The multilayer structure comprises an interlayer metal structure over and in physical and electrical contact with the at least one of the first MGLI or the first MDLI. For example, a multilayer structure 290 is formed over the first substrate 1160, and the multilayer structure 290 comprises an interlayer metal structure 243 over and in physical and electrical contact with the MGLI-B 284, as described with respect to FIG. 11B.

At operation 1250, a second substrate is bonded to the first substrate. For example, a substrate 1105 is bonded to the substrate 1160, e.g., by a bonding oxide layer, as described with respect to FIG. 11B.

At operation 1255, second semiconductor devices of a second type are formed over the second substrate. For example, top semiconductor devices 270T are formed over the substrate 1105, as described with respect to FIG. 11C. In some embodiments where the bottom semiconductor devices 270B are N-type devices, the top semiconductor devices 270T are P-type devices. In at least one embodiment where the bottom semiconductor devices 270B are P-type devices, the top semiconductor devices 270T are N-type devices.

At operation 1260, for at least one second semiconductor device, at least one of a second MGLI or a second MDLI is formed in physical and electrical contact with the interlayer metal structure. For example, a MGLI-T 274 is formed in physical and electrical contact with the interlayer metal structure 243, as described with respect to FIG. 11C. In at least one embodiment, one or more advantages described herein are achievable by IC devices manufactured in accordance with the method 1200C.

The described methods include example operations, but they are not necessarily required to be performed in the order shown. Operations may be added, replaced, changed order, and/or eliminated as appropriate, in accordance with the spirit and scope of embodiments of the disclosure. Embodiments that combine different features and/or different embodiments are within the scope of the disclosure and will be apparent to those of ordinary skill in the art after reviewing this disclosure.

In some embodiments, at least one method(s) discussed above is performed in whole or in part by at least one EDA system. In some embodiments, an EDA system is usable as part of a design house of an IC manufacturing system discussed below.

FIG. 13 is a block diagram of an electronic design automation (EDA) system 1300 in accordance with some embodiments.

In some embodiments, EDA system 1300 includes an APR system. Methods described herein of designing layout diagrams represent wire routing arrangements, in accordance with one or more embodiments, are implementable, for example, using EDA system 1300, in accordance with some embodiments.

In some embodiments, EDA system 1300 is a general purpose computing device including a hardware processor 1302 and a non-transitory, computer-readable storage medium 1304. Storage medium 1304, amongst other things, is encoded with, i.e., stores, computer program code 1306, i.e., a set of executable instructions. Execution of instructions 1306 by hardware processor 1302 represents (at least in part) an EDA tool which implements a portion or all of the methods described herein in accordance with one or more embodiments (hereinafter, the noted processes and/or methods).

Processor 1302 is electrically coupled to computer-readable storage medium 1304 via a bus 1308. Processor 1302 is also electrically coupled to an I/O interface 1310 by bus 1308. A network interface 1312 is also electrically connected to processor 1302 via bus 1308. Network interface 1312 is connected to a network 1314, so that processor 1302 and computer-readable storage medium 1304 are capable of connecting to external elements via network 1314. Processor 1302 is configured to execute computer program code 1306 encoded in computer-readable storage medium 1304 in order to cause system 1300 to be usable for performing a portion or all of the noted processes and/or methods. In one or more embodiments, processor 1302 is a central processing unit (CPU), a multi-processor, a distributed processing system, an application specific integrated circuit (ASIC), and/or a suitable processing unit.

In one or more embodiments, computer-readable storage medium 1304 is an electronic, magnetic, optical, electromagnetic, infrared, and/or a semiconductor system (or apparatus or device). For example, computer-readable storage medium 1304 includes a semiconductor or solid-state memory, a magnetic tape, a removable computer diskette, a random access memory (RAM), a read-only memory (ROM), a rigid magnetic disk, and/or an optical disk. In one or more embodiments using optical disks, computer-readable storage medium 1304 includes a compact disk-read only memory (CD-ROM), a compact disk-read/write (CD-R/W), and/or a digital video disc (DVD).

In one or more embodiments, storage medium 1304 stores computer program code 1306 configured to cause system 1300 (where such execution represents (at least in part) the EDA tool) to be usable for performing a portion or all of the noted processes and/or methods. In one or more embodiments, storage medium 1304 also stores information which facilitates performing a portion or all of the noted processes and/or methods. In one or more embodiments, storage medium 1304 stores library 1307 of standard cells including such standard cells as disclosed herein.

EDA system 1300 includes I/O interface 1310. I/O interface 1310 is coupled to external circuitry. In one or more embodiments, I/O interface 1310 includes a keyboard, keypad, mouse, trackball, trackpad, touchscreen, and/or cursor direction keys for communicating information and commands to processor 1302.

EDA system 1300 also includes network interface 1312 coupled to processor 1302. Network interface 1312 allows system 1300 to communicate with network 1314, to which one or more other computer systems are connected. Network interface 1312 includes wireless network interfaces such as BLUETOOTH, WIFI, WIMAX, GPRS, or WCDMA; or wired network interfaces such as ETHERNET, USB, or IEEE-1364. In one or more embodiments, a portion or all of noted processes and/or methods, is implemented in two or more systems 1300.

System 1300 is configured to receive information through I/O interface 1310. The information received through I/O interface 1310 includes one or more of instructions, data, design rules, libraries of standard cells, and/or other parameters for processing by processor 1302. The information is transferred to processor 1302 via bus 1308. EDA system 1300 is configured to receive information related to a UI through I/O interface 1310. The information is stored in computer-readable storage medium 1304 as user interface (UI) 1342.

In some embodiments, a portion or all of the noted processes and/or methods is implemented as a standalone software application for execution by a processor. In some embodiments, a portion or all of the noted processes and/or methods is implemented as a software application that is a part of an additional software application. In some embodiments, a portion or all of the noted processes and/or methods is implemented as a plug-in to a software application. In some embodiments, at least one of the noted processes and/or methods is implemented as a software application that is a portion of an EDA tool. In some embodiments, a portion or all of the noted processes and/or methods is implemented as a software application that is used by EDA system 1300. In some embodiments, a layout diagram which includes standard cells is generated using a tool such as VIRTUOSO® available from CADENCE DESIGN SYSTEMS, Inc., or another suitable layout generating tool.

In some embodiments, the processes are realized as functions of a program stored in a non-transitory computer readable recording medium. Examples of a non-transitory computer readable recording medium include, but are not limited to, external/removable and/or internal/built-in storage or memory unit, e.g., one or more of an optical disk, such as a DVD, a magnetic disk, such as a hard disk, a semiconductor memory, such as a ROM, a RAM, a memory card, and the like.

FIG. 14 is a block diagram of an integrated circuit (IC) manufacturing system 1400, and an IC manufacturing flow associated therewith, in accordance with some embodiments. In some embodiments, based on a layout diagram, at least one of (A) one or more semiconductor masks or (B) at least one component in a layer of a semiconductor integrated circuit is fabricated using manufacturing system 1400.

In FIG. 14, IC manufacturing system 1400 includes entities, such as a design house 1420, a mask house 1430, and an IC manufacturer/fabricator ("fab") 1450, that interact with one another in the design, development, and manufacturing cycles and/or services related to manufacturing an IC device 1460. The entities in system 1400 are connected by a communications network. In some embodiments, the communications network is a single network. In some embodiments, the communications network is a variety of different networks, such as an intranet and the Internet. The communications network includes wired and/or wireless communication channels. Each entity interacts with one or more of the other entities and provides services to and/or receives services from one or more of the other entities. In some embodiments, two or more of design house 1420, mask house 1430, and IC fab 1450 is owned by a single larger company. In some embodiments, two or more of design house 1420, mask house 1430, and IC fab 1450 coexist in a common facility and use common resources.

Design house (or design team) 1420 generates an IC design layout diagram 1422. IC design layout diagram 1422 includes various geometrical patterns designed for an IC device 1460. The geometrical patterns correspond to patterns of metal, oxide, or semiconductor layers that make up the various components of IC device 1460 to be fabricated. The various layers combine to form various IC features. For example, a portion of IC design layout diagram 1422 includes various IC features, such as an active region, gate electrode, source and drain, metal lines or vias of an inter-layer interconnection, and openings for bonding pads, to be formed in a semiconductor substrate (such as a silicon wafer) and various material layers disposed on the semiconductor substrate. Design house 1420 implements a proper design procedure to form IC design layout diagram 1422. The design procedure includes one or more of logic design, physical design or place-and-route operation. IC design layout diagram 1422 is presented in one or more data files having information of the geometrical patterns. For example, IC design layout diagram 1422 can be expressed in a GDSII file format or DFII file format.

Mask house 1430 includes data preparation 1432 and mask fabrication 1444. Mask house 1430 uses IC design layout diagram 1422 to manufacture one or more masks 1445 to be used for fabricating the various layers of IC device 1460 according to IC design layout diagram 1422. Mask house 1430 performs mask data preparation 1432, where IC design layout diagram 1422 is translated into a representative data file ("RDF"). Mask data preparation 1432 provides the RDF to mask fabrication 1444. Mask fabrication 1444 includes a mask writer. A mask writer converts the RDF to an image on a substrate, such as a mask (reticle) 1445 or a semiconductor wafer 1453. The design layout diagram 1422 is manipulated by mask data preparation 1432 to comply with particular characteristics of the mask writer and/or requirements of IC fab 1450. In FIG. 14, mask data preparation 1432 and mask fabrication 1444 are illustrated as separate elements. In some embodiments, mask data preparation 1432 and mask fabrication 1444 can be collectively referred to as mask data preparation.

In some embodiments, mask data preparation 1432 includes optical proximity correction (OPC) which uses lithography enhancement techniques to compensate for image errors, such as those that can arise from diffraction, interference, other process effects and the like. OPC adjusts IC design layout diagram 1422. In some embodiments, mask data preparation 1432 includes further resolution enhancement techniques (RET), such as off-axis illumination, sub-resolution assist features, phase-shifting masks, other suitable techniques, and the like or combinations thereof. In some embodiments, inverse lithography technology (ILT) is also used, which treats OPC as an inverse imaging problem.

In some embodiments, mask data preparation 1432 includes a mask rule checker (MRC) that checks the IC design layout diagram 1422 that has undergone processes in OPC with a set of mask creation rules which contain certain geometric and/or connectivity restrictions to ensure sufficient margins, to account for variability in semiconductor manufacturing processes, and the like. In some embodiments, the MRC modifies the IC design layout diagram 1422 to compensate for limitations during mask fabrication 1444, which may undo part of the modifications performed by OPC in order to meet mask creation rules.

In some embodiments, mask data preparation 1432 includes lithography process checking (LPC) that simulates processing that will be implemented by IC fab 1450 to fabricate IC device 1460. LPC simulates this processing based on IC design layout diagram 1422 to create a simulated manufactured device, such as IC device 1460. The processing parameters in LPC simulation can include parameters associated with various processes of the IC manufacturing cycle, parameters associated with tools used for manufacturing the IC, and/or other aspects of the manufacturing process. LPC takes into account various factors, such as aerial image contrast, depth of focus ("DOF"), mask error enhancement factor ("MEEF"), other suitable factors, and the like or combinations thereof. In some embodiments, after a simulated manufactured device has been created by LPC, if the simulated device is not close enough in shape to satisfy design rules, OPC and/or MRC are be repeated to further refine IC design layout diagram 1422.

It should be understood that the above description of mask data preparation 1432 has been simplified for the purposes of clarity. In some embodiments, data preparation 1432 includes additional features such as a logic operation (LOP) to modify the IC design layout diagram 1422 according to manufacturing rules. Additionally, the processes applied to IC design layout diagram 1422 during data preparation 1432 may be executed in a variety of different orders.

After mask data preparation 1432 and during mask fabrication 1444, a mask 1445 or a group of masks 1445 are fabricated based on the modified IC design layout diagram 1422. In some embodiments, mask fabrication 1444 includes performing one or more lithographic exposures based on IC design layout diagram 1422. In some embodiments, an electron-beam (e-beam) or a mechanism of multiple e-beams is used to form a pattern on a mask (photomask or reticle) 1445 based on the modified IC design layout diagram 1422. Mask 1445 can be formed in various technologies. In some embodiments, mask 1445 is formed using binary technology. In some embodiments, a mask pattern includes opaque regions and transparent regions. A radiation beam, such as an ultraviolet (UV) beam, used to expose the image sensitive material layer (e.g., photoresist) which has been coated on a wafer, is blocked by the opaque region and transmits through the transparent regions. In one example, a binary mask version of mask 1445 includes a transparent substrate (e.g., fused quartz) and an opaque material (e.g., chromium) coated in the opaque regions of the binary mask. In another example, mask 1445 is formed using a phase shift technology. In a phase shift mask (PSM) version of mask 1445, various features in the pattern formed on the phase shift mask are configured to have proper phase difference to enhance the resolution and imaging quality. In various examples, the phase shift mask can be attenuated PSM or alternating PSM. The mask(s) generated by mask fabrication 1444 is used in a variety of processes. For example, such a mask(s) is used in an ion implantation process to form various doped regions in semiconductor wafer 1453, in an etching process to form various etching regions in semiconductor wafer 1453, and/or in other suitable processes.

IC fab 1450 is an IC fabrication business that includes one or more manufacturing facilities for the fabrication of a variety of different IC products. In some embodiments, IC Fab 1450 is a semiconductor foundry. For example, there may be a manufacturing facility for the front end fabrication of a plurality of IC products (front-end-of-line (FEOL) fabrication), while a second manufacturing facility may provide the back end fabrication for the interconnection and packaging of the IC products (back-end-of-line (BEOL) fabrication), and a third manufacturing facility may provide other services for the foundry business.

IC fab 1450 includes fabrication tools 1452 configured to execute various manufacturing operations on semiconductor wafer 1453 such that IC device 1460 is fabricated in accordance with the mask(s), e.g., mask 1445. In various embodiments, fabrication tools 1452 include one or more of a wafer stepper, an ion implanter, a photoresist coater, a process chamber, e.g., a CVD chamber or LPCVD furnace, a CMP system, a plasma etch system, a wafer cleaning system, or other manufacturing equipment capable of performing one or more suitable manufacturing processes as discussed herein.

IC fab 1450 uses mask(s) 1445 fabricated by mask house 1430 to fabricate IC device 1460. Thus, IC fab 1450 at least indirectly uses IC design layout diagram 1422 to fabricate IC device 1460. In some embodiments, semiconductor wafer 1453 is fabricated by IC fab 1450 using mask(s) 1445 to form IC device 1460. In some embodiments, the IC fabrication includes performing one or more lithographic exposures based at least indirectly on IC design layout diagram 1422. Semiconductor wafer 1453 includes a silicon substrate or other proper substrate having material layers formed thereon. Semiconductor wafer 1453 further includes one or more of various doped regions, dielectric features, multilevel interconnects, and the like (formed at subsequent manufacturing steps).

In some embodiments, an integrated circuit (IC) device comprises a bottom semiconductor device, a top semiconductor device over the bottom semiconductor device in a thickness direction of the IC device, and a multilayer structure between the bottom semiconductor device and the top semiconductor device in the thickness direction. The multilayer structure comprises a lower dielectric layer over the bottom semiconductor device, an upper dielectric layer over the lower dielectric layer, and an interlayer metal structure between the lower dielectric layer and the upper dielectric layer. The interlayer metal structure is electrically coupled to at least one of the bottom semiconductor device or the top semiconductor device.

In some embodiments, an integrated circuit (IC) device comprises a bottom semiconductor device, a top semiconductor device over the bottom semiconductor device in a thickness direction of the IC device, and an interlayer metal structure between the bottom semiconductor device and the top semiconductor device in the thickness direction. The interlayer metal structure electrically couples the top semiconductor device to the bottom semiconductor device. A gate of the top semiconductor device and a gate of the bottom semiconductor device are elongated along a first direction. The gate of the top semiconductor device is spaced from the gate of the bottom semiconductor device in at least one of the first direction or a second direction transverse to the first direction. The interlayer metal structure comprises at least one of a first section elongated along the first direction, or a second section elongated along the second direction.

In a method of manufacturing an integrated circuit (IC) device in accordance with some embodiments, a plurality of first semiconductor devices of a first type is formed over a first substrate. For at least one first semiconductor device among the plurality of first semiconductor devices, at least one of a first gate local interconnect (MGLI) in physical and electrical contact with a gate of the first semiconductor device, or a first source/drain local interconnect (MDLI) in physical and electrical contact with a source/drain of the first semiconductor device, is formed. A multilayer structure is formed over the first substrate. The multilayer structure comprises an interlayer metal structure over and in physical and electrical contact with the at least one of the first MGLI or the first MDLI. A second substrate is bonded to the first substrate. A plurality of second semiconductor devices of a second type is formed over the second substrate. For at least one second semiconductor device among the plurality of second semiconductor devices, at least one of a second MGLI in physical and electrical contact with a gate of the second semiconductor device, or a second MDLI in physical and electrical contact with a source/drain of the second semiconductor device, is formed. The at least one of the second MGLI or the second MDLI is over and in physical and electrical contact with the interlayer metal structure.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. An integrated circuit (IC) device, comprising:
   a bottom semiconductor device;
   a top semiconductor device over the bottom semiconductor device in a thickness direction of the IC device; and
   a multilayer structure between the bottom semiconductor device and the top semiconductor device in the thickness direction, the multilayer structure comprising:
   a lower dielectric layer over the bottom semiconductor device;
   an upper dielectric layer over the lower dielectric layer; and
   an interlayer metal structure between the lower dielectric layer and the upper dielectric layer, wherein the interlayer metal structure is electrically coupled to at least one of the bottom semiconductor device or the top semiconductor device.

2. The IC device of claim 1, wherein
   the bottom semiconductor device and the top semiconductor device together configure a complementary field-effect transistor (CFET) device.

3. The IC device of claim 1, wherein
   the multilayer structure further comprises a middle dielectric layer between the lower dielectric layer and the upper dielectric layer, and
   the interlayer metal structure is embedded in the middle dielectric layer.

4. The IC device of claim 3, wherein
   a dielectric material of the middle dielectric layer is different from those of the lower dielectric layer and the upper dielectric layer.

5. The IC device of claim 3, wherein
   each of the lower dielectric layer and the upper dielectric layer comprises one of an oxide and a nitride, and
   the middle dielectric layer comprises the other of the oxide and the nitride.

6. The IC device of claim 1, wherein
   the interlayer metal structure electrically couples the bottom semiconductor device to the top semiconductor device.

7. The IC device of claim 1, further comprising:
   a further bottom semiconductor device not directly under the top semiconductor device, wherein the interlayer metal structure electrically couples the top semiconductor device to the further bottom semiconductor device, or
   a further top semiconductor device not directly over the bottom semiconductor device, wherein the interlayer metal structure electrically couples the bottom semi-conductor device to the further top semiconductor device.

8. The IC device of claim 7, wherein the IC device comprises the further bottom semiconductor device, and the interlayer metal structure electrically couples a source/drain of one of the top semiconductor device and the further bottom semiconductor device to a gate of the other of the top semiconductor device and the further bottom semiconductor device, or the IC device comprises the further top semiconductor device, and the interlayer metal structure electrically couples a source/drain of one of the bottom semiconductor device and the further top semiconductor device to a gate of the other of the bottom semiconductor device and the further top semiconductor device.

9. The IC device of claim 1, wherein the multilayer structure further comprises a further interlayer metal structure between the lower dielectric layer and the upper dielectric layer, gates of the top semiconductor device and the bottom semiconductor device are elongated in a first direction, and either of the interlayer metal structure is electrically coupled to the gate of the top semiconductor device, the further interlayer metal structure is electrically coupled to the gate of the bottom semiconductor device, and the interlayer metal structure and the further interlayer metal structure are on opposite sides, in the first direction, of an active region comprising source/drains of the top semiconductor device and the bottom semiconductor device, or the interlayer metal structure is electrically coupled to a source/drain of the top semiconductor device, the further interlayer metal structure is electrically coupled to a source/drain of the bottom semiconductor device, and the interlayer metal structure and the further interlayer metal structure are on opposite sides, in the first direction, of the active region.

10. The IC device of claim 1, further comprising at least one of:

a bottom gate local interconnect (MGLI) in physical and electrical contact with a gate of the bottom semiconductor device, the bottom MGLI extending in the thickness direction through the lower dielectric layer into physical and electrical contact with the interlayer metal structure, a bottom source/drain local interconnect (MDLI) in physical and electrical contact with a source/drain of the bottom semiconductor device, the bottom MDLI extending in the thickness direction through the lower dielectric layer into physical and electrical contact with the interlayer metal structure, a top MGLI in physical and electrical contact with a gate of the top semiconductor device, the top MGLI extending in the thickness direction through the upper dielectric layer into physical and electrical contact with the interlayer metal structure, or a top MDLI in physical and electrical contact with a source/drain of the top semiconductor device, the top MDLI extending in the thickness direction through the upper dielectric layer into physical and electrical contact with the interlayer metal structure.

11. An integrated circuit (IC) device, comprising:

a bottom semiconductor device;

a top semiconductor device over the bottom semiconductor device in a thickness direction of the IC device; and an interlayer metal structure between the bottom semiconductor device and the top semiconductor device in the thickness direction, the interlayer metal structure electrically coupling the top semiconductor device to the bottom semiconductor device, wherein a gate of the top semiconductor device and a gate of the bottom semiconductor device are elongated along a first direction, the gate of the top semiconductor device is spaced from the gate of the bottom semiconductor device in at least one of the first direction or a second direction transverse to the first direction, and the interlayer metal structure comprises at least one of:

a first section elongated along the first direction, or a second section elongated along the second direction.

12. The IC device of claim 11, wherein the interlayer metal structure comprises the second section which crosses over at least one of the gate of the top semiconductor device or the gate of the bottom semiconductor device.

13. The IC device of claim 12, wherein the second section has opposite first and second ends in the second direction, the first end of the second section is in physical and electrical contact with a bottom gate local interconnect (MGLI) in physical and electrical contact with the gate of the bottom semiconductor device, or a bottom source/drain local interconnect (MDLI) in physical and electrical contact with a source/drain of the bottom semiconductor device, and the second end of the second section is in physical and electrical contact with a top MGLI in physical and electrical contact with the gate of the top semiconductor device, or a top MDLI in physical and electrical contact with a source/drain of the top semiconductor device.

14. The IC device of claim 11, wherein the interlayer metal structure comprises both the first section and the second section, the first section has opposite first and second ends in the first direction, and the second section is contiguous with and projects from the first end of the first section.

15. The IC device of claim 14, wherein one of the second end of the first section and the second section is in physical and electrical contact with a bottom gate local interconnect (MGLI) in physical and electrical contact with the gate of the bottom semiconductor device, or a bottom source/drain local interconnect (MDLI) in physical and electrical contact with a source/drain of the bottom semiconductor device, and the other of the second end of the first section and the second section is in physical and electrical contact with a top MGLI in physical and electrical contact with the gate of the top semiconductor device, or a top MDLI in physical and electrical contact with a source/drain of the top semiconductor device.

16. The IC device of claim 14, wherein the interlayer metal structure further comprises:

a third section contiguous with and projecting in the second direction from the second end of the first section.

17. The IC device of claim 16, wherein the second section is in physical and electrical contact with a bottom gate local interconnect (MGLI) in physical and electrical contact with the gate of the bottom semiconductor device, or a bottom source/drain local interconnect (MDLI) in physical and electrical contact with a source/drain of the bottom semiconductor device, and the third section is in physical and electrical contact with a top MGLI in physical and electrical contact with the gate of the top semiconductor device, or a top MDLI in physical and electrical contact with a source/drain of the top semiconductor device.

18. An integrated circuit (IC) device, comprising:

a first substrate;

a plurality of first semiconductor devices of a first type over the first substrate, at least one first semiconductor device among the plurality of first semiconductor devices comprising at least one of:

a first gate local interconnect (MGLI) in physical and electrical contact with a gate of the at least one first semiconductor device, or a first source/drain local interconnect (MDLI) in physical and electrical contact with a source/drain of the at least one first semiconductor device;

a multilayer structure over the first substrate, the multilayer structure comprising an interlayer metal structure over and in physical and electrical contact with the at least one of the first MGLI or the first MDLI;

a second substrate bonded to the first substrate; and a plurality of second semiconductor devices of a second type over the second substrate, at least one second semiconductor device among the plurality of second semiconductor devices comprising at least one of:

a second MGLI in physical and electrical contact with a gate of the at least one second semiconductor device, or a second MDLI in physical and electrical contact with a source/drain of the at least one second semiconductor device, wherein the at least one of the second MGLI or the second MDLI is over and in physical and electrical contact with the interlayer metal structure.

19. The IC device of claim 18, wherein each of the plurality of second semiconductor devices is over a corresponding first semiconductor device of the plurality of first semiconductor devices, and configures together with the corresponding first semiconductor device a complementary field-effect transistor (CFET) device.

20. The IC device of claim 18, wherein the interlayer metal structure comprises:

a first section elongated along a first direction, and a second section elongated along a second direction transverse to the first direction, the second section contiguous to the first section.

\* \* \* \* \*